United States Patent
Carver

(10) Patent No.: US 6,566,960 B1
(45) Date of Patent: May 20, 2003

(54) HIGH BACK-EMF HIGH PRESSURE SUBWOOFER HAVING SMALL VOLUME CABINET LOW FREQUENCY CUTOFF AND PRESSURE RESISTANT SURROUND

(76) Inventor: Robert W. Carver, 330 Ave. A, Snohomish, WA (US) 98290

(*) Notice: Subject to any disclaimer, the term of this patent is extended or adjusted under 35 U.S.C. 154(b) by 0 days.

(21) Appl. No.: 09/310,618

(22) Filed: May 12, 1999

Related U.S. Application Data

(62) Division of application No. 08/909,892, filed on Aug. 12, 1997, now Pat. No. 5,937,074.
(60) Provisional application No. 60/023,784, filed on Aug. 12, 1996.

(51) Int. Cl.[7] .............................. H03F 3/04; H03R 21/00
(52) U.S. Cl. ....................................... 330/297; 381/120
(58) Field of Search ................................ 381/111, 116, 381/117, 120, 124, 59; 330/279, 296, 297, 96, 125, 127, 134, 135, 199

(56) References Cited

U.S. PATENT DOCUMENTS

| | | | | |
|---|---|---|---|---|
| 4,218,660 A | * | 8/1980 | Carver | 330/297 |
| 4,713,629 A | * | 12/1987 | Segal | 330/297 |
| 5,164,991 A | * | 11/1992 | Johnson et al. | 381/120 |
| 5,194,821 A | * | 3/1993 | Brambilla et al. | 381/120 |
| 5,396,194 A | * | 3/1995 | Williamson et al. | 330/297 |
| 5,748,753 A | * | 5/1998 | Carver | 381/96 |
| 6,104,248 A | * | 8/2000 | Carver | 330/297 |
| 6,166,605 A | * | 12/2000 | Carver | 330/297 |
| 6,373,340 B1 | * | 4/2002 | Shashoua | 330/297 |
| 6,434,243 B1 | * | 8/2002 | Read | 381/120 |
| 6,437,648 B1 | * | 8/2002 | Van Beylen | 330/297 |

* cited by examiner

Primary Examiner—Xu Mei
(74) Attorney, Agent, or Firm—Robert B. Hughes; Hughes Law Firm, PLLC

(57) ABSTRACT

A subwoofer cabinet having a volume less than 1 ft$^3$; axially aligned openings in opposed cabinet walls; first and second cages mounted on respective ones of the walls in alignment with the openings; a voice coil driven driver including an annular 225 oz. magnet affixed to the first cage; a stationary pole piece extending through the magnet and defining a magnetic gap therebetween; a voice coil mounted on a cylindrical voice coil former positioned within the gap; a cone affixed to one end of the former; a first flexible surround secured to the outer end of the cone and attached at its periphery to the first cage; a flexible spider secured to the former and at its outer periphery to the first cage; a drive amplifier capable of delivering 2,700 watts to a nominal 4 ohm resistive load and swinging 104 volts for delivering (+)$\Delta v$ and (−)$\Delta v$ drive signals to the voice coil for driving the voice coil driven driver through a peak-to-peak stroke of about 2.5" while generating a large back emf sufficient to counter the applied emf and minimize current flow in the voice coil.

2 Claims, 25 Drawing Sheets

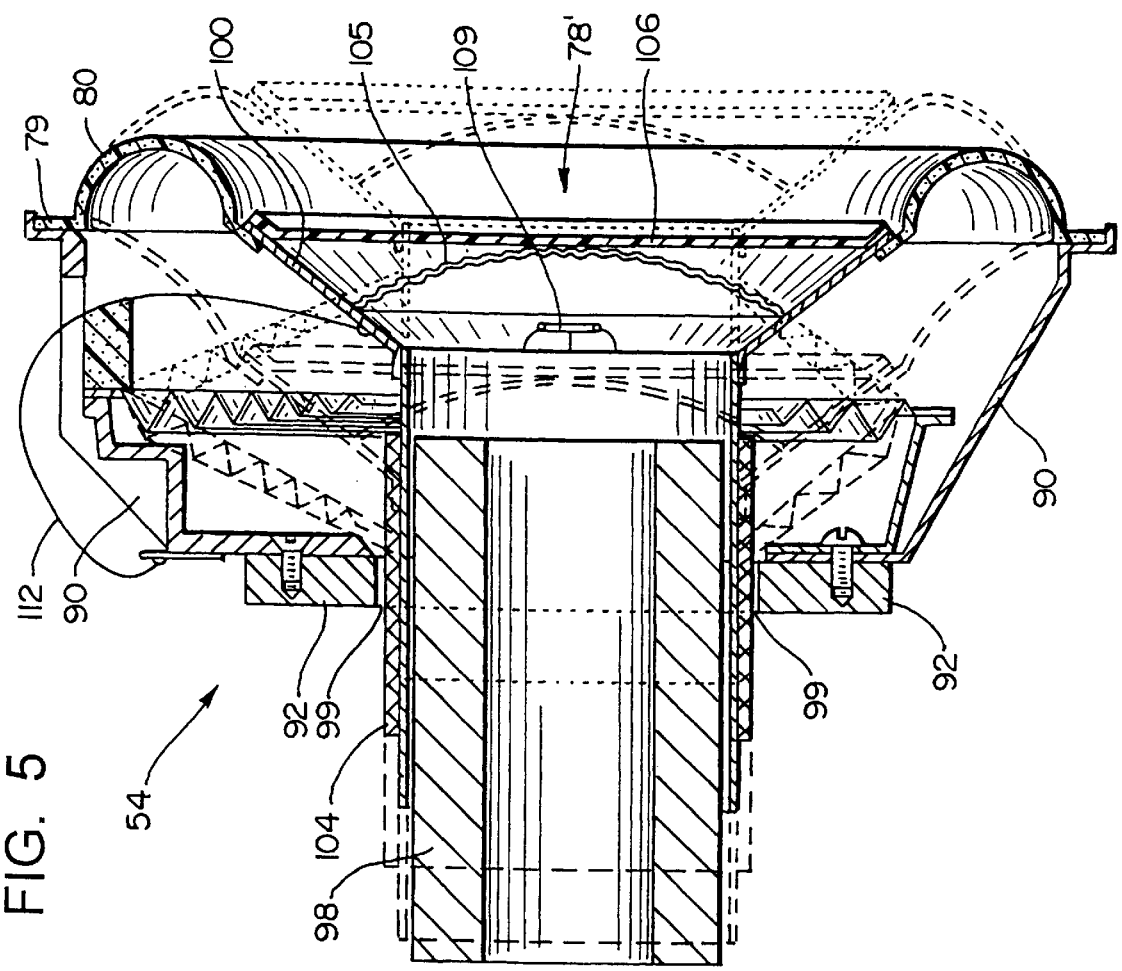
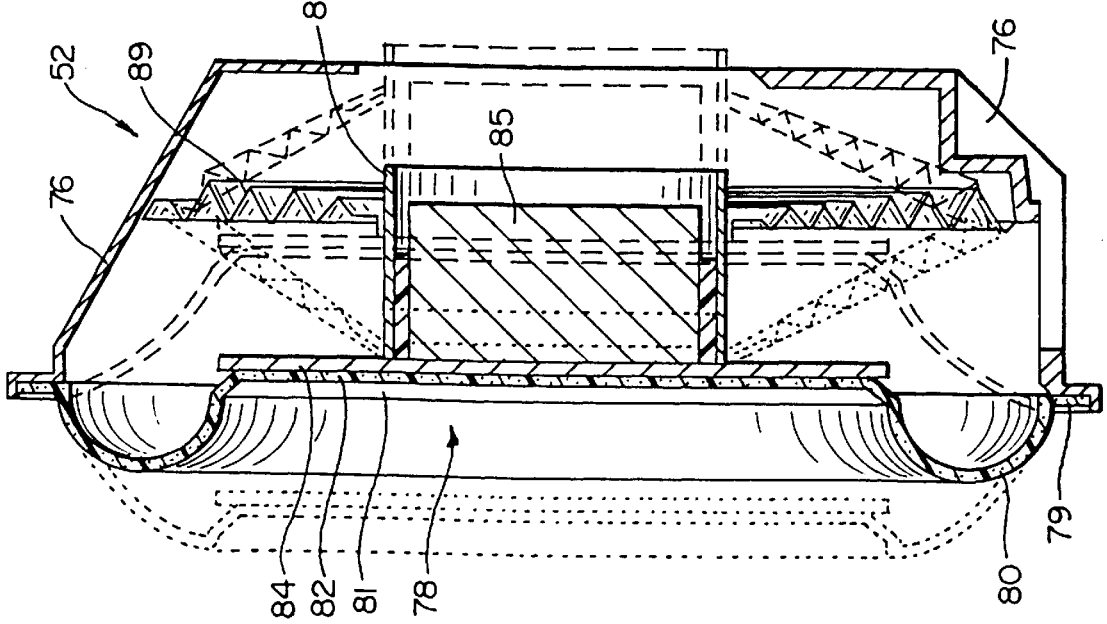
FIG. 5

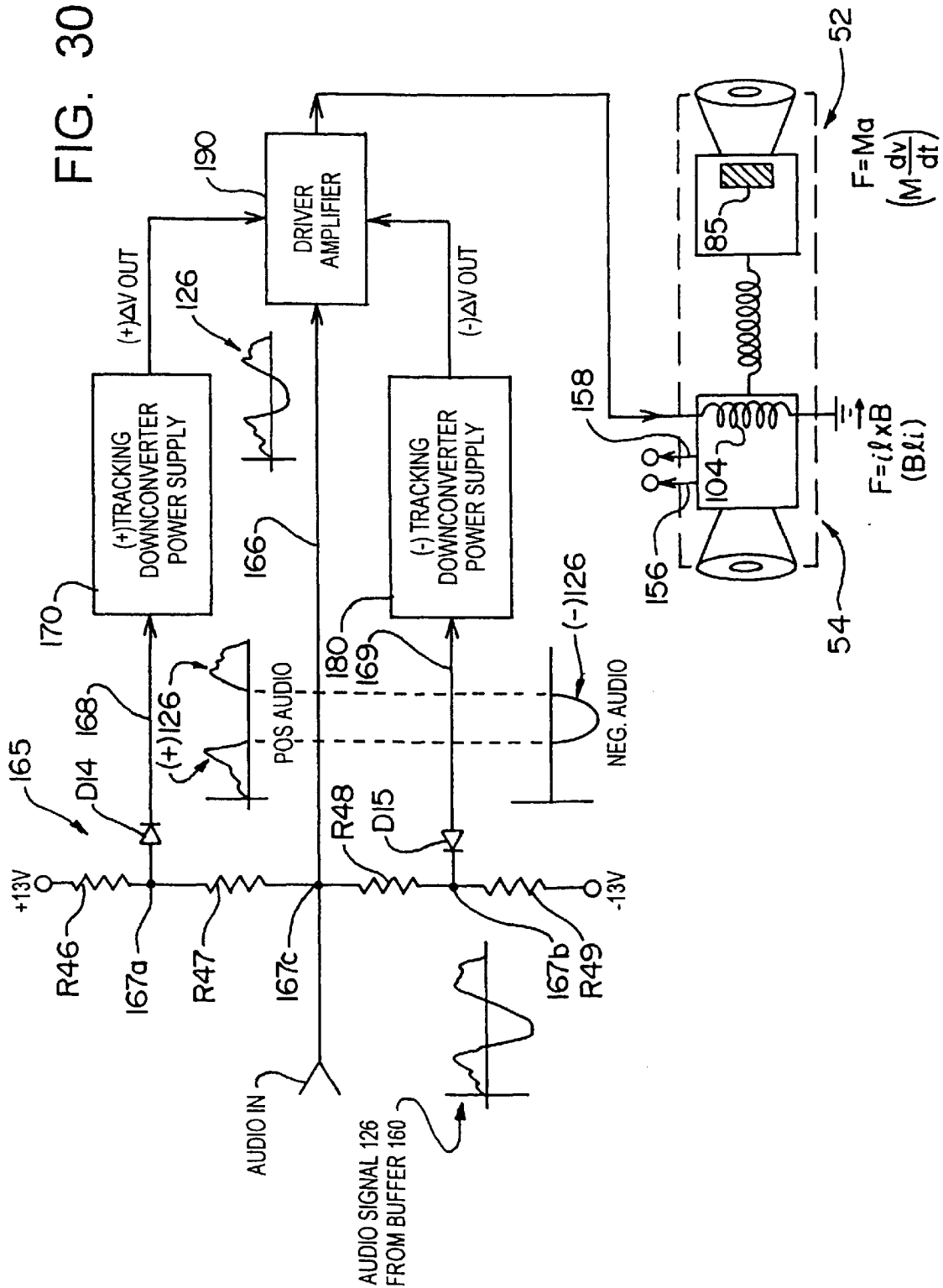

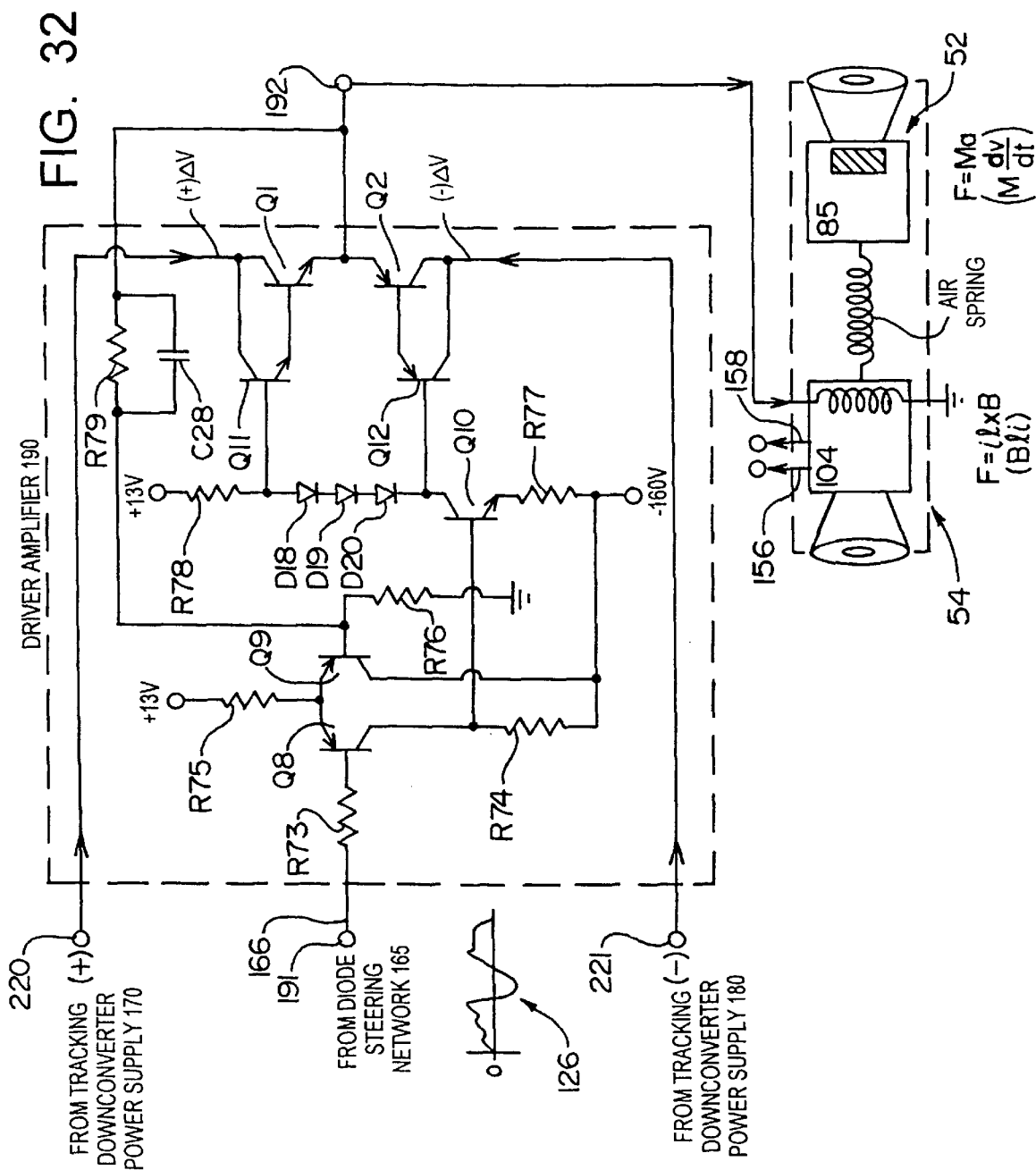

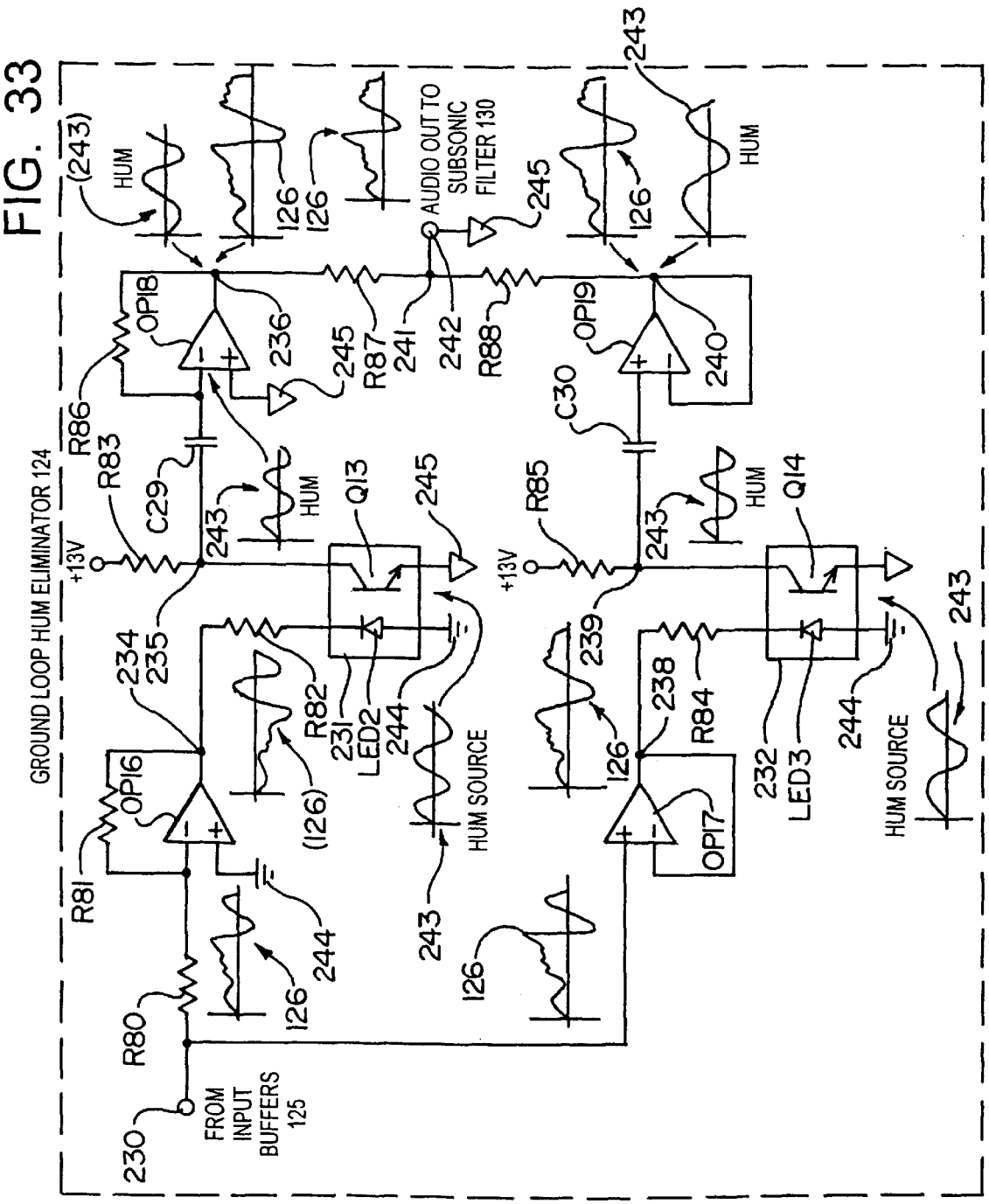

HIGH BACK-EMF HIGH PRESSURE SUBWOOFER HAVING SMALL VOLUME CABINET LOW FREQUENCY CUTOFF AND PRESSURE RESISTANT SURROUND

RELATED APPLICATIONS

The present application is a division of Ser. No. 08/909,892 filed Aug. 12, 1997, now U.S. Pat. No. 5,937,074, which is related to, based on, and claims priority from, Applicant's Provisional Application No. 60/023,784, filed Aug. 12, 1996, entitled "HIGH BACK EMF, HIGH PRESSURE SUBWOOFER HAVING SMALL VOLUME CABINET, LOW FREQUENCY CUTOFF AND PRESSURE RESISTANT SURROUND".

The present application is also related to, and describes and claims improvements on, the invention disclosed and claimed in Applicant's U.S. patent application, Ser. No. 08/582,149, filed Dec. 30, 1995, entitled "HIGH POWER AUDIO SUBWOOFER", now U.S. Pat. No. 5,748,753, issued May 5, 1998.

BACKGROUND OF THE INVENTION

1. Field of the Invention

The present invention relates generally to the field of high fidelity audio reproduction; and, more particularly, concerns subwoofer loudspeaker systems that produce high quality, low distortion and low-frequency sound.

2. Prior Art

In the field of high fidelity sound reproduction, a high quality audio system is normally comprised of: a) a signal source, which is generally music or soundtracks from: i) films; ii) compact disk players; iii) laser disk players, and the like; b) a "preamplifier" which receives signals from the signal source and provides an audio signal to a power amplifier which amplifies the signal; and c), loudspeakers that can reproduce the sound from the signal source. Generally, loudspeakers are single enclosures designed to produce most of the audible frequency range, which is from 20 Hertz ("Hz") to 20,000 Hz.

Modern recording technologies have allowed music and film producers to make recordings having wider dynamic ranges—i.e., higher signal-to-noise ratios—and more extended frequency response. Furthermore, many music and film recordings contain more low frequency information that those of only a few years ago. This is especially true in film soundtracks, where recordings of special effects such as explosions are commonplace.

In response to the increased low frequency sound in recordings, a growing number of audio systems are adding an additional type of loudspeaker to their existing array of loudspeakers. This type of loudspeaker is known as a "subwoofer". Subwoofers are specialized loudspeakers which reproduce only the lowest frequencies of the audible frequency range—viz., those frequencies ranging from approximately 20 Hz to about 80 to 120 Hz. These low frequencies are difficult for many full range loudspeakers to reproduce because the bass drivers for full range loudspeakers must handle a wider frequency range—i.e., their frequency response must extend much higher in the audible frequency range, often to about 2,500 Hz or even higher depending upon the design of the loudspeaker. Adding a subwoofer to an audio system relieves the full range loudspeaker from reproducing the lowest frequencies, thereby improving its performance. In addition, certain standards are being set for the reproduction of film soundtracks at home which require the use of one or more subwoofers. Such standards include THX® (a registered trademark of Lucas Film, Ltd.) certification from Lucas Film and Dolby AC-3 Surround Sound® (a registered trademark of J. C. Penney Company, Inc.) from Dolby Laboratories. Dolby AC-3 Surround Sound® even has an audio channel dedicated to only low frequency information.

Conventional design of a subwoofer involves the placement of one or more large bass drivers into a large cabinet—e.g., typically a cabinet enclosing a volume of space ranging from about 8 cubic feet to about 27 cubic feet. Bass drivers, known as "woofers", generally include a circular "diaphragm" or "cone" which can be constructed of many different materials including paper, plastic, kevlar, etc. Woofer cones have a certain diameter—viz., the bore of the cone is equal to pi×radius$^2$ ($\pi r^2$). Prior art subwoofer cones capable of high acoustic output generally have a diameter of at least ten inches, and often greater.

The circumference of the cone is affixed to a "surround" or "suspension", which is then affixed to the driver's frame. The suspension enables the cone to move in and out of the driver frame at a particular frequency and returns it to a null position when no sound is produced. The peak-to-peak distance traveled by the cone is known as the "stroke" of the driver—sometimes referred to as the "excursion" of the driver. Generally, the drivers installed in prior art subwoofers have a neak-to-peak stroke or excursion of between 0.4" and 0.6". Prior art suspensions are constructed of flexible, compliant materials such as relatively thin rubber, impregnated cloth, expanded synthetic cellular foam such, for example, as expanded cellular polyethylene ("PE") surround foam, or similar materials which are compressed to a thickness of about 0.02" and which are not self-supporting, which have historically produced very little resistance to peak-to-peak cone movement, and which are capable of standing off box pressures of only on the order of nominally about 0.1 lbs/in$^2$ and, at best, only about 0.15 lbs/in$^2$.

Movement of the cone about the suspension causes air to be moved, which is what produces the sound heard and, in the case of bass, felt by the listener. The amount of air that can be moved by a driver is directly related to the bore and stroke of the subwoofer cone. Thus, to increase the amount of air that a subwoofer can move, the bore, the stroke, and/or both the bore and stroke, can be increased. However, and as will be discussed below, simply increasing the bore and/or the stroke has disadvantages.

At the center of the cone, the driver is affixed to the "motor" of the cone which is comprised generally of a single electrical conductor placed within a magnetic field. In the prior art, the electrical conductor is a single electrical wire wrapped around a cylinder. This arrangement is know as the voice coil of the driver. The voice coil is wrapped around a voice coil former which is, in turn, affixed to the cone of the driver and placed in proximity to a magnet. When current is run through the voice coil, magnetic fields are created around the voice coil. These voice coil magnetic fields interact with the magnetic fields of the magnet, which causes the voice coil former to move. The voice coil former's movement causes the movement of the cone. Cone movement, as discussed above, causes movement of air which produces sound. Producing sound at higher volumes requires greater cone movements. Greater cone movements are produced when the voice coil and the driver's magnet have greater magnetic field interactions; and, this increased magnetic field interaction is produced when the voice coil has more current running through it.

To reproduce low frequencies at high volume levels, a subwoofer must be capable of moving large quantities of air.

Typical prior art subwoofers for use in the home can move approximately one-hundred thirty cubic inches of air. For louder audio volumes, it is desirable that the subwoofer be capable of moving even more air—for example, one-hundred eighty cubic inches of air. A typical fifteen inch diameter woofer, which has a cone diameter of approximately thirteen inches and a stroke of approximately 0.6 inches, can move approximately eighty cubic inches of air. Therefore, generally a prior art subwoofer will utilize two of these drivers; and two drivers are able to move approximately one-hundred sixty cubic inches of air. One disadvantage of having a driver with a thirteen inch cone is that it is difficult to design a cone of that size which is rigid enough to resist distortion when the cone has such a large surface area.

Another example of a prior art subwoofer utilizes four twelve inch drivers. Each of these drivers has a cone diameter of approximately ten inches and a stroke of approximately 0.6 inches. Such a subwoofer can move approximately one-hundred ninety cubic inches of air. However, such a subwoofer suffers from the disadvantage that four drivers are required; and, this greatly increases the size of the cabinet required, cost and weight.

Of course, it is possible to increase the stroke of the driver, and thus increase the amount of air that is moved by the driver. However, when the stroke of the driver is increased, the efficiency of the driver is substantially reduced, as less of the voice coil will remain in the magnetic gap.

Prior art subwoofer systems invariably require a large cabinet. One reason, as seen from the above, is that many prior art subwoofer systems utilize several large drivers so that they can move enough air for adequate performance. However, large cabinets are necessary for prior art subwoofers for reasons having nothing to do with the number of drivers installed therein. Some of the more significant reasons for this are set forth hereinbelow.

Drivers for subwoofers are generally installed in a sealed or vented box. Thus, when the cone of the driver moves, it must overcome the forces inherently created because of the box structure itself. For instance, during operation, if the cone is moving into the cabinet, the air inside the cabinet will be compressed by the moving cone, thereby creating a force resisting inward cone movement. If, on the other hand, the cone is moving out of the cabinet, a vacuum is created that, in effect, exerts a force tending to pull the cone back into the cabinet. These conditions exist for both sealed and vented boxes or cabinets. Atmospheric pressures outside the cabinet also affect these forces.

The driver must overcome the foregoing forces during movement of the cone. The higher the pressure to be overcome (whether positive or negative), the more power that is required to overcome that pressure. The physical structure of the subwoofer can be manipulated to deal with the increase in power that is required to overcome the foregoing forces. First, a larger enclosure (i.e., cabinet) can be used. A larger enclosure will create less resistance to inward and outward cone movements because it contains more air than a smaller enclosure. The reason for this is that when the driver cone moves into the cabinet, the larger air volume is compressed to a lower pressure. Thus, less power is required by the voice coil to overcome the forces created by the compression of air within the cabinet. Further, when the driver cone moves out of the cabinet, less vacuum is created, which therefore allows the voice coil to move the cone with less power. Because of this, prior art subwoofers have typically utilized relatively large cabinets.

A second design factor is related to the stroke of the driver. If the stroke of the driver is short, the driver cone will have physical limitations on how far it can enter into the cabinet and how far it can extend outwardly from the cabinet. The shorter the extension of the driver cone into the cabinet, the less air that will be compressed within the cabinet Such a movement will, therefore, require less power into the voice coil to effectuate movement of the cone. The same holds true for cone extension out of the cabinet. The shorter the extension of the driver cone out of the cabinet, the less will be the vacuum that is created and, therefore, the less power that will be required for such cone movement.

Power in prior art subwoofer systems must be provided by power amplifiers. Often a subwoofer system will use a separate power amplifier. However, for ease of packaging, many prior art subwoofer systems utilize power amplifiers that are built into the cabinet of the subwoofer. In general, power amplifiers capable of driving conventional prior art subwoofers must be large and capable of creating between one-hundred (100) to three-hundred (300) watts of power. Large amounts of power are required to drive a subwoofer for many of the reasons described above. However, power amplifiers capable of providing such power levels tend to create large amounts of heat which, in turn, requires large heat sinks, massive power reserve capacitors, and large transformers, all of which are large in size, heavy, and expensive. All of these factors are undesirable; and, all tend to reinforce the need for a relatively large cabinet.

Thus, as can be seen from the foregoing, because of the large power demands required by subwoofer systems and the large cost involved in providing large amounts of power amplification, prior art subwoofer apparatus have invariably required, and utilized, large cabinets which held drivers having large diameters and short strokes. Such an arrangement, as discussed above, allowed the subwoofer to move reasonable amounts of air without distortion. However, normal listening environments often do not have space for such a large cabinet. Therefore, there is a need for a subwoofer system capable of producing low frequency information at high listening volumes that is packaged in a small volume cabinet.

The design of audio woofers has, for many years, been predicated on conventional wisdom commonly referred to as "Hoffman's Iron Law" which provides:

$$\text{Eff.}=V_{BOX}/f_0^3=kV_{BOX}/f_0^3 \qquad [1]$$

where $f_0$ is the desired low frequency cutoff or limit for the subwoofer; $V_{BOX}$ is the volume of the cabinet; and, Eff. is the efficiency of the subwoofer. Unfortunately, if one wishes to reduce the low frequency cutoff ($f_0$) from, for example, 50 Hz to 18 Hz while retaining the same efficiency, the volume of the woofer cabinet must be significantly increased. Or, if one wishes to decrease box volume from, for example, 1 ft$^3$ to 0.4 ft$^3$ and, at the same time, decrease the low frequency cutoff ($f_0$) from, for example, 50 Hz to 18 Hz, efficiency drops by a factor of approximately 53. Consequently, the woofer designer finds that where a 50 watt or 100 watt amplifier might have operated a 1 ft$^3$ woofer at a 50 Hz low frequency cutoff, a 0.4 ft$^3$ box at 18 Hz low frequency cutoff will require an amplifier that is approximately 53 times larger than conventional.

For example, a typical loudspeaker in a 1 ft$^3$ box with a low frequency cutoff of 50 Hz and one percent (1%) efficiency will normally operate satisfactorily if it employs a 200 watt amplifier. But, were the designer to arbitrarily decide to reduce the box volume to 0.4 ft³ and the low frequency cutoff to 18 Hz, the wattage requirement for the amplifier would be 10,600 watts. That, of course, would be ludicrous and is neither practical, cost effective nor economically feasible from a commercial standpoint.

In essence, Hoffman's Iron Law forbids one from making a subwoofer having a small volume box, high efficiency and low frequency cutoff; and, designers of subwoofers have not deviated from religious adherence to such theories. If the speaker designer wants to have a highly efficient bass driver for a highly efficient woofer that can have a very low frequency cutoff, the box must be huge—and, they always are. Conversely, if the designer wishes the box to be small, there has heretofore been no way to get a lot of bass out of it, either low or loud, with high efficiency.

At the same time, speaker designers have been taught, and have believed, that there is an optimum size for magnets employed in voice coil driven woofers—i.e., it has been assumed that if the magnet is too small, the speaker will not work at all; but, if the magnet is too large, only a small percentage of the output wattage from the power amplifier will be applied to the voice coil. Consequently, woofer designers have concluded that an optimum magnet must lie somewhere between "too small" and "too large" in order to produce effective power in the voice coil. Typically, therefore, virtually all conventional subwoofers will employ a magnet that weighs on the order of only about 20 ounces or less. Indeed, even in the face of today's highly advanced technologies, speaker designers still believe that a well designed, commercially marketable subwoofer should employ: i) a relatively large cabinet—e.g., from about eight to about twenty-seven ft³; ii) multiple large drivers; iii) drivers with peak-to-peak strokes generally on the order of not more than 0.4" to 0.6"; iv) magnets weighing, on average, not more than 20 ounces and, at the very most, about 40 ounces; v) low internal box pressures of on the order of only about 0.1 lbs/in²; and, vi), surrounds or suspension systems that are very compliant leading to surrounds that are, at best, flimsy and incapable of stably supporting the moving driver components without wobble and consequent degradation of the audio sounds generated.

The problem of attempting to design a woofer which is small in size—e.g., defining an enclosed volume of space of about 0.4 ft³ to about 0.5 ft³ having a low cutoff frequency below about 40 Hz, and which is, at the same time, efficient, has defied solution—at least until the advent of the present invention and the invention disclosed in Applicant's aforesaid co-pending U.S. patent application, Ser. No. 08/582,149, filed Dec. 30, 1995, now U.S. Pat. No. 5,748,753, issued May 5, 1998. For example, as stated by Louis D. Fielder of Dolby Laboratories, Inc. and Eric M. Benjamin in an article entitled "Subwoofer Performance for Accurate Reproduction of Music", J. Audio Eng. Soc., Vol. 36, No. 6, June 1988, pages 443 through 454 at page 446:

> "For the required value of 0.0316 acoustic W at 20 Hz, this results in a volume excursion of 41.8 in³ (685 cm³). For a single 12-in (0.3-m) woofer [effective piston diameter 10 in (0.25 m)] this would require a peak linear excursion of 0.53 in (13.5 mm). This large excursion requirement can be reduced by using larger drivers, increasing the number of drivers, and utilizing the low-frequency boost provided by the room. With four 15-in (0.38-m) woofers the peak linear excursion required is 0.078 in (2 mm), neglecting room effects."

In short, the "solution" advocated by the authors, who are accredited experts that were then attempting to establish design criteria for the performance of subwoofers to be used for the reproduction of music in the home, is: i) to design a woofer having a peak linear excursion of 0.53"; ii) to attempt to reduce this "large excursion"—i.e., 0.53"—by using larger drivers and increasing the number of drivers (and, therefore, the size of the box or subwoofer cabinet); and iii), utilizing the low frequency boost provided by the listening room.

Those skilled in the art relating to subwoofers will recognize that the efficiency of a subwoofer is proportional to the size of the box or cabinet that the subwoofer is mounted in. Therefore, a box or cabinet that is 1/10th the size of a conventional prior art subwoofer box or cabinet would ordinarily be ten times less efficient than its prior art counterpart. Under those circumstances, ten times more heat is developed in the voice coil regardless of the efficiency of the driving amplifier. Consequently, the voice coil will soon overheat; and, in fact, that has been a major stumbling block to the development of very small, but powerful, subwobfers. Nevertheless, as will become apparent from the ensuing description, the present invention relates specifically to a subwoofer characterized by its high efficiency and, at the same time, its extremely small box or cabinet.

The broad concept of the present invention, in fact, flies in the face of all known subwoofer computer modeling programs as well as the teachings in the prior art literature.

In this connection, those skilled in the art will appreciate that raw driver efficiency is expressed as:

$$\text{Eff.} = (Bl)^2 / r_e \quad [2]$$

where "B" is the magnetic field strength, and "l" and "$r_e$" are constants.

Rewriting equation [2] it is found:

$$\text{Eff.} = kB^2 \quad [3]$$

Based upon the foregoing, those skilled in the art will understand that in a subwoofer driver where B is increased by a factor of 3.3, the efficiency will be increased by a factor of 10—viz., $3.3^2 \cong 10$. Unfortunately, however, when such a subwoofer driver is built and installed in a box—any box—bass output is found to be actually far less than before the magnetic field was increased! This fact is well known to those skilled in the subwoofer art; and, consequently, prior art conventional subwoofers have evolved with magnetic fields optimized for maximum bass output.

Unfortunately, subwoofers designed with magnets optimized for maximum bass output are very inefficient. The reason for this is because the motor of the subwoofer (consisting of the voice coil and magnetic structure) is operating very close to stall, a condition characterized by relatively high armature winding—or, in the case of subwoofers, voice coil—heating. By increasing the magnetic field strength, the efficiency is increased, but the bass output is decreased because of the large back emf generated by the motion of the subwoofer's voice coil immersed in its magnetic field. The magnitude of the back emf is established by Lenze's Law:

$$\text{back emf} = d\phi/dt, \quad [4]$$

where $\phi$ is the magnetic flux.

The back emf generated acts to prevent current from flowing in the voice coil because it opposes the forward voltage impressed on the voice coil winding. With the lowered current in the voice coil, the result is less bass.

It must be recognized at this point that all prior art literature known to the inventor, the descriptive equations therein, and all subwoofer computer modeling programs based on prior art literature make the basic assumption that the subwoofer is operating in stall in order to simplify the modeling. Prior to the advent of the present invention, this assumption was tenable because a tracking downconvertor drive amplifier able to deliver the high voltage necessary to overcome the back emf did not exist. Indeed, prior art subwoofer designers have all made the simplifying assumption that the back emf at system impedance minimums is not significant.

Another major problem encountered by subwoofer designers is directly related to the fact that subwoofers are exceptionally prone to hum problems induced by power line "ground loops". Ground loops are caused by a redundant ground that runs from the wall plug or other suitable A.C. source where the subwoofer is plugged in, through the power line to where the audio signal source—e.g., a CD player, an F.M. tuner, a turntable, etc.—is plugged into the power line, and then back to the subwoofer audio input through the audio cable shields. This constitutes a loop called a "ground loop"; and, it generates a very undesirable 60 Hz hum.

Prior art subwoofers all suffer from unwanted "ground loop" induced 60 Hz hum to a greater or lesser degree. Subwoofer designers have attempted to solve the "ground loop" induced 60 Hz hum problem in various ways. One proposed solution includes the use of a balanced transformer which breaks the loop by virtue of its primary and secondary windings. The transformer can either be at the power line input (power transformer), or at the audio input (input transformer), or, for that matter, at both locations. Another attempted solution involves the use of optical couplings in which the audio signal is coupled by a light beam—i.e., there is no ground connection. Both of the foregoing approaches have been effective in substantially reducing, but not eliminating, "ground loop" induced 60 Hz hum problems. This is because while they effectively "break" the ground(s), they do not suppress the hum voltage generated across the broken ground or grounds.

SUMMARY OF THE INVENTION

The present invention overcomes the foregoing problems and disadvantages inherent in the design, construction and operation of conventional prior art subwoofers by providing a subwoofer design that is characterized by: i) a relatively small volume sealed cabinet—e.g., a cabinet defining an enclosed volume of space on the order of from about only 0.4 ft$^3$ to about only 0.5 ft$^3$; or, substantially less than 1 cubic foot in volume in the exemplary apparatus illustrated (stated differently, the present invention requires a subwoofer cabinet which ranges from only about 1/15th to about 1/67th the size of the cabinets employed in conventional prior art subwoofers)—ii) a single voice coil driven woofer; iii) a mass driven woofer, sometimes referred to in the art as a "passive radiator"; iv) a relatively small, compact, power amplifier capable of delivering 2,700 watts rms to 3.3 ohm (the resistance of the voice coil) resistive load (hereinafter, a "nominal 4 ohm resistive load") and swinging 104 volts rms; and v), an arrangement wherein the peak-to-peak excursion of each of the voice coil driven woofer and the mass driven woofer is on the order of 2.5 inches maximum as contrasted with prior art drivers having peak-to-peak strokes ranging from only about 0.4" to about 0.6"—i.e., an arrangement wherein the stroke of the drivers of the present invention is from about five to about six times greater than achievable with conventional prior art subwoofer driver configurations.

As a result of the foregoing, a subwoofer embodying features of the present invention is characterized by its extremely small size, high efficiency, high power and high acoustically accurate sound levels, all without requiring large, heavy and costly heat sinks and/or storage capacitors.

It is a general aim of the present invention to provide a small, compact, fully contained subwoofer capable of generating high quality, low distortion, and low frequency audio signals at high listening volumes, yet which is packaged in an aesthetically pleasing small volume cabinet.

More specifically, it is an object of the invention to provide a subwoofer capable of generating acoustically accurate low frequency audio signals at high listening volumes packaged in a relatively small volume cabinet.

A related object of the invention is the provision of a subwoofer having a relatively small volume cabinet, yet which has power and sound characteristics at least equal to, if not substantially better than, conventional prior art subwoofers despite the fact that the subwoofer is only a fraction of the size, weight and cost of similarly performing, commercially available, subwoofers. In achieving this objective, the subwoofer of the present invention, including its electronic packages or circuit boards, is generally fully contained in a cabinet occupying a total volume of space significantly less than 1 cubic foot—e.g., from only about 0.4 ft$^3$ to only about 0.5 ft$^3$—rendering the subwoofer unobtrusive to the user and facilitating easy placement of one or more subwoofers in a listening room or in other living areas within a user's residence, office or like facility.

In one of its more detailed aspects, it is an object of the invention to provide a relatively low cost subwoofer apparatus capable of equaling or exceeding the performance characteristics of conventional large and more expensive subwoofers; and, which is compact, light weight, aesthetically attractive in appearance, and devoid of large heat sinks, massive power reserve capacitors, large transformers, and the like.

A further objective of the present invention is to provide a subwoofer apparatus which, despite its small size employing a cabinet having a sealed volume of space substantially less than 1 cubic foot, is highly efficient and capable of moving or displacing large volumes of air—e.g., a volume of just under 200 cubic inches of air—in response to driver movement through a peak-to-peak stroke of up to 2.5".

In another of its important aspects, it is an object of the invention to take advantage of the high back emf generated by using a relatively large magnet—e.g., a magnet weighing on the order of 225 ounces (approximately 14 pounds, 1 ounce) or, approximately an order of magnitude greater than the magnets commonly used in conventional subwoofers—to oppose current flow in the voice coil of a voice coil driven woofer so as to enable employment of a small compact tracking downconvertor drive amplifier capable of outputting on the order of about 2,700 watts rms to a nominal 4 ohm resistive load and capable of swinging 104 volts rms; and, which will, therefore, deliver only about 150 to 200 watts (300 to 400 watts on a time limited basis) maximum power to the voice coil, preventing overheating thereof and enabling generation of large quantities of power with high efficiency. The use of such a large magnet roughly ten times the size of conventional prior art subwoofer magnets serves to increase the field strength of the subwoofer by a factor of 3.3 since field strength increases roughly as the square root of the magnet size.

Stated differently, in one of its important aspects it is an object of the invention to provide a subwoofer design employing a very small cabinet and a unique tracking downconvertor drive amplifier which is capable of generating sufficient power applied to the subwoofer's voice coil to overcome the excess high back emf generated by the use of a large magnet in combination with a 2.5" peak-to-peak stroke of the voice coil. As a result of attaining this objective, sufficient current flows in the voice coil to produce the desired bass output; and, the subwoofer's efficiency is increased by a factor of approximately 10, effectively offsetting the loss of a box volume related efficiency.

A further objective of the invention is to provide a subwoofer capable of operating far from the stall mode—viz., an operating mode characterized by very little output power and large amounts of current flowing in the voice coil generating large amounts of heat that must be dissipated—wherein the subwoofer is characterized by high conversion efficiency and low joule (voice coil) heating.

Yet another important objective of the invention is the provision of a subwoofer capable of achieving an 18 Hz low frequency cutoff in a small box 11"×11"×11" having an enclosed volume of space of from about only 0.4 ft$^3$ to only about 0.5 ft$^3$ with high efficiency and at low cost. In achieving this objective, advantage is taken of the usage of a mass driven woofer (sometimes referred to as a "passive radiator") in combination with a voice coil driven woofer made in accordance with the present invention, thus reducing size, weight and cost of the overall subwoofer.

In another of its important aspects, it is an object of the invention to provide methods for forming a surround for a subwoofer which is capable of standing off pressures ranging from on the order of about one and a half pounds per square inch (1.5 lbs/in$^2$) to about 3 pounds per square inch (3 lbs/in$^2$), and the resulting surround—all as contrasted with conventional surrounds which are typically capable of standing off pressures of only about 0.1 lbs/in$^2$ to 0.2 lbs/in$^2$; or, an improvement of up to thirty times the capability of conventional surrounds.

A further and more detailed objective of the invention is the provision of improved buffer circuitry for processing audio signals which sums both the L+R and L−R audio signal components, retaining the L−R components (which are typically destroyed in a conventional subwoofer's audio signal processing system) as part of the composite output signal, thereby enhancing the life, luster, depth and impact of the audio sound for the listener.

Another detailed object of the invention is the provision of improved protection circuitry for essentially eliminating distortion resulting from clipping, overheating, overdrive, or impulsive wave forms.

Yet another important objective of the present invention is the provision of circuitry which completely eliminates both undesirable "ground loops" and the voltage generated across broken grounds, thereby completely eliminating the problem of "ground loop" induced 60 Hz hum.

It is a further object of the invention to provide a system for maintaining tinsel leads under tension during peak-to-peak reciprocation of the subwoofers' voice coil driven components so as to prevent undesired noise resulting from slapping of the tinsel leads against the speaker cone in the voice coil driven woofer.

DESCRIPTION OF THE DRAWINGS

These and other objects and advantages of the present invention will become more readily apparent upon reading the following Detailed Description and upon reference to the attached drawings, in which:

FIG. 5 is a vertical sectional view through the mass driven woofer and the voice coil driven woofer, respectively viewed in the left and right portions of the drawing, here illustrating: i) portions of the fixed stationary frame of the apparatus with the casing, magnet, circuit boards and other fixed structural members removed for purposes of clarity; and ii), the movable components of the woofers—viz., the surround, spider and mass of the mass driven woofer; and, the voice coil former, voice coil, speaker cone, spider and surround of the voice coil driven woofer—shown in solid lines in their neutral or null positions, in dotted lines at the limit of their outward or PUSH strokes, and in dashed lines at the limit of their inward or PULL strokes;

FIG. 30 is a schematic circuit drawing, partially in block-and-line form, here illustrating the processing of audio signal information through the Diode Steering Network, the (+) and (−) Tracking Downconvertor Power Supplies, and the Driver Amplifier employed with the voice coil driven woofer of the present invention and, illustrating also, typical, but exemplary, wave forms input to, and output from, the Diode Steering Network;

FIGS. 31A and 31B are placed in side-by-side relation and FIGS. 31B and 31C are placed in top-to-bottom relation, and when FIGS. 31A–31C are viewed conjointly, comprise a schematic circuit diagram depicting the various circuit components of the (+) and (−) Tracking Downconvertor Power Supplies employed with the present invention, it being understood that those blocks pertaining to the Ramp Time Modulator, Switch, Power Output Section, Power Output Feedback and Comparator for the (−) Tracking Downconvertor Power Supply are, except where otherwise indicated, identical to the corresponding components in the (+) Tracking Downconvertor Power Supply and, therefore, the schematic details of such components in the (−) Tracking Downconvertor Power Supply have not been shown in detail;

FIG. 32 is a schematic circuit diagram depicting an exemplary Driver Amplifier employed with the voice coil driven woofer of the present invention;

FIG. 33 is a schematic circuit diagram depicting an exemplary Ground Loop Hum Eliminator which completely eliminates both undesirable "ground loops" and the voltage generated across the broken grounds, thereby completely eliminating the problem of "ground loop" induced 60 Hz hum; and, FIGS. 34A, 34B and 34C are fragmentary diagrammatic views respectively depicting the neutral or null position of the movable voice coil driven speaker cone, the maximum PUSH excursion of the speaker cone, and the maximum PULL excursion of the speaker cone, here particularly illustrating operation of an exemplary spring-type expanded cellular synthetic foam employed to maintain the tinsel leads under tension during PUSH/PULL excursions of the movable components of the voice coil driven woofer.

Figure 1:
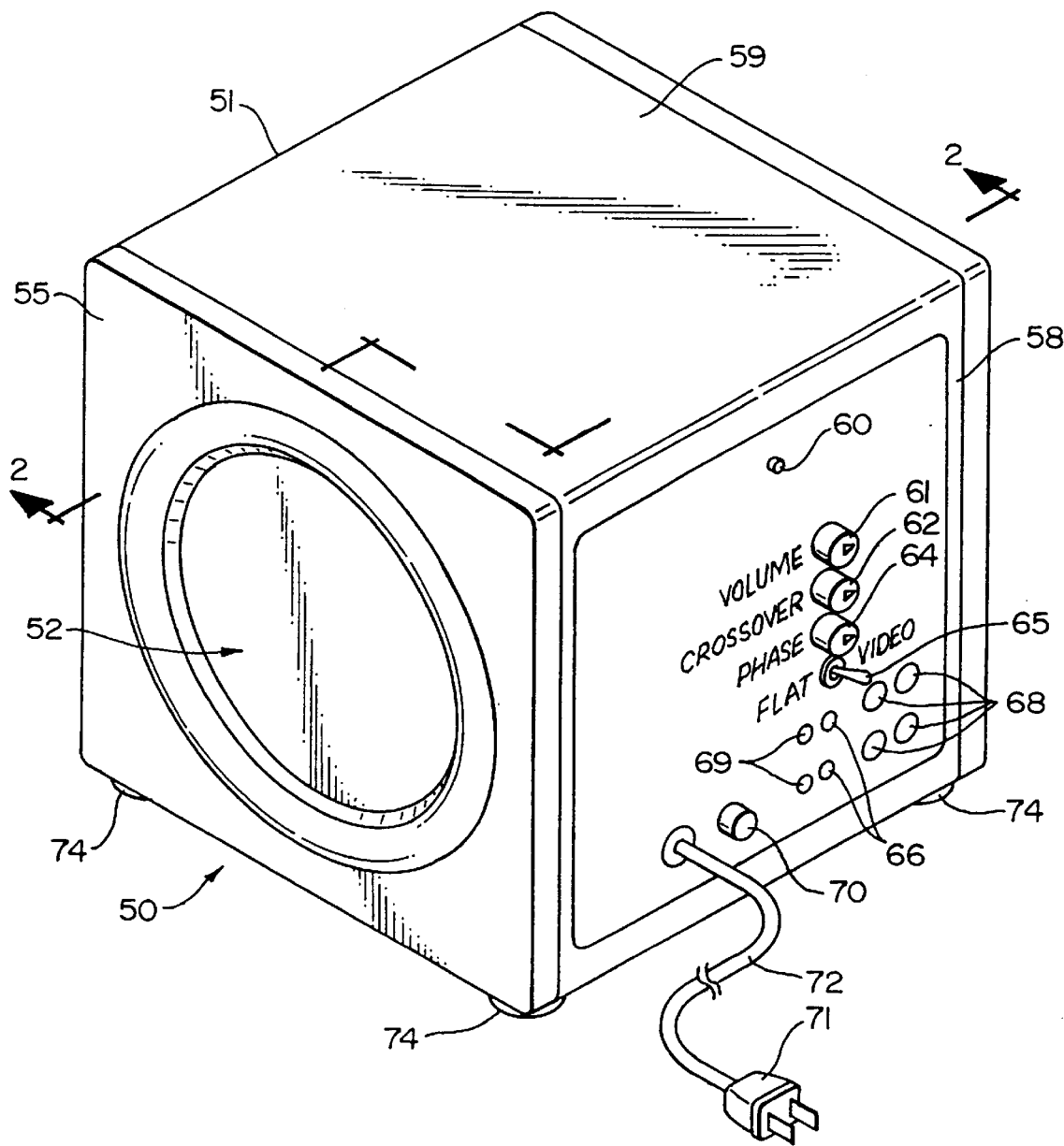
FIG. 1 is an isometric view depicting an exemplary subwoofer embodying features of the present invention.

While the present invention is susceptible of various modifications and alternative forms, specific embodiments thereof have been shown by way of example in the drawings and will herein be described in detail. It should be understood, however, that it is not intended to limit the invention to the particular forms of the invention disclosed; but, on the contrary, the intention is to cover all modifications, structural equivalents, equivalent structures, and/or alternatives falling within the spirit and scope of the invention as expressed in the appended claims. Thus, in the appended claims, means-plus-function clauses and similar clauses are intended to cover: i) the structures described herein as performing a specific recited function; ii) structural equivalents thereof; and iii), equivalent structures thereto. For example, although a nail and a screw may not be deemed to be structural equivalents since a nail employs a cylindrical surface to secure wooden parts together while a screw employs a helical surface, in the art broadly pertaining to the fastening of wooden parts, a nail and a screw should be deemed to be equivalent structures since each perform the recited fastening function.

DETAILED DESCRIPTION

Turning now to the drawings, exemplary embodiments of the present invention will now be described. Thus, referring first to FIG. 1, an exemplary subwoofer, generally indicated at 50, embodying features of the present invention has been depicted. As here shown, the subwoofer 50 includes a cabinet 51 which encloses two drivers, generally indicated at 52 and 54 (only driver 52 is visible in FIG. 1; and, the details of the two exemplary drivers 52, 54 are more specifically shown in FIGS. 2, 3 and 5), which are each oriented in a PUSH/PULL configuration on opposite sides of the cabinet 51. That is, the visible driver 52 depicted in FIG. 1 comprises a mass driven driver shown in greater detail in FIG. 2 and is mounted in one wall of the cabinet (here the left sidewall 55 of the cabinet 51 as viewed in FIG. 1) and fires in PUSH/PULL directions; while the second driver 54 (not visible in FIG. 1, but shown in elevation in FIG. 2 and in section in FIG. 3) is mounted in the opposite or right sidewall 56 of the cabinet 51 in the illustrative embodiments of the invention and simultaneously fires in corresponding PUSH/PULL directions. That is, both drivers 52, 54 move simultaneously in a PUSH (or outward) direction and simultaneously in a PULL (or inward) direction.

In carrying out the invention, the cabinet 51 is a substantially cubic structure with: i) a front wall (not visible in FIG. 1); ii) a rear wall 58 comprising a control panel; iii) left and right sidewalls 55, 56 (sidewall 56 is not visible in FIG. 1 but is visible in FIG. 2), respectively, within which the woofer drivers 52, 54 are mounted; iv) a top wall 59; and v), a bottom wall (not visible in FIG. 1), all preferably constructed of a rigid, non-resonant, inert material such as MDF type particle board, wood, or the like. Each panel or wall can have a suitable finish applied thereto such that the subwoofer can match the furnishings of the room where it will be installed. The drivers 52, 54 may, if desired, be covered by an acoustically transparent material (not shown).

It will be noted upon inspection of FIG. 1 that the rear wall 58 containing the control panel—i.e., the wall in the right foreground as viewed in the drawing—includes: i) a Power ON/OFF indicator light 60; ii) three control knobs for permitting manual adjustment of Bass Level (knob 61), Crossover Frequency (knob 62), and Phase (knob 64); iii) a manually operable toggle switch 65 for selecting between Video Contour and Flat operation; iv) one pair of right and left female input jacks 66 and one pair of right and left female input posts 68 for permitting inputting of audio signals; v) one pair of right and left female output jacks 69; vi) a fuse 70; and vii), an A.C. outlet plug 71 and power cord 72. The audio signal input jacks 66, 68, 69 can be connected to any suitable cables (not shown) which bring the audio signal to the subwoofer 50.

The front, rear, side, top and bottom panels (i.e., sidewalls 55, 56, rear wall 58, top wall 59, and the front and bottom walls which are not visible in FIG. 1) of the cabinet 51 are fixed to each other to form the cabinet using known techniques. The cabinet 51 is preferably sealed so that air can neither enter nor exit. Feet 74 (FIG. 1) may be placed on the bottom panel 75 (not visible in FIG. 1 but shown in FIG. 2) of the cabinet 51 which raise the subwoofer 50 off of the floor (not shown). The feet 74 are, in the illustrative apparatus, generally disk-shaped, of sufficient strength to support the subwoofer 50, and preferably formed of non-skid material capable of providing some sound or vibration insulation.

In accordance with one of the important aspects of the present invention, and as hereinafter described in connection with FIGS. 2 and 3, the exemplary subwoofer 50 employs two drivers—viz., a mass driven driver or woofer 52 mounted in the left sidewall 55 of the cabinet 51 as viewed in FIGS. 1 and 2, and a voice coil driven driver or woofer 54 mounted in the right sidewall 56 of the cabinet 51 as viewed in FIG. 2. While the voice coil driven woofer 54 has been shown only in elevation in FIG. 2, a sectional view disclosing details of the driver has been depicted in FIG. 3.

Figure 2:
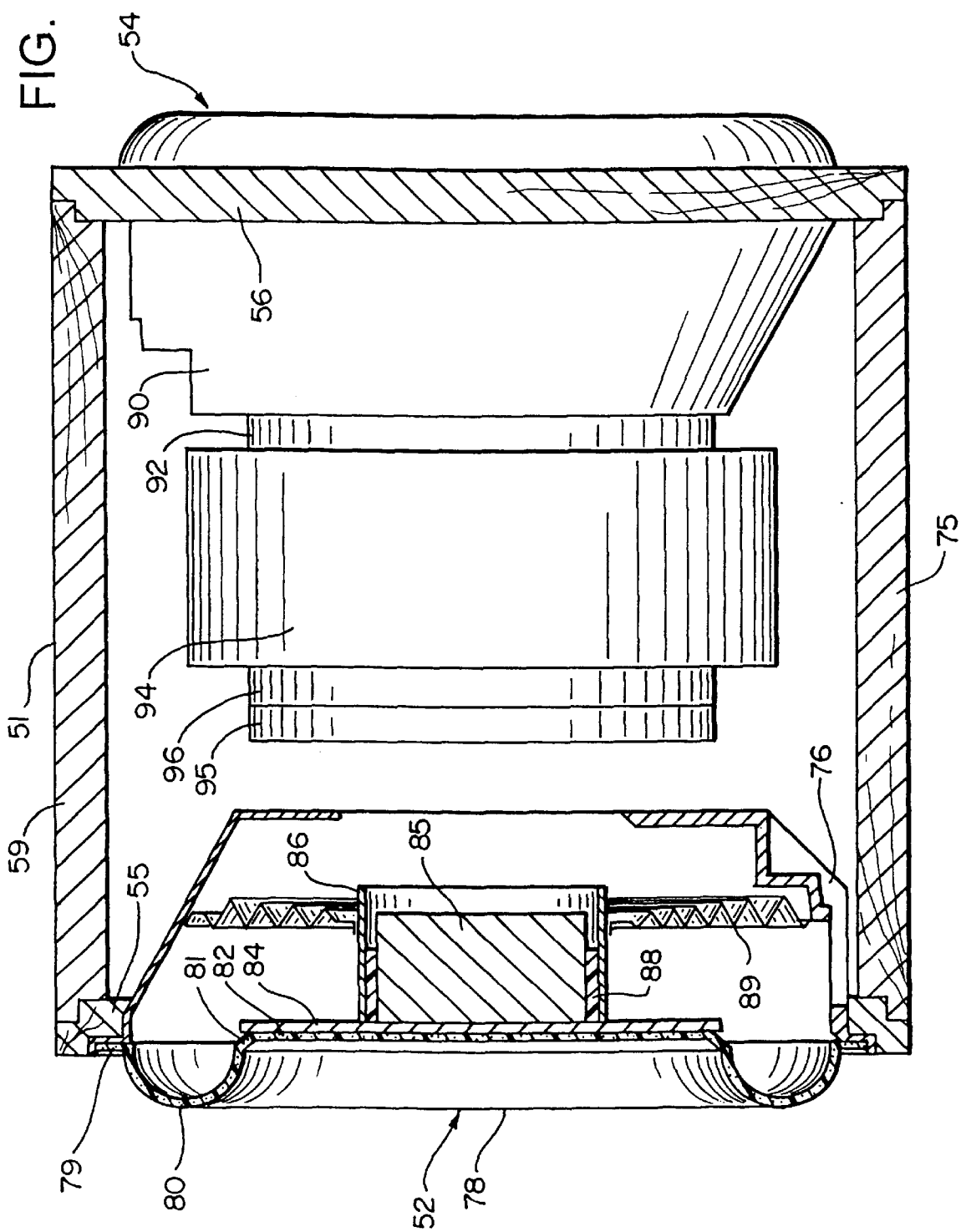
FIG. 2 is a vertical sectional view, partly in elevation, taken substantially along the offset line 2—2 in FIG. 1, here depicting the relationship of the voice coil driven woofer, shown in elevation, and the mass driven woofer, shown in section, as they are mounted within an exemplary 11"×11"×11" cabinet cube.

It will be noted upon inspection of FIG. 2, that the mass driven woofer 52 includes a stationary frame or cage 76 mounted in the left sidewall 55 of the cabinet 51 for resiliently supporting the moving driver components in a stable manner wherein the movable driver components are constrained for PUSH/PULL movement axially out of and axially into the cabinet. The movable driver components in the mass driven driver 52 comprise: a resilient, but semi-rigid, high pressure resistant surround 78 formed of an expanded synthetic cellular foam such, for example, as an expanded cellular polyethylene ("PE") surround foam and comprising a generally circular element having an outer peripheral circumferential flange 79, an annular half roll or "edgeroll" 80 integral with the flange 79 and terminating in an inner annular inturned or downturned integral flange 81 which is, in turn, integral with a flat central disk portion 82. A rigid backing plate 84 formed of paperboard, plastic or the like is adhesively bonded to the central disk portion 82 of the surround 78. A round rod-shaped metal mass 85 weighing approximately one and seven-tenths pounds (1.7 lbs.) is secured to the backing plate 84 within a cardboard or paperboard cylindrical tube 86 by means of a suitable epoxy glue 88. Finally, the movable components of the mass driven woofer 52—which collectively approximate two pounds (2.0 lbs.) in the aggregate—include an annular flexible spider 89 having a corrugated cross-sectional configuration wherein the corrugations get progressively deeper towards the outer periphery of the spider 89. The outer periphery of the spider 89 is fixedly secured to the frame or cage 76 of the mass driven woofer 52, while its inner periphery is fixedly secured to the cylindrical cardboard or paperboard tube 86 surrounding the mass 85.

Figure 3:
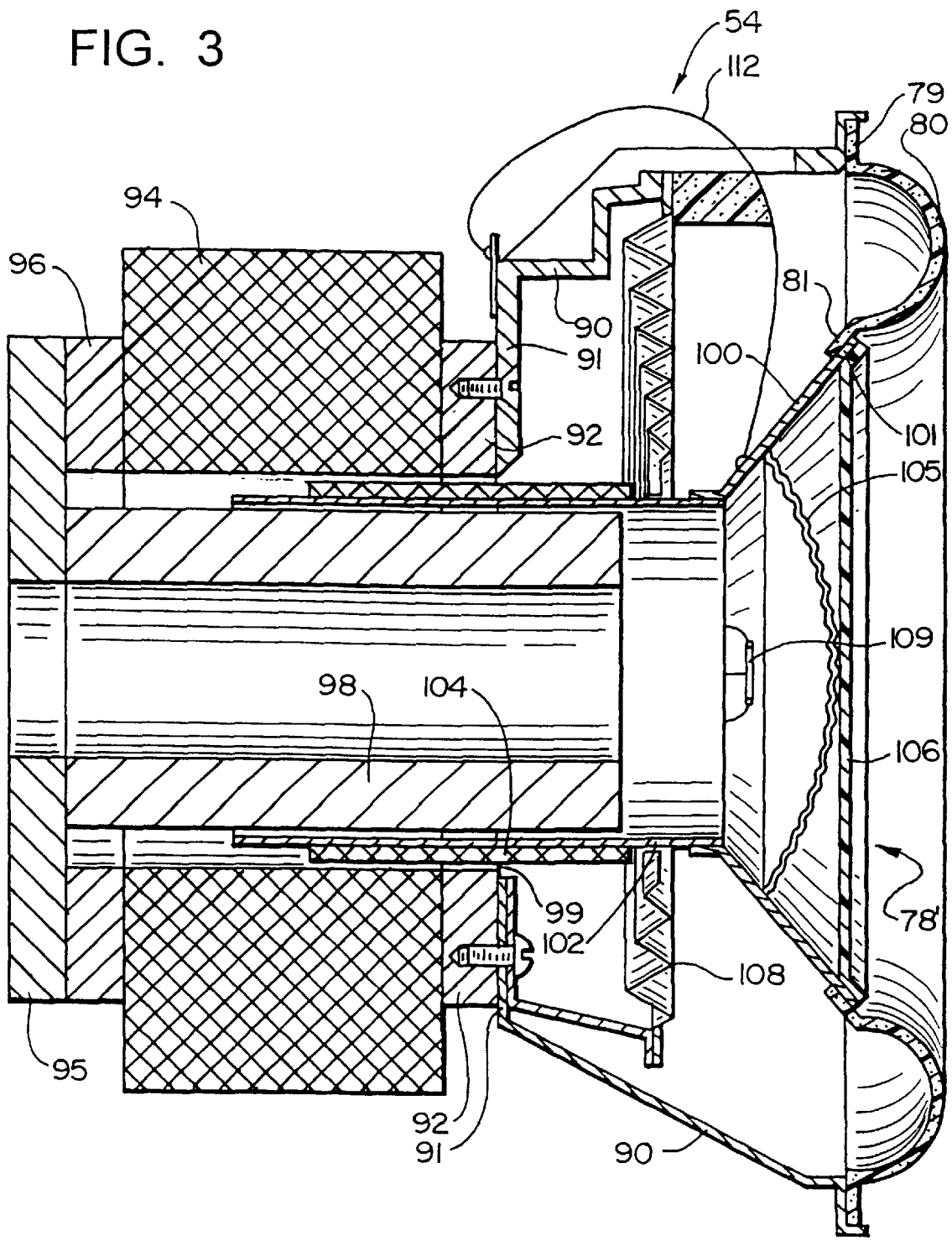
FIG. 3 is an enlarged sectional view through the voice coil driven woofer illustrating details of the construction thereof.

Considering next FIGS. 2 and 3 conjointly, it will be noted that the voice coil driven woofer 54 includes a stationary basket-like frame or cage 90 which is fixedly mounted in the right sidewall 56 of the cabinet 51 as viewed in FIG. 2. The base of the frame 90 comprises an annular washer-shaped flange 91 which is secured to an annular metal top spacer 92 adjacent which is positioned an annular magnet 94 having an external diameter of approximately 7 and $^{11}/_{16}$ inches, an internal diameter of approximately 3½ inches, a depth of approximately 1.75 inches or slightly greater, and a weight of approximately 225 ounces (approximately 14 pounds, 1 ounce). In the exemplary form of the invention shown, the magnet 94 comprises a single-piece magnet having a depth or length of approximately 1.75 inches; but, as those skilled in the art will appreciate, the magnet 94 can be formed of two or more magnet segments which, when assembled in end-to-end relation, have the approximate dimensional and weight characteristics hereinabove described. The bottom face of the annular magnet 94 is spaced from an annular metal bottom plate 95 by an annular spacer 96. The final stationary member of the voice coil driven woofer 54 comprises an annular pole piece 98 having an external diameter of approximately 3 inches. The arrangement is such that the outer diameter of the annular pole piece 98 defines an annular gap 99—termed the "magnetic gap"— between the pole piece 98 and the upper annular spacer 92 with the annular magnetic gap being approximately 0.1" to about 0.25" in radial width.

The movable components of the voice coil driven woofer 54 comprise: i) an expanded synthetic cellular foam surround 78' such, for example, as an expanded cellular polyethylene ("PE") foam surround, which is substantially identical to the surround 78 employed with the mass driven woofer 52 previously described except that the central disk-shaped portion 82 of the surround 78 associated with the mass driven woofer 52 has been removed in the surround 78' employed with the voice coil driven woofer 54; ii) a speaker cone 100 having a funnel shape with its outer large diameter end 101 being adhesively bonded or otherwise fixedly secured to the inner inturned flange 81 on the surround 78'; iii) a cylindrical voice coil former 102 having an inner diameter slightly greater than the outer diameter of the annular pole piece 98; iv) a voice coil 104 wound about the voice coil former and having an outer diameter slightly less than the inner diameter of the upper annular spacer 92; v) a rigid dust cover or surround support 105 having a shape comprising a segment of a sphere which is positioned within, and secured to, the funnel-shaped speaker cone 100 with the domed portion of the dust cover/support facing outwardly; vi) a decorative cover 106 formed of expanded cellular polyethylene ("PE") surround foam, or similar material, positioned within, and secured to, the outermost large diameter end 101 of the speaker cone 100 with the decorative cover 106 abutting the dust cover/support at their respective midpoints; and vii), and annular spider 108 having a corrugated cross section wherein the depth of the corrugations progressively increase from the inner periphery towards the outer periphery with the spider 108 being secured at its innermost periphery to the outer surface of the voice coil former 102 and at its outer periphery to the frame or cage 90 of the apparatus.

Thus, the arrangement is such that when positive or negative voltage levels are output from the tracking downconvertor drive amplifier (not shown in FIGS. 2–5, but described in greater detail below in connection with FIGS. 13, 14A, 14B and 30–32)—which is capable of delivering 2,700 watts rms to a nominal 4 ohm resistive load and swinging 104 volts rms—and applied to the voice coil 104, current flows through the voice coil 104 creating magnetic fields around the voice coil. These voice coil magnetic fields interact with the magnetic field of the magnet 94, causing the voice coil former 102, voice coil 104, speaker cone 100, dust cover 105, surround 78', decorative cover 106 and spider 108 to move in an axial direction—e.g., in an outward axial PUSH direction when positive voltage levels are output from the tracking downconvertor drive amplifier; and, in an inward axial PULL direction when negative voltage levels are output from the tracking downconvertor drive amplifier.

Thus, the movable voice coil former 102 and voice coil 104 move axially within the magnetic gap 99 between the annular pole piece 98 and the annular upper spacer 92 with a PUSH/PULL movement dependent upon the polarity of the voltage applied to, and the current flow in, the voice coil 104. Since the voice coil former 102 and voice coil 104 reciprocate axially within the magnetic gap 99—i.e., move to the left and to the right as viewed in FIGS. 3 and 5—the speaker cone 100 attached to the right hand end of the voice coil former 102 as viewed in FIGS. 3 and 5 reciprocates axially with the voice coil 104 and voice coil former 102. Such reciprocating movement is permitted because of the resilient nature and shapes of: i) the surround 78'—which is self supporting and semi-rigid; and ii), the spider 108, which together represent the sole suspension mechanisms for the movable components of the voice coil driven woofer 54. Moreover, the surround 78' and spider 108—but particularly the surround 78'—are designed so as to be capable of: i) permitting a peak-to-peak stroke of the movable driver components of 2.5"; ii) resisting or standing off internal box pressure ranging from 1.5 lbs/in$^2$ to 3 lbs/in$^2$ (an internal box pressure which, when applied to a typical 8" Dia. speaker cone 100, translates to a force of approximately 150 lbs. applied to the speaker cone 10); and iii), simultaneously supporting and stabilizing the moveable driver components on the longitudinal axis passing through the magnetic gap 99 without significant or meaningful wobble.

It will further be noted that an accelerometer 109 is mounted in the speaker cone on the end of the voice coil former 102. The accelerometer 109 serves to sense the movement of the movable components of the voice coil driven woofer 54 and any movement distortion, with signals representative of such movement and any such distortions being conveyed to the processing circuitry discussed hereinafter.

Figure 4:
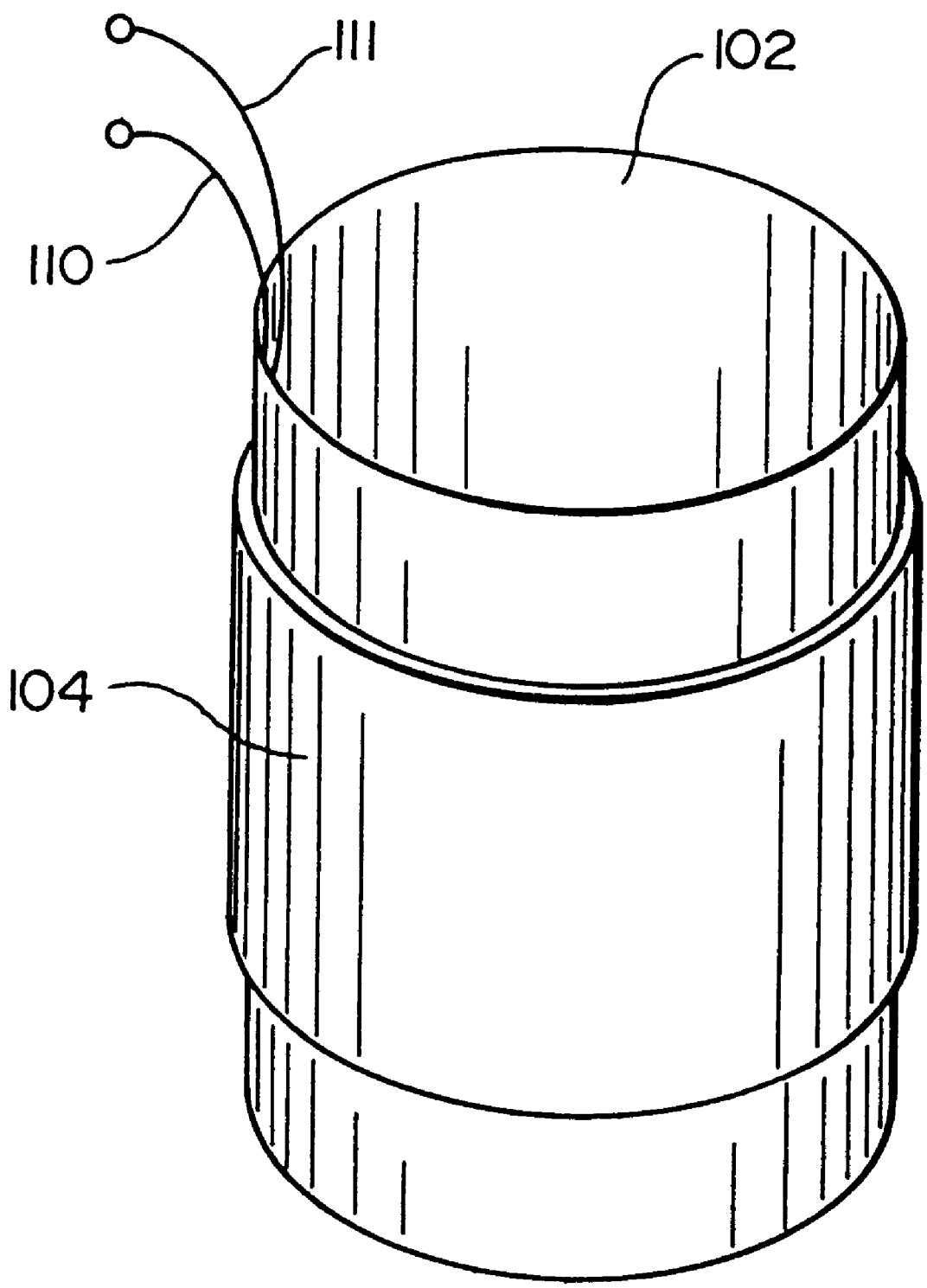
FIG. 4 is an isometric view of an illustrative voice coil former and a voice coil wound thereabout which is suitable for use with the exemplary voice coil driven woofer depicted in FIG. 3.

Referring next to FIG. 4, an isometric view of the exemplary voice coil former having a voice coil wound thereabout has been depicted. It will be noted that electrical leads 110, 111 are coupled to the voice coil 104 and project outwardly from the voice coil former 102, which leads 110, 111 are electrically coupled to tinsel leads 112 extending from the frame 90 to the speaker cone 100 as shown in FIG. 3. In the practice of the exemplary form of the invention herein illustrated and described, the voice coil 104 is preferably a four layer winding having an internal diameter of approximately 3.25" and an overall winding length of approximately 2".

Figure 6:
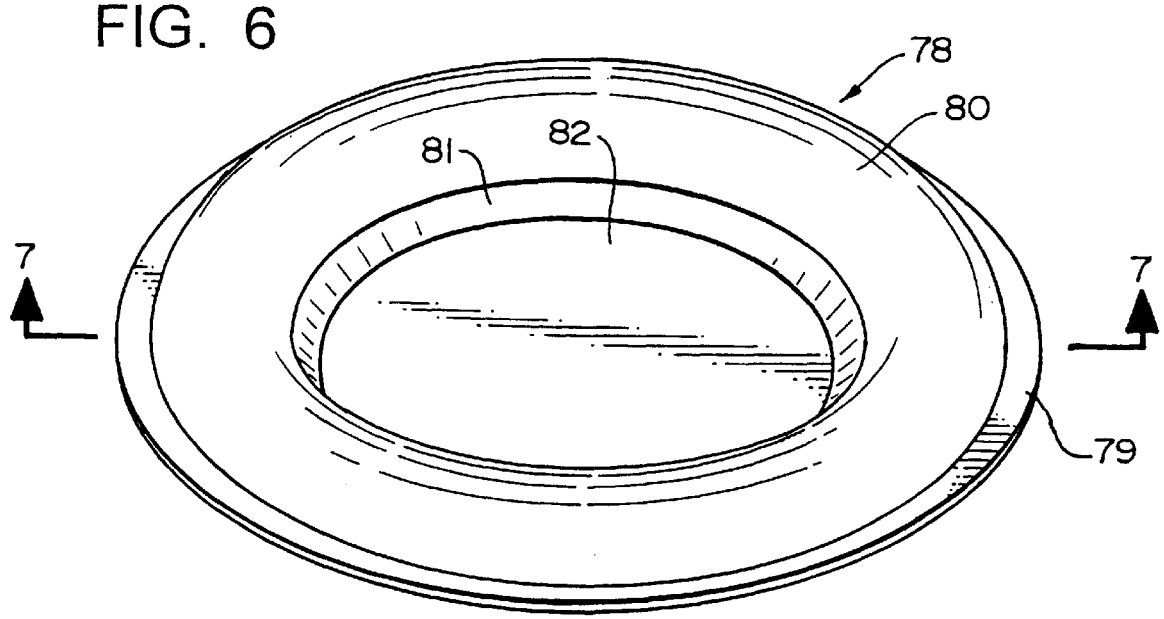
FIG. 6 is an isometric view of an exemplary surround embodying features of the present invention and which is here employed with the mass driven woofer depicted in FIG. 2.
Figure 7:
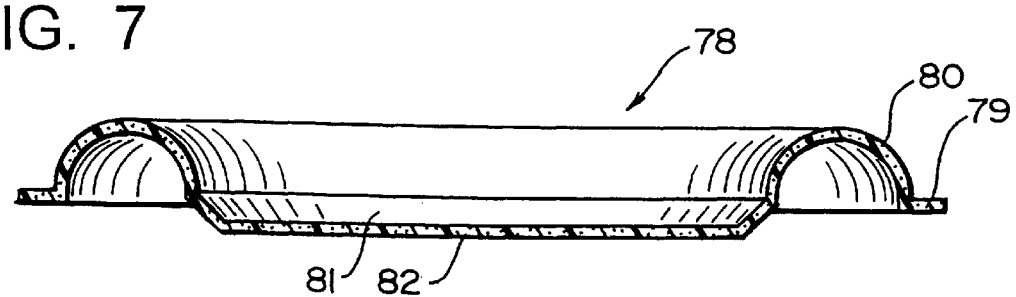
FIG. 7 is a vertical sectional view taken substantially along the line 7—7 in FIG. 6.
Figure 8:
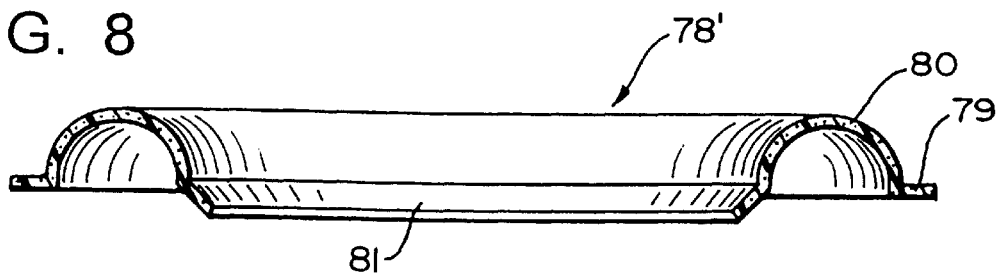
FIG. 8 is a vertical sectional view similar to FIG. 7, but here illustrating a surround suitable for use with the voice coil driven woofer and having its central disk-shaped portion removed.

Turning next to FIGS. 6 and 7 conjointly, details of the surround 78 for the mass driven woofer 52, which surround embodies features of, and is made in accordance with, the present invention, have been illustrated. As here shown, it will be noted that the exemplary surround 78 employed in a subwoofer having a speaker cone 100 with an effective 8"

diameter is approximately 9.9 inches in diameter. The outer peripheral flange 79 of the surround 78 is approximately 0.3875 inches wide terminating at its inner edge in a half round or edgeroll 80 having an outside diameter ("O.D.") of approximately 1.5". The surround 78 is preferably of substantially uniform thickness throughout; and, is preferably on the order of about 0.1 inches in thickness or greater. As previously indicated, the only difference between the surround 78 shown in FIGS. 6 and 7 used with the mass driven woofer 52 and the surround 78' for the voice coil driven woofer 54 is the fact that the central flat disk-shaped portion 82 of the surround 78 has been removed from the surround 78' for the voice coil driven woofer 54 as shown in FIG. 8.

The surround 78 described above is intended for use in supporting a speaker cone 100 having an effective 8" diameter which would normally be mounted in a basket-like frame or cage 90 having a diameter of approximately 10". When the surround is intended for use with, for example, a speaker cone 100 having an effective 10" diameter and mounted in a basket-like frame or cage 90 having a diameter of approximately 12", the surround 78 will have a diameter of approximately 11.9", a uniform thickness on the order of at least 0.14", or more, an outer peripheral flange 79 approximately 0.3875" wide, and an edgeroll 80 having an I.D. of approximately 1.5".

Conventional surrounds are, and have been, typically fabricated from, for example, an expanded cellular polyethylene ("PE") surround foam sheet which is approximately 7/16" in thickness and which is compressed to form a very resilient, compliant suspension member having a thickness of approximately 0.02". Such conventional prior art surrounds are very thin and flexible, often having little more rigidity than rubber gloves; and, consequently, have very little ability to stand off internal pressures within the woofer box 51. However, since conventional woofers generally generate internal pressures of only on the order of 0.1 lbs/in$^2$ to about 0.2 lbs/in$^2$, and normally have peak-to-peak strokes of only 0.4" to 0.6", the conventional thin, highly flexible, compliant prior art surrounds have generally been acceptable. Typically such conventional surrounds will have an outer half roll or "edgeroll" of not more than, and usually less than, one inch in diameter.

As will be described hereinbelow, the mass driven woofer 52 and voice coil driven woofer 54 of the present invention are driven through peak-to-peak excursions of 2.5" as contrasted with conventional woofers which typically have peak-to-peak excursions ranging from only about 0.4" to about 0.6"—i.e., the movable components of the drivers 52, 54 of the present invention are driven to excursions ranging from five to six times the excursions typically generated in conventional subwoofers. Moreover, subwoofers made in accordance with the present invention generate internal box pressures of between 1.5 lbs/in$^2$ and 3 lbs/in$^2$ as contrasted with internal box pressures of only about 0.1 lbs/in$^2$ to about 0.2 lbs/in$^2$ for conventional subwoofers—i.e., the internal box pressures that must be withstood by the surrounds 78, 78' of the present invention range from fifteen to thirty times greater than the internal pressures generated in conventional subwoofers. Accordingly, conventional surrounds are simply not capable of standing off the pressures generated and/or supporting the movable driver components free of wobble and in a stable, but axially reciprocable, position wherein the voice coil former 102 and the voice coil 104 wound thereabout are capable of moving axially within the magnetic gap 99 through a peak-to-peak stroke of up to 2.5" without touching either the annular pole piece 98 or the surrounding magnet/spacer 94/92 structure.

In accordance with one of the important aspects of the present invention, the surrounds 78, 78' of the present invention have been modified in two significant respects as compared with conventional surrounds. Although made of an expanded synthetic cellular foam such, for example, as an expanded cellular polyethylene ("PE") surround foam which is typically supplied in sheets 7/16" thick, the finished surrounds 78, 78' of the present invention are, for an 8 inch speaker, preferably a minimum of about 0.1" in thickness ranging up to 0.14" in thickness or more—i.e., from five to seven times the thickness of a conventional surround for eight inch and larger conventional subwoofers. Secondly, the half round or "edgeroll" 80 of the surrounds 78, 78' employed with the present invention have an outside diameter of at least 1.5" as contrasted with conventional surrounds which typically have an edgeroll of not more than, and usually less than, 1.0" in outside diameter.

Figure 9:
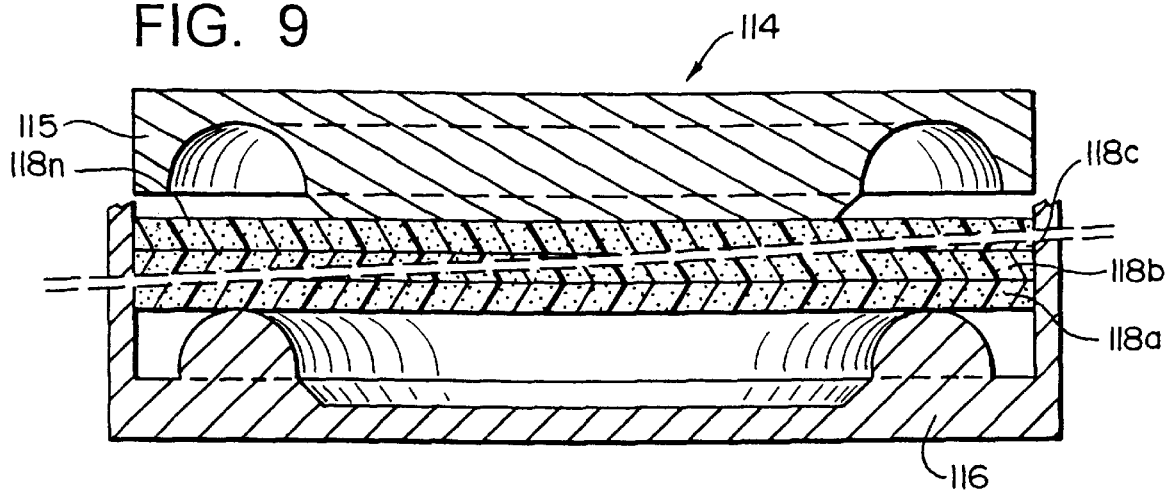
FIG. 9 is a highly diagrammatic vertical sectional view depicting one exemplary manufacturing process for making a surround in accordance with the present invention, here showing fragmentary portions of cooperable complementary male and female dies and a fragmentary portion of multiple layers of an expanded synthetic cellular foam such, for example, as an expanded cellular polyethylene ("PE") surround foam employed in the manufacture of a surround embodying features of the present invention.
Figure 10:
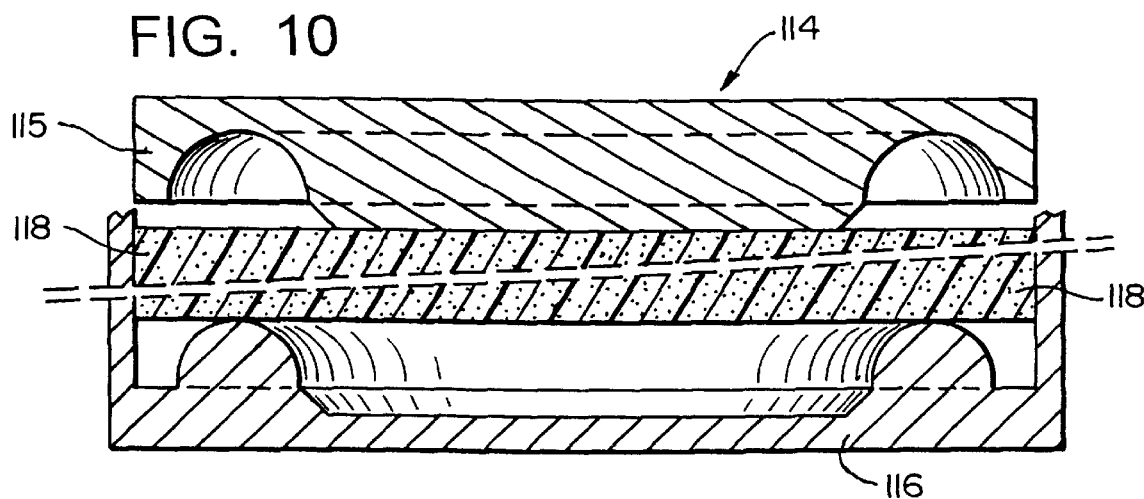
FIG. 10 is a highly diagrammatic, fragmentary, vertical sectional view similar to FIG. 9, but here illustrating the use of a single relatively thick sheet of an expanded synthetic cellular foam employed to manufacture a surround embodying features of the present invention.
Figure 11:
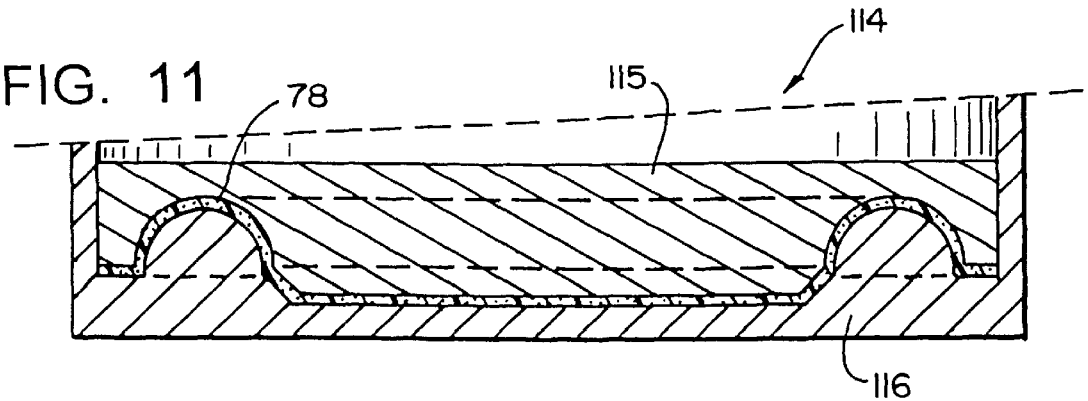
FIG. 11 is a highly diagrammatic, fragmentary, vertical sectional view similar to FIGS. 9 and 10, here illustrating the male die fully inserted into the female die so as to compress the expanded synthetic cellular foam to form a finished surround of the type employed in the exemplary mass driven woofer and which embodies features of the present invention.

In order to carry out this aspect of the invention, and as best shown in FIGS. 9, 10 and 11, the surrounds 78 of FIGS. 6 and 7 are formed in a press, generally indicated at 114, having complementary cooperable male and female die portions 115, 116 respectively. In one form of the invention as depicted in FIG. 9, multiple layers 118a–118n of an expanded synthetic cellular foam—such, for example, as an expanded cellular polyethylene ("PE") surround foam— each approximately 7/16" thick are positioned in abutting face-to-face relation within the female die 116 of the press 114. For an eight inch speaker, typically there will be at least five such layers 118a–118e (i.e., where "n" equals "e" or five) totaling at least 2 3/16" in aggregate thickness; and, there may be up to seven or more such layers with each additional layer increasing the aggregate thickness by approximately 7/16". Alternatively, where available, a single sheet 118 of an expanded synthetic cellular foam—e.g., an expanded cellular polyethylene ("PE") surround foam having a thickness of at least 2 3/16", or more—can be placed within the female die 116 as shown in FIG. 10. Of course, where the thickness of the expanded cellular foam layer(s) exceeds approximately 2 3/16", the female die member 116 must be modified to accommodate the additional material and to allow for a uniform thickness of the finished surround greater than about 0.14". In either case, the male die 115 is then shifted relative to the female die 116 in a suitable press at a temperature of approximately 430° F. and approximately 80 psi for a period on the order of about forty-five (45) seconds.

Those skilled in the art will, of course, appreciate that the pressure, temperature and time parameters set forth hereinabove can be varied somewhat without departing from the spirit and scope of the invention as expressed in the appended claims. However, it has been found that excellent results can be obtained on a consistent replicable basis where: i) pressure is maintained in the range of from about 60 psi to about 100 psi with about 80 psi being preferable; ii) temperature is maintained in the range of about 420° F. to about 450° F.; and iii), time is maintained in the range of from about forty (40) seconds to about ninety (90) seconds. Surrounds 78, 78' embodying features of the present invention, and made in accordance with the methods of the present invention, have been manufactured by Rapid Die & Molding Co., Inc. of Schiller Park, Ill., to specifications originated and developed by the inventor using tooling proprietary to the inventor.

The process and product parameters for manufacturing conventional single ply surrounds using a single layer of expanded cellular polyethylene ("PE") surround foam of approximately 7/16" in thickness to produce highly resilient compressed surrounds with thicknesses of not more than about 0.02" and a half round or "edgeroll" of not more than 1.0" O.D. using an RDM2102 press (without the modifications required for the practice of the present invention) are proprietary to, and the property of, Rapid Die & Molding Co., Inc.; and, no claim is, or will hereafter be, made herein and/or in any future application filed by or on behalf of the inventor which would interfere with Rapid Die & Mold's exclusive right to use its pre-existing proprietary processes, information and technology; but, such prior processes, information and technology may not be modified so as to enable Rapid Die & Mold and/or others to manufacture surrounds 78, 78' embodying features of the present invention and/or in accordance with the processes of the present invention— i.e.,: i) surrounds 78, 78' employing half rolls or "edgerolls" 80 having diameters equal to and greater than 1.5"; and/or ii), surrounds 78, 78' having a substantially uniform thickness on the order of at least 0.1" or greater formed from either: a) multiple layers 118a–118n of an expanded synthetic cellular foam such, for example, as an expanded cellular polyethylene ("PE") surround foam, and/or from other similar natural or synthetic materials, aggregating on the order of approximately 2³⁄₁₆" thickness or greater prior to compression; or b), a single layer 118 of such material having an initial thickness equal to or greater than on the order of approximately 2³⁄₁₆". The resulting surround 78, when removed from the press 114, exhibits the characteristics and dimensions of the surround as shown in FIGS. 6 and 7 and which have been described hereinabove.

Directing attention now to FIGS. 12A, 12B and 13, an illustrative, but merely exemplary, overall circuit architecture directly controlling operation of the voice coil driven woofer 54 (FIGS. 2, 3 and 5)—and, therefore, indirectly controlling operation of the slaved mass driven woofer 52 in a manner to be explained in further detail hereinbelow—has been illustrated in highly diagrammatic block-and-line form. The specific circuit details for each of those blocks representative of unique circuitry employed in carrying out the present invention will be described in greater detail below in connection with FIGS. 24 through 33; while those blocks which are representative of conventional electrical circuitry well known to persons skilled in the art will simply be indicated to be conventional and will not, therefore, be described herein in further detail since such a description should not be necessary for persons skilled in the art. Nevertheless, the particular schematic circuit details, including identification of electrical components and values, are fully disclosed in the computer-generated size "D" schematic circuit drawings submitted concurrently with filing of this application as Appendices "A" and "B" and forming part of the file history thereof; although, such Appendices are not to be printed as part of any Letters Patent(s) issuing herefrom. Those interested in acquiring further information pertaining to such conventional circuits are, therefore, referred to Appendices "A" and "B".

Figure 12A:
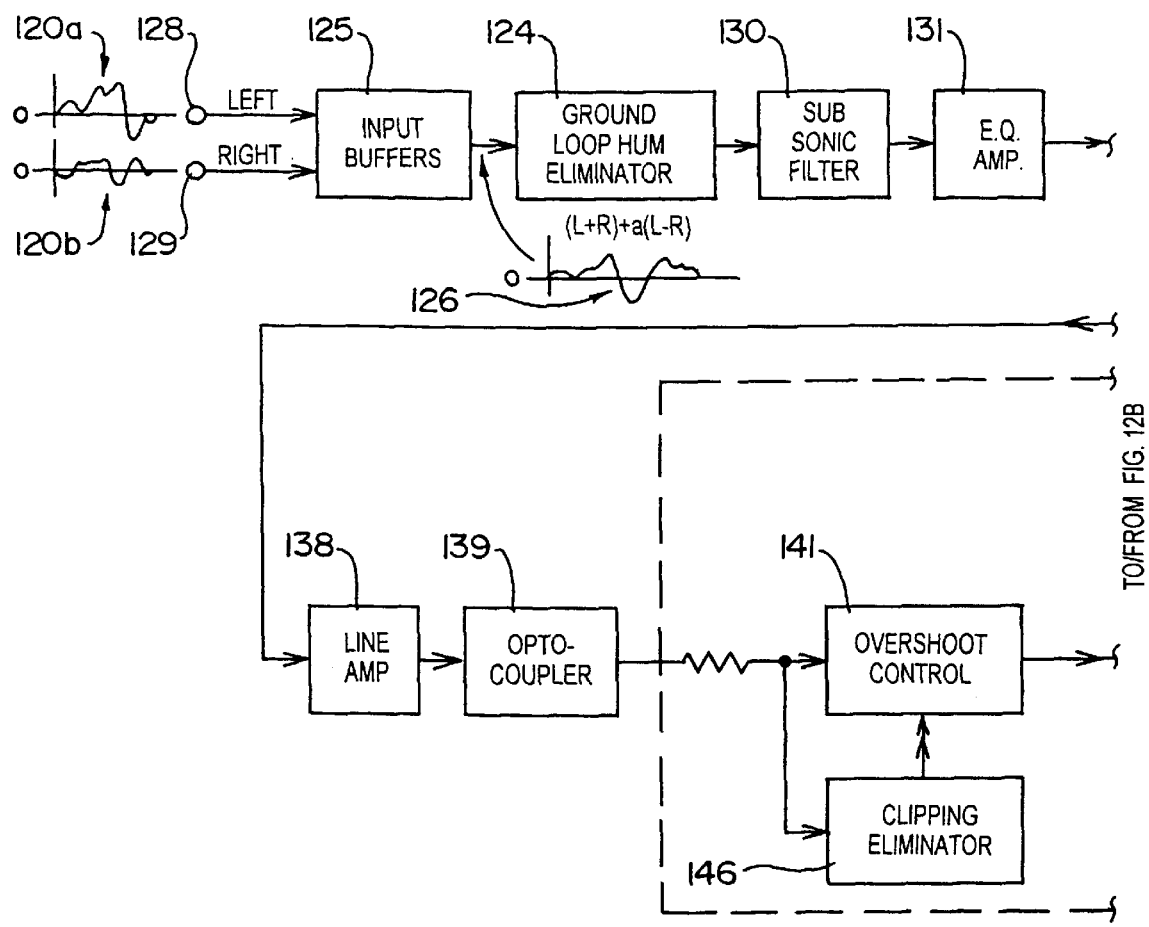
FIGS. 12A and 12B, when placed in side-by-side relation and viewed conjointly, comprise a block-and-line drawing here depicting, in highly diagrammatic form: i) certain of the electrical architecture employed in accordance with the present invention to process an audio input signal; and ii), an exemplary Master Protection Circuit for controlling the audio signal being processed.
Figure 12B:
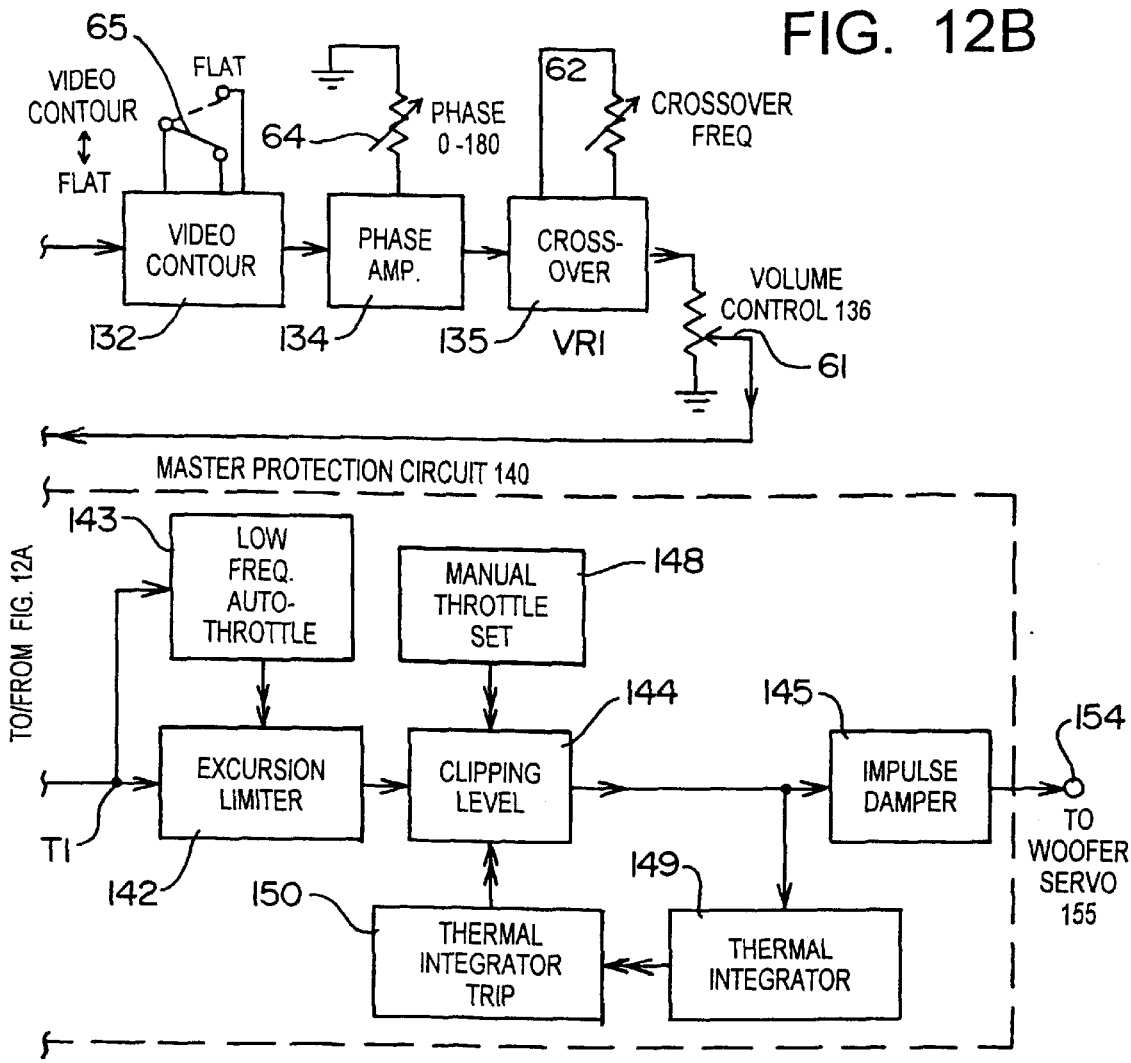

Thus, in carrying out the present invention, and as best shown in FIGS. 12A and 12B, an audio signal, generally indicated at 120a, 120b (FIG. 12A), from any suitable signal source is input to the subwoofer 50 of the present invention by suitable cable(s) (not shown) plugged into one or both pairs of input jacks 66, 68 on the rear wall 58 control panel of the woofer cabinet 51 as shown in FIG. 1; and, such audio signal is presented as left and right inputs 120a, 120b, respectively, to the Input Buffers 125 as shown in FIG. 12A. The Input Buffers 125 serve two important functions—viz., first they serve to isolate the electronics within the subwoofer 50 from the environment outside the subwoofer cabinet 51 (FIGS. 1 and 2); but, more importantly, they also serve to algebraically sum and process the left and right components 120a, 120b respectively of the audio signal— i.e., the L+R components and the L−R components—in such a way that the L+R and the L−R components of the audio signal are output from the Input Buffers 125 as a composite audio signal (L+R)+α(L−R), generally indicated at 126 in FIG. 12A, which retains both the L+R and the L−R components of the audio signal. This is a significant and important advance in subwoofer design; and, is distinguishable from conventional prior art subwoofers where the L−R components of the signal are, in effect, destroyed. As a consequence of retaining both the L+R and the L−R components of the audio signal, the audio sounds presented to the listener(s) are characterized by enhanced life, luster, depth and impact—in effect replicating what the human ear hears in a live performance. Specific details of a simplified exemplary embodiment of the Input Buffers 125 are shown and will be described in greater detail below in connection with FIG. 24. Moreover, although merely exemplary, a specific detailed circuit arrangement, including component identities and values, is contained within Appendix "B" submitted concurrently with this Application and forming part of the file history hereof; and, those persons interested in acquiring such schematic details are referred to Appendix "B".

The Input Buffers 125 output a composite audio signal 126 containing both the L+R and the L−R components of the signal successively to: i) a Ground Loop Hum Eliminator 124; ii) a Subsonic Filter 130; iii) an E.Q. Amplifier 131; iv) a Video Contour Controller 132; v) a Phase Amplifier 134; vi) a Crossover Control circuit 135; vii) a Volume Control 136; viii) a Line Amplifier 138; ix) an Opto-Coupler 139 (which serves to further isolate the electronics within the subwoofer 50 from the environment outside the subwoofer cabinet 51); and x), a Master Protection Circuit 140. The Subsonic Filter 130, E.Q. Amplifier 131, Video Contour Controller 132, Phase Amplifier 134, Crossover Control circuit 135, Volume Control 136, Line Amplifier 138 and Opto-Coupler 139 are all completely conventional circuits well known to persons skilled in the art and will not be described herein in further detail. Those interested in acquiring more detailed information with regard to such conventional circuits are referred to Appendix "B".

The Master Protection Circuit 140 illustrated in block-and-line form in FIGS. 12A and 12B includes: i) an Overshoot Control circuit 141; ii) an Excursion Limiter circuit 142; iii) a Clipping Level circuit 144; and iv), an Impulse Damper 145 for processing the audio signal 126 (audio signal flows are indicated by "→" in FIGS. 12A and 12B) with the processed audio signal 126 being output from the Master Protection Circuit 140 by the Impulse Damper 145. Additionally, the Master Protection Circuit 140 includes: v) a Clipping Eliminator circuit 146; vi) a Low Frequency Auto-Throttle circuit 143; vii) a Manual Throttle Set circuit 148; viii) a Thermal Integrator circuit 149; and ix), a Thermal Integrator Trip circuit 150 for generating control signals (control signal flows are indicated by "→" in FIGS. 12A and 12B) which serve to control the audio signal 126 being processed.

Of the foregoing processing and control circuits, the Excursion Limiter circuit 142 (FIGS. 12B and 25), Clipping Level circuit 144 (FIGS. 12B and 27), Thermal Integrator circuit 149 (FIGS. 12B and 27), Thermal Integrator Trip circuit 150 (FIGS. 12B and 27), Low Frequency Auto-Throttle circuit 143 (FIGS. 12B and 26), Impulse Damper circuit 145 (FIGS. 12B and 27), and Ground Loop Hum Eliminator 124 (FIGS. 12A and 33) uniquely contribute to carrying out the present invention and will be described in greater detail hereinbelow in connection with such drawings. Those interested in acquiring further detailed information about any or all of those circuits or, for that matter, the Overshoot Control circuit 141, Manual Throttle Set circuit 148 and/or Clipping Eliminator circuit 146 (each of the latter three circuits are completely conventional and well known to persons skilled in the art) are referred to Appendix "B".

Figure 13:
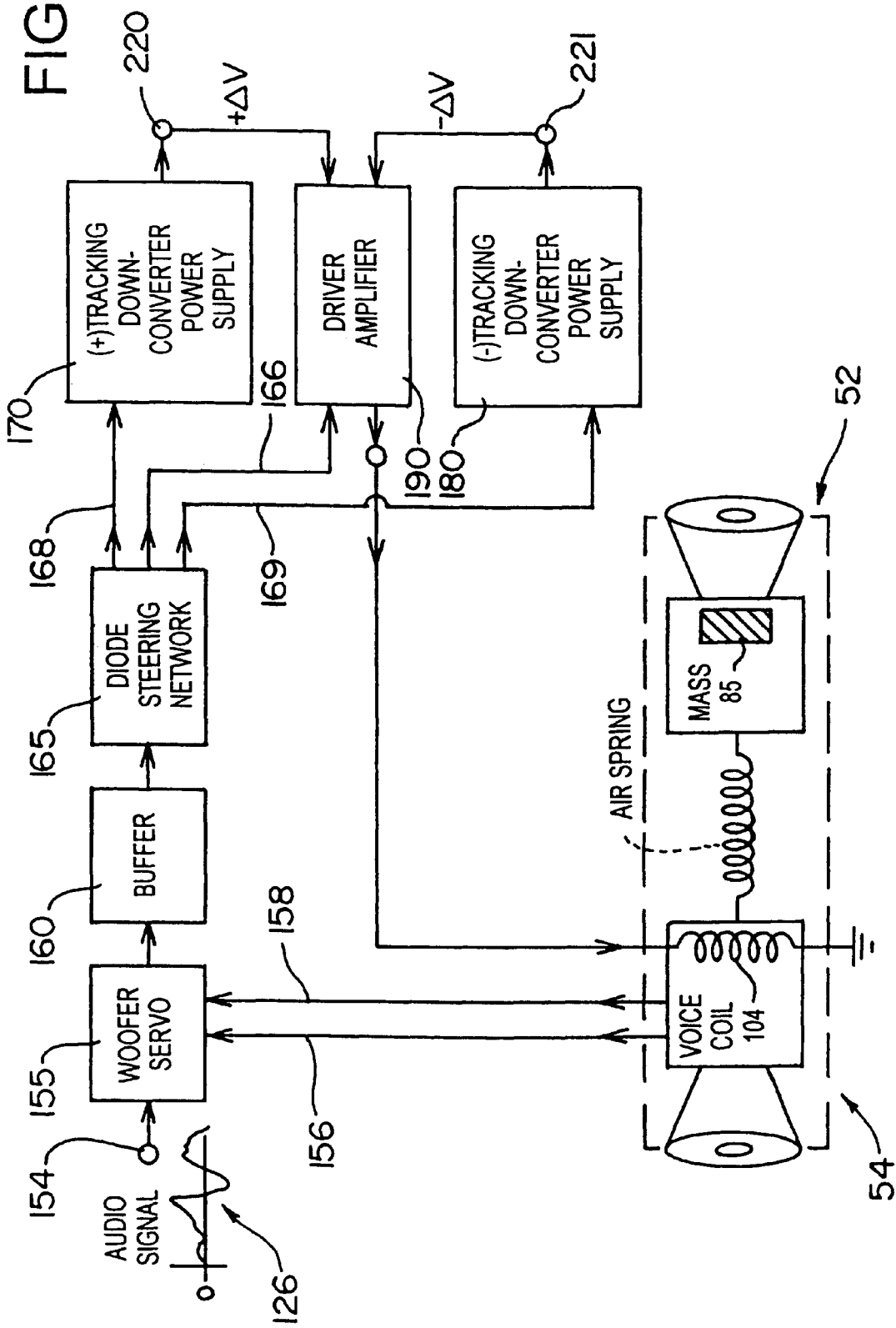
FIG. 13 is a highly simplified block-and-line diagrammatic drawing, here illustrating additional electrical architecture employed with the present invention to accept the audio output signal from the circuitry of FIG. 12B, steer the positive and negative portions of the audio signal through respective ones of the (+) and (−) Tracking Downconvertor Power Supplies, and deliver plus Δv. and minus Δv. audio signals to the Driver Amplifier of the voice coil driven woofer and thence to the voice coil for enabling PUSH/PULL drive of the voice coil driven woofer.
Figure 27:
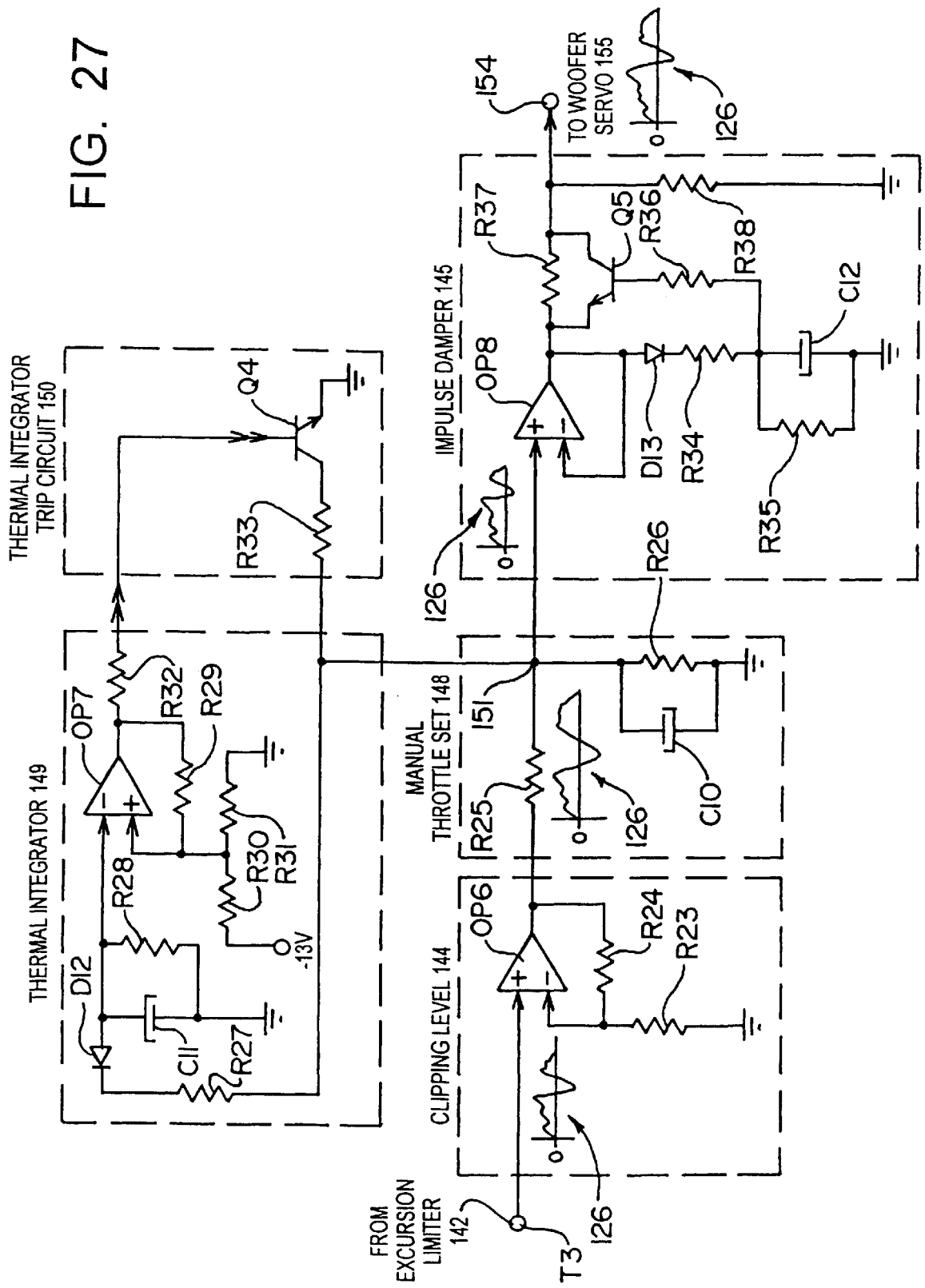
FIG. 27 is a schematic circuit drawing depicting exemplary embodiments of a Clipping Level circuit, a Manual Throttle Set circuit, a Thermal Integrator circuit, a Thermal Integrator Trip circuit, and a simplified Impulse Damper employed in the Master Protection Circuit of the present invention.
Figure 28:
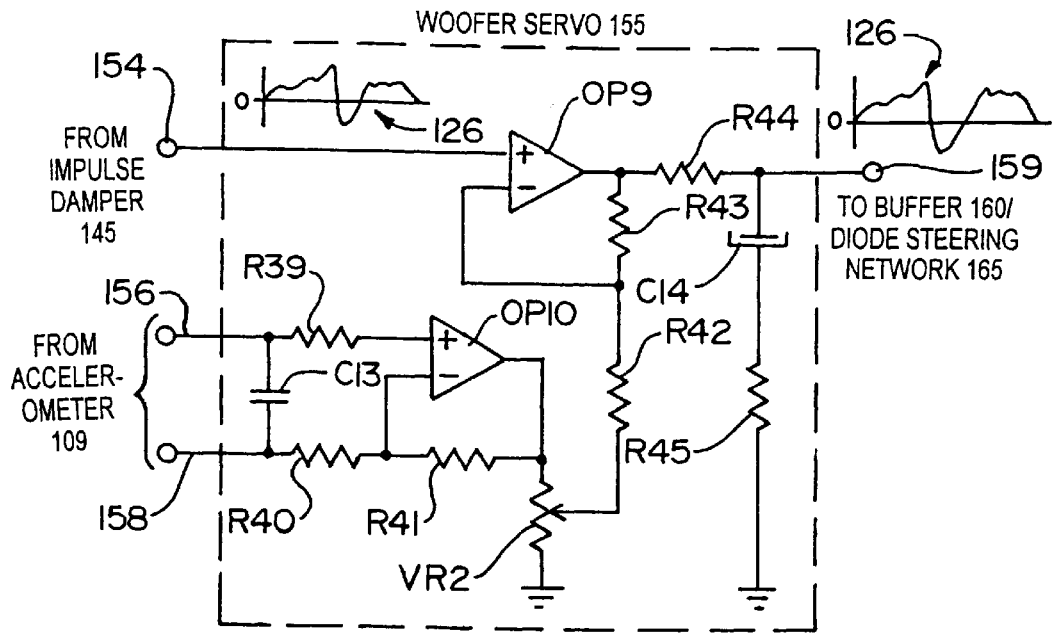
FIG. 28 is a schematic circuit drawing depicting an exemplary, generally conventional, Woofer Servo circuit for reducing distortion of the audio signal at the output of the woofer by comparing the movement of the movable driver components (which movement is typically non-linear or distorted) with the undistorted input audio signal so as to produce a distorted audio output drive signal wherein the distortion is generally equal and opposite to the sensed distortion of the movable woofer driver components and thus eliminating, to the extent possible, detectable audio distortions.

In keeping with the invention, the thus processed audio signal output from the Impulse Damper 145 (FIGS. 12B and 27) is presented at the input port 154 of a Woofer Servo 155 (FIGS. 13 and 28). The Woofer Servo 155 receives: i) the partially processed audio signal 126 output from the Impulse Damper 145; and ii), a feedback signal via leads 156, 158 from the accelerometer 109 installed in the voice coil driven woofer 54 (FIGS. 3 and 13). The accelerometer 109 is mounted on the voice coil former 102 in the driver depicted in FIG. 3; and, is used to sense the motion of the driver 54. If the driver's motion is non-linear—i.e., distorted—the signal output by the accelerometer 109 will be a replica or exact analog of that distortion. For example, if the audio signal 120a, 120b input to the Input Buffers 125 (FIGS. 12A and 24) of the subwoofer 50 is undistorted, and the voice coil driven driver 54 is moving in a distorted fashion, the output of the accelerometer 109 will also be distorted and fed back to the Woofer Servo 155 (FIGS. 13 and 28) where it is combined with the original processed input audio signal 126 output from the Impulse Damper (FIGS. 12B and 27). The original input audio signal 126 is then modified in an inverted fashion with respect to the distortion sensed; and, the result is that the voice coil driven driver 54 receives a non-linear drive signal in such a way that the driver's motion is linear and non-distorted—i.e., the inverted non-linear distorted signal impressed on the original non-distorted or linear input audio signal 126 output from the Impulse Damper 145 (FIGS. 12B and 27) serves to substantially cancel any non-linear distortions in movement of the voice coil driven woofer 54 which are sensed by the accelerometer 109 and are input to the Woofer Servo 155 via leads 156, 158. An exemplary embodiment of the Woofer Servo 155 is depicted in FIG. 28 and will be described below. Specific circuit details and component values for the Woofer Servo 155 are contained in Appendix "B".

The audio signal which is output from the Woofer Servo 155 is, as best shown in FIG. 13, input to a Buffer 160 and, from the Buffer 160, to a Diode Steering Network 165. The Diode Steering Network 165 is utilized so as to ensure that the audio signal is processed into its positive-going components and its negative-going components, with the positive-going components of the audio signal being presented to a (+) Tracking Downconvertor Power Supply 170, the negative-going audio signal components being presented to a (−) Tracking Downconvertor Power Supply 180, and the composite audio signal being presented to the Driver Amplifier 190. More specifically, those skilled in the art will appreciate that audio signals contain both positive voltage swings and negative voltage swings. Amplifiers, unless they are biased in Class A operation, cannot reproduce both the positive and negative information without crossover distortion. Various solutions to this problem have been developed, such as Class AB biasing (a high heat, relatively low efficiency, solution).

The present invention solves this problem by "steering" the positive components of the audio signal to the (+) Tracking Downconverter Power Supply 170 while the negative voltage components are steered to the (−) Tracking Downconvertor Power Supply 180. The (+) and (−) Tracking Downconvertor Power Supplies 170, 180 respectively output the (+)Δv. output signals and the (−)Δv. output signals to the Driver Amplifier 190 which also receives the composite audio signal from the Diode Steering Network 165. As a consequence of this arrangement, the Driver Amplifier 190 is enabled to deliver amplified positive voltage levels to the voice coil 104 during positive swings of the audio signal; and, thus drive the voice coil driven woofer 54 through a PUSH stroke of 1.25". Similarly, the (−)Δv. signals input to the Driver Amplifier 190 enable the latter to feed amplified negative voltage levels to the voice coil 104 during the negative-going portions of the audio signal, thus driving the voice coil driven woofer 54 through a PULL stroke of 1.25", with the total peak-to-peak PUSH/PULL stroke being 2.5".

As previously discussed, the output of the Diode Steering Network 165 (FIGS. 13 and 29) is conveyed to the (+) and (−) Tracking Downconverter Power Supplies 170, 180. In keeping with the invention, and as will be discussed below in greater detail, the (+) and (−) Tracking Downconverter Power Supplies 170, 180 are capable of supplying large amounts of current and, therefore, large amounts of power to the Driver Amplifier 190. Indeed, the (+) and (−) Tracking Downconvertor Power Supplies 170, 180, together with the Driver Amplifier 190, define a tracking downconvertor drive amplifier which, though it weighs only about 11 oz., is capable of delivering 2,700 watts rms output power into the 3.3 ohm resistive load—i.e., the impedance of the voice coil 104 (herein elsewhere referred to as a "nominal 4 ohm resistive load")—and of swinging 104 volts rms. The ability of the (+) and (−) Tracking Downconvertor Power Supplies 170, 180 and Driver Amplifier 190 to deliver large amounts of power provides many advantages. For example, it allows the cabinet 51 (FIGS. 1 and 2) to be extremely small because large amounts of power can be provided to the voice coil driven driver 54 to overcome the pressures created by small cabinet volumes. Further, because the pressures created by a small cabinet volume can be overcome, it is possible to utilize drivers 52, 54 with much longer strokes than used in the prior art. Thus, in the illustrative embodiment of the present invention, the cabinet 51 can have sides having a length of approximately 11", drivers 52, 54 having a diameter of approximately 8", and a peak-to-peak stroke of approximately 2.5". Such a driver 52, 54 could not be used by prior art subwoofers because the power necessitated by such a combination could not be provided. The details of an exemplary embodiment of the (+) and (−) Tracking Downconverter Power Supplies 170, 180 will be discussed below—first in connection with the block-and-line drawing in FIGS. 14A, 14B and subsequently in greater detail in connection with FIGS. 30 and 31A–31C; while details of the Driver Amplifier 190 will be discussed below in connection with FIGS. 13, 14A, 14B, 30 and 32.

Figure 14A:
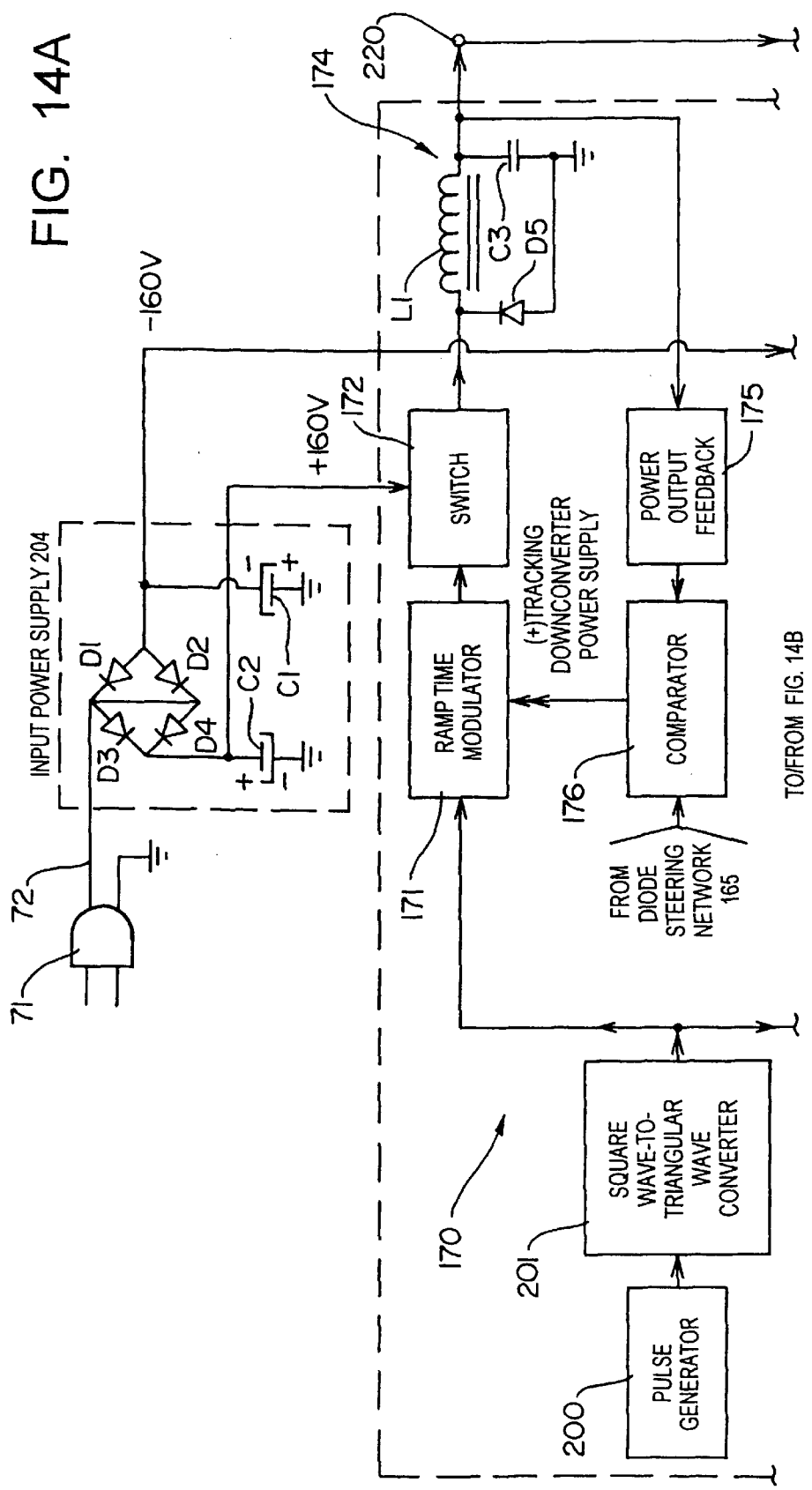
FIGS. 14A and 14B, when placed in top-to-bottom relation and viewed conjointly, comprise a block-and-line diagrammatic drawing, here depicting: i) an exemplary, but conventional, Input Power Supply circuit; and ii), exemplary (+) and (−) Tracking Downconverter Power Supplies and a Driver Amplifier which collectively define a tracking downconvertor drive amplifier capable of delivering 2,700 watts rms to a nominal 4 ohm resistive load and swinging 104 volts rms, which embody features of the present invention, and which are of the type employed in the subwoofer depicted in FIGS. 1–3.
Figure 14B:
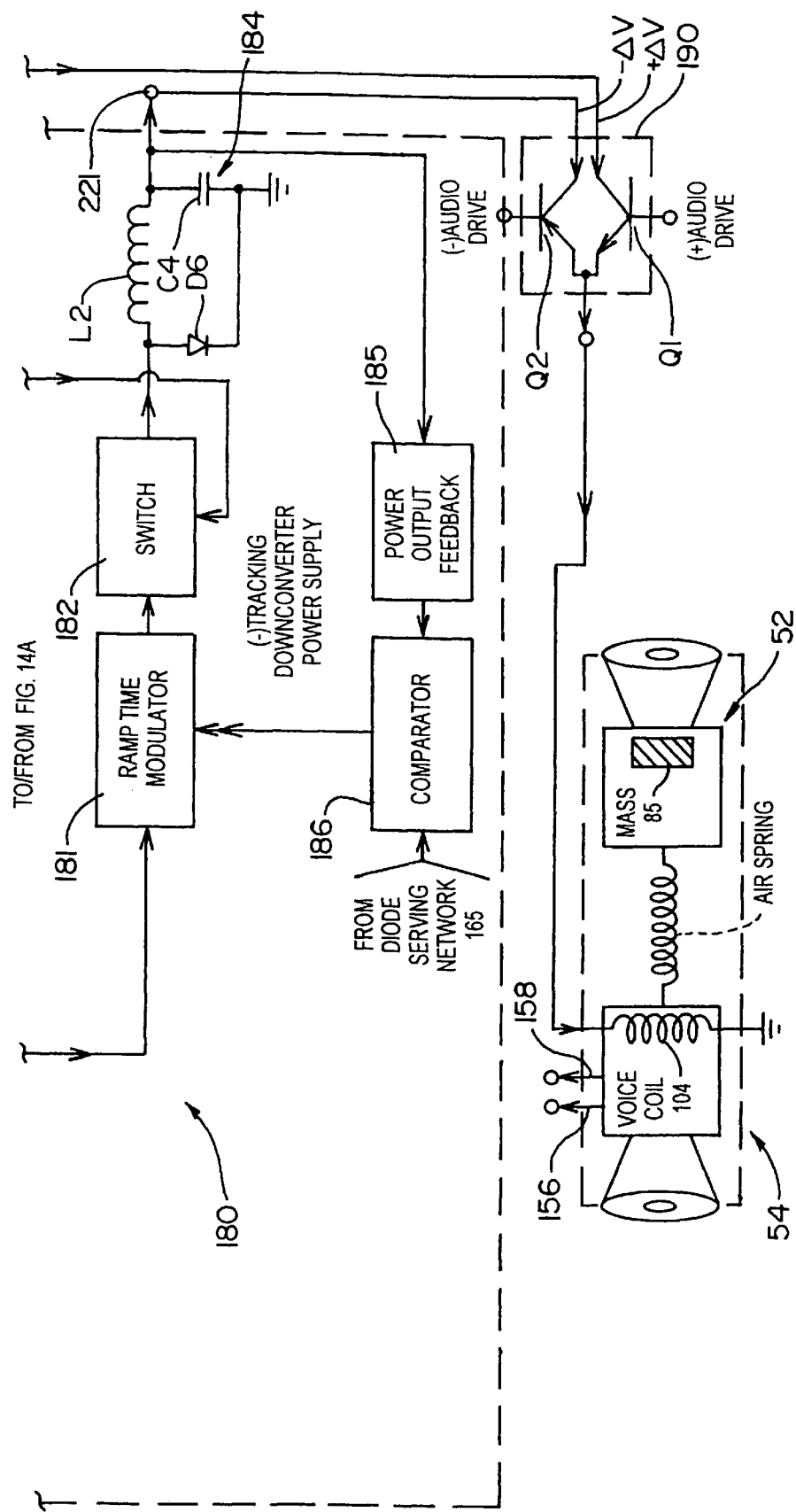

Turning now to FIGS. 14A, 14B, exemplary (+) and (−) Tracking Downconverter Power Supplies suitable for use with the present invention have been illustrated at 170, 180, respectively, in block-and-line form. A power supply somewhat similar to those utilized in the exemplary embodiment of the present invention is disclosed in U.S. Pat. No. 4,218,660, issued Aug. 19, 1980 to Robert W. Carver; and, the disclosure contained in the specification and drawings of the aforesaid U.S. Pat. No. 4,218,660 is hereby incorporated by reference. The (+) and (−) Tracking Downconvertor Power Supplies 170, 180 of the present invention regulate the amount of current delivered to the voice coil 104 of the voice coil driven subwoofer 54 (FIGS. 2, 3 and 5) by tracking the audio signal to be amplified and comparing the magnitude of that signal to the signal actually being amplified. The exemplary (+) and (−) Tracking Downconvertor Power Supplies 170, 180 include: i) a common Pulse Generator 200; and ii), a common Square Wave-To-Triangular Wave Converter 201; while each of the (+) and (−) Tracking Downconvertor Power Supplies 170, 180 includes its own: iii) Ramp Time Modulator 171, 181; iv) Switch 172, 182; v) Power Output Section, generally indicated at 174, 184, including an inductor L1, L2; vi) Power Output Feedback circuit 175, 185; and vii), Comparator 176, 186 which receives input signals from the Diode Steering Network 165 (FIGS. 13 and 29) and the Power Output Feedback circuit 175, 185 (FIGS. 14A, 14B). The Comparators 176, 186 compare the two input signals, and generate control signals which are transmitted to respective ones of the Ramp Time Modulators 171, 181.

In order to permit operation of the electronic circuits employed in the subwoofer 50 (FIG. 1) of the present invention, and as previously indicated in connection with the description of FIG. 1, power is derived from any suitable and conventional A.C. source (not shown) via an A.C. outlet plug 71 and A.C. power line 72. As best shown in FIG. 14A, A.C. power line 72 is coupled to an Input Power Supply 204 comprising a full wave voltage doubler having a first pair of diodes D1, D2 coupled in parallel and a second pair of diodes D3, D4 also coupled in parallel. The A.C. input power line 72 is coupled via diodes D1, D2 to the negative end of a capacitor C1, while also being coupled via diodes D3, D4 to the positive end of a second capacitor C2. Thus, the arrangement is such that when the incoming A.C. signal on A.C. power line 72 is positive, diodes D1 and D2 are turned OFF, while diodes D3 and D4 are turned ON. Therefore, the positive portion of the A.C. signal flows through diodes D3, D4 and charges up capacitor C2 to +160 volts. Conversely, when the A.C. signal on the A.C. power line 72 is negative, diodes D3, D4 are turned OFF while diodes D1 and D2 are turned ON, permitting the negative portion of the A.C. signal to charge up capacitor C1 to −160 volts. Discharge of capacitor C2 allows +160 volts to be delivered to Switch 172 in the (+) Tracking Downconvertor Power Supply 170 (FIG. 14A); while discharge of capacitor C1 allows −160 volts to be delivered to Switch 182 in the (−) Tracking Downconvertor Power Supply 180 (FIGS. 14A and 14B).

The power delivered to the driver of the voice coil driven woofer 54 by the inductors L1, L2 in respective ones of the Power Output Sections 174, 184 of the (+) and (−) Tracking Downconvertor Power Supplies 170, 180 is controlled by controlling the time within which the Switches 172, 182 in the respective Downconvertors 170, 180 are CLOSED for each current pulse. This is accomplished by tracking the audio signals which are to be amplified by the Driver Amplifier 190; and, comparing these tracked signals to the voltage imposed across the Driver Amplifier 190. This produces a control signal which controls the duration of each current pulse delivered to the respective inductors L1, L2. In other words, on the assumption that the Switches 172, 182 are being opened and closed at a frequency of 100 Kilohertz, the duration of each time period would be 10 microseconds. During those time periods where the power requirements of the Driver Amplifier 190 are high, then during each 10 microsecond time period, a respective one of the Switches 172, 182 will be CLOSED (dependent upon whether the polarity of the audio signal is then positive or negative) for a relatively large fraction of that time—e.g., for about 5 to about 7 microseconds. On the other hand, when power requirements of the Driver Amplifier 190 are relatively low, the respective Switches 172, 182 will be CLOSED in each time period for a much shorter duration.

Figure 15:
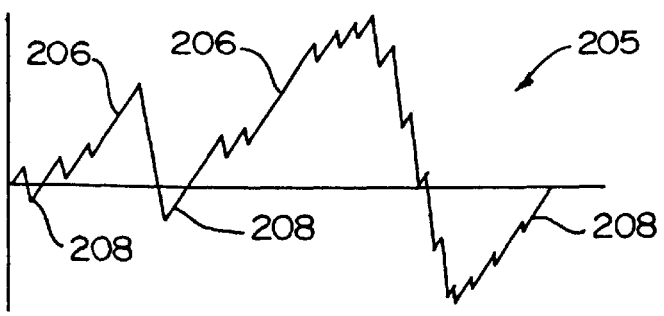
FIG. 15 is a graphic representation of a portion of a typical audio signal wherein the apparatus of the present invention is intended to amplify the low frequency components of the audio signal.
Figure 16:
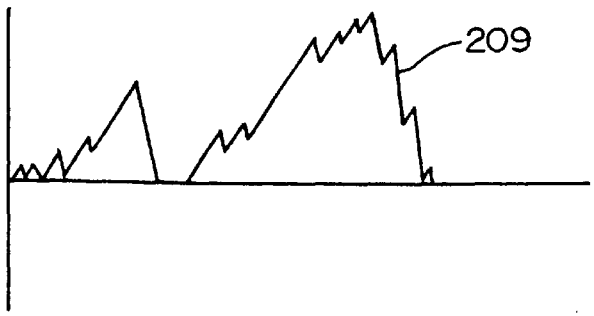
FIG. 16 is a graphic representation here depicting the audio signal as output from the (+) Diode Steering Network wherein negative portions of the audio signal have been eliminated and the signal has been stripped of high frequency components.
Figure 29:
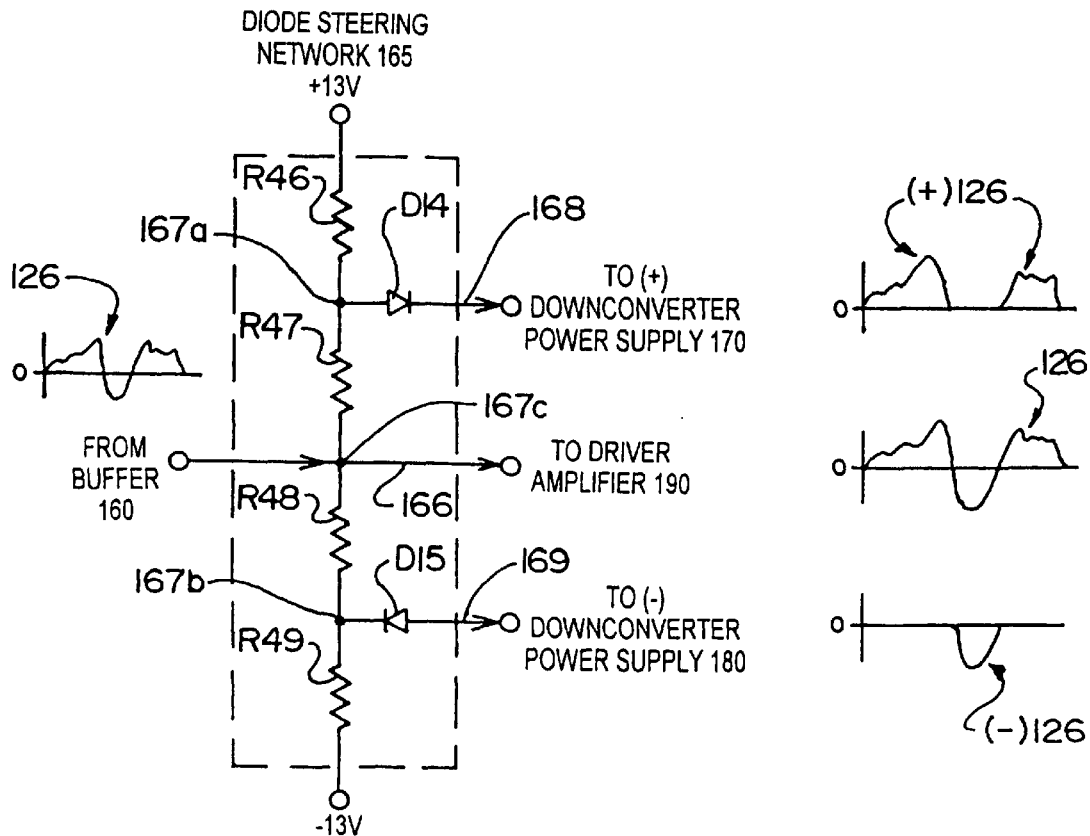
FIG. 29 is a schematic circuit drawing depicting an exemplary Diode Steering Network for outputting positive and negative audio signals to respective ones of the (+) and (−) Tracking Downconvertor Power Supplies, as well as outputting the composite audio signal to the Driver Amplifier of the present invention.

As discussed above, the audio signal containing the low frequency information which is to be reproduced by the subwoofer 50 ultimately enters the Diode Steering Network 165 (FIGS. 13 and 29). A portion of such an audio signal is graphically indicated in FIG. 15 at 205. Note that the audio signal has both positive and negative portions 206, 208, respectively, with the positive portions 206 being represented as being above the abscissa in FIG. 15 and the negative portions 208 being represented below the abscissa. The Diode Steering Network 165 produces an output where the negative portions 208 of the audio signal are steered to the (−) Tracking Downconvertor Power Supply 180, and similarly, the positive portions 206 of the audio signal are steered to the (+) Tracking Downconvertor Power Supply 170. The output of the Diode Steering Network 165 is graphically depicted at 209 in FIG. 16 for positive-going signals.

Figure 19:
FIG. 19 is a graphic representation of the control signal output from the Comparator and input to the Ramp Time Modulator in the (+) Tracking Downconvertor Power Supply shown in FIG. 14A.

The output of the Diode Steering Network 165 is then directed to the Comparator 176 in, for example, the (+) Tracking Downconvertor Power Supply 170. The Power Output Feedback circuit 175, which is responsive to the voltage impressed across the power input terminals of the Driver Amplifier 190, transmits a voltage generally proportional to the voltage at the power input terminals of the Driver Amplifier 190 as a second input to the Comparator 176. The Comparator 176 then "compares" the signal input from the Diode Steering Network 165 and the signal input from the Power Output Feedback circuit 175 to produce a control signal 214 (FIG. 19) generally proportional to the difference between the two inputs.

Figure 17:
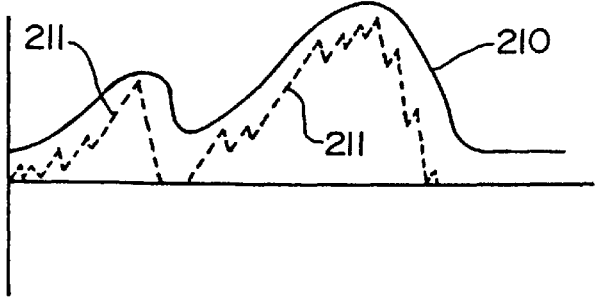
FIG. 17 is a graphic representation here depicting the audio signal shown in FIG. 16 in broken lines and the voltage signal input to the Comparator from the Diode Steering Network which is here approximately represented in solid line form.
Figure 18:
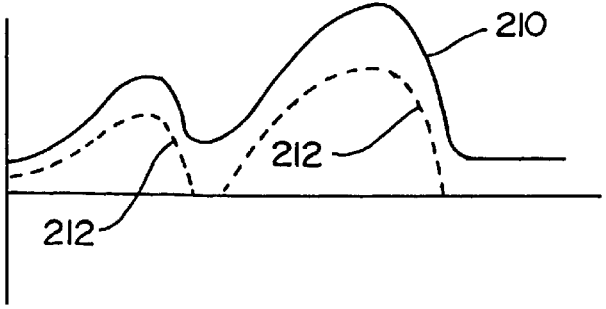
FIG. 18 is a graphic representation here illustrating the two signals input to the Comparator forming part of, for example, the (+) Tracking Downconverter Power Supply, with the voltage signal input from the Diode Steering Network being depicted in solid line form and the voltage signal input from the Power Output Feedback associated with the (+) Tracking Downconvertor Power Supply being depicted in broken lines.

Referring next to FIG. 17, it will be observed that the two input signals to the Comparator 176 have been graphically depicted at 210—i.e., a solid line representing the signal input from the Power Output Feedback circuit 175—and a broken line 211 representing the signal input from the Diode Steering Network 165. It will further be noted upon comparison of FIGS. 17 and 18 that there is a relationship between: i) the magnitude of the signal 211 from the Diode Steering Network 165; and ii), the difference between the signal 211 from the Diode Steering Network 165 and the signal 210 from the Power Output Feedback circuit 175 in that the increment of increase and the difference between the two signals 210, 211 increase generally proportionally to the magnitude of the signal 211 from the Diode Steering Network 165 as represented by the broken line 212 in FIG. 18. For purposes of illustration, this difference has been exaggerated somewhat in FIG. 18 from what the actual values may be. The control signal 214, which is the output of the Comparator 176, has been graphically illustrated in FIG. 19. It can be seen that this control signal 214 generally corresponds to the increment of increase or decrease in the difference between the two input signals illustrated in FIGS. 17 and 18. Thus, the control signal 214 is used to control the duration of the regularly timed current pulses in the inductor L1.

Figure 20:
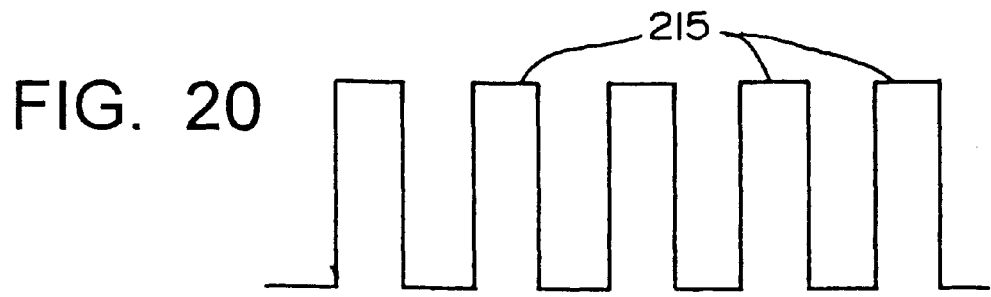
FIG. 20 is a graphic representation of the voltage pulses generated by the Pulse Generator forming part of the (+) and (−) Tracking Downconvertor Power Supplies.

In keeping with the broad objectives of the present invention, the Pulse Generator 200 associated with the (+) and (−) Tracking Downconverter Power Supplies 170, 180 illustrated in FIGS. 14A, 14B functions to generate a pulsed wave of a constant voltage as indicated at 215 in FIG. 20—i.e., a wave where the gaps between the pulses are of approximately the same duration as the pulses themselves. The pulses are, in turn, of the same frequency as the desired current pulses for the respective inductors L1, L2. In the particular embodiment described herein, where the frequency of the current pulses in the inductors is 100 Kilohertz, the output from the Pulse Generator 200 would be of the same frequency.

Figure 21:
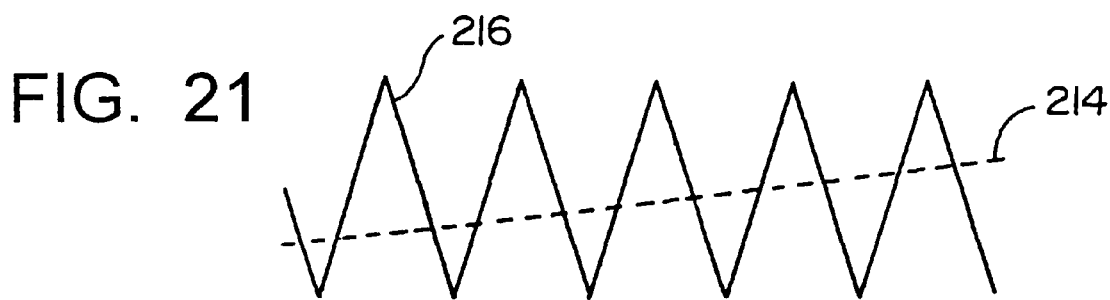
FIG. 21 is a graphic representation of the wave transmitted to the Ramp Time Modulator in the (+) Tracking Downconvertor Power Supply and the manner in which the voltage control signal from the Comparator is imposed thereon.

The output pulse wave 215 (FIG. 20) from the Pulse Generator 200 is directed to the Square Wave-To-Triangular Wave Converter 201. This serves to convert the wave form 215 of FIG. 20 to a wave form 216 such as shown in FIG. 21 where each pulse has the configuration of an isosceles triangle; and, where, during the duration of each pulse, the voltage climbs at a substantially constant rate to a peak at the middle of the pulse, and then declines at a constant rate through the latter half of the pulse.

The output wave form 216 from the Square Wave-To-Triangular Wave Converter 201 is then transmitted to the Ramp Time Modulators 171, 181 of the respective (+) and (−) Tracking Downconvertor Power Supplies 170, 180. As previously described, the Ramp Time Modulators 171, 181 also receive the control signal 214 from their respective Comparators 176, 186. This is illustrated in FIG. 21 by graphically representing a portion of the control signal 214 from the Comparators 176, 186 in broken lines superimposed over the triangular wave form 216 output from the Square Wave-To-Triangular Wave Converter 201. As shown in FIG. 21, that portion of the control signal 214 is increasing in magnitude. For purposes of illustration, the slope representing the rate of increase of the control signal 214 may be exaggerated to some extent.

Figure 22:
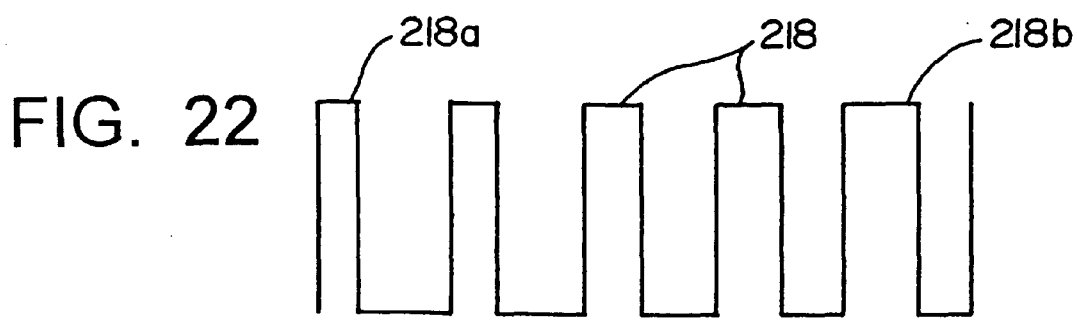
FIG. 22 is a graphic representation of the pulses output from the Ramp Time Modulator in the (+) Tracking Downconvertor Power Supply resulting from the imposed Comparator control signal as reflected in FIG. 21.

The output of the Ramp Time Modulators 171, 181 is illustrated in FIG. 22 as a constant voltage pulse signal 218 having the same frequency as that of the Pulse Generator 200. The duration of each pulse is directly proportional to the duration of the bottom portion of the triangular wave form 216 depicted in FIG. 21. Thus, it can be appreciated by comparing the duration of the pulses of FIG. 22 with the slope of the control signal 214 as indicated in the broken lines of FIG. 21, that the duration of the pulses shown in FIG. 22 are proportional to the magnitude of the control signal 214 as shown in FIG. 21.

Figure 23:
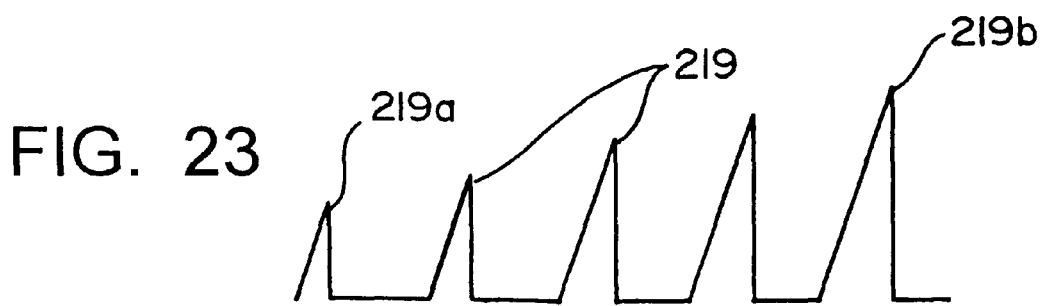
FIG. 23 is a graphic representation of an illustrative series of current pulses transmitted from the (+) Tracking Downconvertor Power Supply to the Driver Amplifier associated with the voice coil in the voice coil driven driver.

The voltage pulse signals 218 depicted in FIG. 22 are output from the Ramp Time Modulators 171, 181; and, are used to open and close respective ones of the Switches 172, 182 in such a manner that the Switches are CLOSED during the duration of each of the pulses depicted in FIG. 22. The manner in which the voltage pulses 218 from the Ramp Time Modulators 171, 181 act on respective ones of the Switches 172, 182 to cause current pulses 219 in the inductors L1, L2 is illustrated in FIG. 23. Thus, it can be seen that a voltage pulse of relatively short duration as indicated at 218a in FIG. 22 produces a corresponding current pulse 219a (FIG. 23) of relatively small amplitude, since the current has such a very short time period to build up or "ramp up". It can be seen in FIG. 23 that as the voltage pulses 218 of FIG. 22 increase in duration, the amplitude of the current pulses 219 output from the Switches 172, 182 and routed to respective ones of the inductors L1, L2 increase correspondingly. Thus, the voltage pulse 218b which has the longest duration of the voltage pulses 218 shown in FIG. 22, produces a current pulse 219b of the largest amplitude of those shown in FIG. 23.

Those skilled in the art will, of course, appreciate that the foregoing description of the operation of one of the (+) and (−) Tracking Downconvertor Power Supplies 170, 180 is equally applicable to the other.

Having the foregoing in mind, a brief overview of the operation of the (+) and (−) Tracking Downconvertor Power Supplies 170, 180 will be set forth hereinbelow in terms of the block-and-line diagrams depicted in FIGS. 13, 14A and 14B. As previously indicated, the subwoofer 50 of the present invention is provided with electrical power from any suitable A.C. source (not shown) via an A.C. outlet plug 71 (FIGS. 1 and 14A). In the United States, the A.C. source will comprise and alternating current source of 110 to 120 volts and 60 cycles per second. Other countries have somewhat different systems. However, the concepts discussed herein can be adapted by one of ordinary skill in the art to electrical systems of other countries without departing from the spirit and scope of the present invention. The current from the A.C. source is rectified by the full wave voltage doubler in the Input Power Supply 204 in the manner described above to convert the A.C. current to direct current and allow delivery of +160 volts and −160 volts to respective ones of the Switches 172, 182 in the (+) and (−) Tracking Downconvertor Power Supplies 170, 180.

Referring to FIGS. 14A, 14B it will be noted that the current pulses—e.g., pulses graphically depicted at 219 in FIG. 23—output from the Switches 172, 182 are coupled to respective ones of inductors L1, L2 and to respective ones of diodes D5, D6. Diode D5 has its positive terminal connected to ground in the (+) Tracking Downconvertor Power Supply 170, while the negative terminal of Diode D6 is connected to ground in the (−) Tracking Downconvertor Power Supply 180. The diodes D5, D6 complete the circuit path so that current may continue to flow in the inductors L1, L2 and into the load during OFF time periods of the respective Switches 172, 182.

The arrangement is such that when an audio signal is presented at the input terminals 66 and/or 68 (FIGS. 1 and 12A) of the subwoofer 50 for audible reproduction, the signal is presented to the Input Buffers 125; and, is then passed successively to and through the Ground Loop Hum Eliminator 124, Subsonic Filter 130, E.Q. Amplifier 131, Video Contour Controller 132, Phase Amplifier 134, Crossover circuit 135, Volume Control 136, Line Amplifier 138, Opto-Coupler 139 and the Master Protection Circuit 140 in the manner previously described so as to process the audio signal and extract the low frequency information that will be audibly reproduced. The Impulse Damper 145 in the Master Protection Circuit 140 then outputs the low frequency signal to the Woofer Servo 155 (FIGS. 13 and 28). The Woofer Servo 155 utilizes the feedback signal on leads 156, 158 from the accelerometer 109 (FIGS. 3 and 13) associated with the voice coil driven woofer 54 (FIG. 3) to servo the audio signal, with such feedback signal being conveyed from the voice coil driven woofer 54 to the Woofer Servo 155 as shown in FIG. 13.

Thereafter, the low frequency audio signal which has been servoed is presented to the Diode Steering Network 165 which performs several functions. For example, and as discussed above, the Diode Steering Network 165 produces a signal output wherein the negative portions of the audio signal are directed to the (−) Tracking Downconvertor Power Supply 180, and where the positive portions of the audio signal are directed to the (+) Tracking Downconvertor Power Supply 170. For an example of this, see FIGS. 15 and 16, and the above description relating thereto.

In keeping with this aspect of the present invention, the Diode Steering Network 165 ensures that the positive-going and negative-going audio signals are amplified at the proper time. Thus, when the subwoofer 50 receives an audio signal to reproduce, the Diode Steering Network 165 transmits an enabling signal to the Driver Amplifier 190 via line 166 for both positive and negative swings of the audio signal. The Diode Steering Network 165 also sends the positive-going portions and the negative-going portions of the audio signal to respective ones of the (+) and (−) Tracking Downconverter Power Supplies 170, 180 via respective ones of lines 168, 169 in the manner previously described above with reference to FIGS. 13, 14A and 14B.

Since upon initial start up there is no voltage generated at the output of the Power Output Sections 174, 184 of either the (+) or the (−) Tracking Downconvertor Power Supplies 170, 180, the feedback signal provided by the respective Power Output Feedback circuits 175, 185 are zero or substantially zero. Accordingly, at start up, the Comparators 176, 186 generate a rather strong output signal 214 (FIG. 19) which is transmitted to respective ones of the Ramp Time Modulators 171, 181 in the (+) and (−) Tracking Downconvertor Power Supplies 170, 180. The Ramp Time Modulators 171, 181, in turn, transmit current pulses 219 (FIG. 23) of the desired frequency to respective ones of the electronic Switches 172, 182, with these current pulses 219 being of a maximum duration. In other words, the Switches 172, 182 continue to turn ON and OFF at the same frequency; but, the duration of the ON periods is at a maximum. Accordingly, the current pulses 219 (FIG. 23) passing through the inductors L1, L2 ramp up to a maximum amperage; and, therefore, deliver full power to the Driver Amplifier 190. Within a very short period of time (i.e., about 200 microseconds), the current pulses 219 transmitted to the Driver Amplifier 190 build up to their proper operating level.

At this time, the Power Output Feedback circuits 175, 185 (FIG. 14) transmit to their respective Comparators 176, 186 an output signal related to the voltage level applied to the Driver Amplifier 190. Thereafter, the Comparators 176, 186 continue to provide their respective Ramp Time Modulators 171, 181 with a control signal 214 (FIG. 19) related to the power requirements of the Driver Amplifier 190 indicating that the amplitude of the audio signal is increasing; and, consequently, there is a greater disparity between this audio related signal and the signal exiting from the Power Output Feedback circuits 175, 185, causing the strength of the control signal 214 being transmitted to the Ramp Time Modulators 171, 181 to increase in magnitude. This, in turn, causes the current pulses 219 (FIG. 23) being transmitted through the respective inductors L1, L2 in the Power Output Sections 174, 184 to increase in duration so as to deliver more power to the Driver Amplifier 190; and, thus raise the average voltage supplied at the inductors' L1, L2 respective output terminals 220, 221. On the other hand, when the amplitude of the audio signal is declining, the respective Comparators 176, 186 detect that the difference in the signal between the Diode Steering Network 165 and the signals from the Power Output Feedback circuits 175, 185 are smaller. Therefore, the control signals 214 (FIG. 19) transmitted by the Comparators 175, 185 to their respective Ramp Time Modulators 171, 181 will be at a lower voltage level. This shortens the duration of the current pulses through the respective inductors L1, L2, causing less power to be delivered to the Driver Amplifier 190.

Those skilled in the art will readily appreciate from the foregoing description that the Comparators 176, 186 will, in effect, "track" the audio signal to maintain the voltage level impressed upon the output terminals 220, 221 of the Power Output Sections 174, 184 and which is being routed to the Driver Amplifier 190 so that the voltage level is varied in such a manner that it remains only moderately above the power requirements of the Driver Amplifier 190. In actual practice, there is generally a voltage drop across the output transistors Q1, Q2 of the Driver Amplifier 190 (FIG. 32) of approximately six volts (6 v.).

Contributing to the small size of the subwoofer 50 (FIG. 1) of the present invention is the fact that the (+) and (−) Tracking Downconvertor Power Supplies 170, 180 (FIGS. 13, 14A, 14B and 31A–31C) do not require massive storage capacitors as do the power supplies used in prior art subwoofers. Because the (+) and (−) Tracking Downconvertor Power Supplies 170, 180 employed with the present invention can deliver large amounts of power to the Driver Amplifier 190 so quickly, only a small amount of power need be held in reserve for sudden increases in the power demanded by the audio signal. Such sudden increases might, for example, be caused by a musical or other audio transient such as a loud drum beat or a film special effect such as an explosion.

Because the (+) and (−) Tracking Downconvertor Power Supplies 170, 180 used in the subwoofer 50 of the present invention react so quickly to transients, only relatively small storage capacitors C3, C4—viz., 6.8 microfarad capacitors rather than the 10,000 microfarad capacitors typically used in the prior art—are needed for supplying the power necessitated by a rapid increase in the power requirements of the Driver Amplifier 190. The reason for this is that the power pulses 219 (FIG. 23) through the respective inductors L1, L2 are of such high frequency, and the response time of the respective inductors L1, L2 to such increases in power pulse duration (and, thus, the corresponding increase in power supplied) so fast, that the inductors L1, L2 can respond in a matter of a fraction of a millisecond to begin delivering full power to the Driver Amplifier 190. Thus, large 10,000 microfarad storage capacitors such as typically used in the prior art for supplying power for transients are not necessary. Since smaller storage capacitors C3, C4 (FIG. 31) can be used, the cabinet 51 of the subwoofer 50 (FIG. 1) can be made significantly smaller than the cabinets of prior art subwoofers.

Another advantage provided by the subwoofer 50 of the present invention is that the tracking downconvertor drive amplifier therein is very efficient when compared to amplifiers used in prior art subwoofers. Thus, a typical prior art amplifier (not shown) used in a conventional prior art subwoofer requires the use of large heat sinks to dissipate the heat generated by the output transistors. The reason for this has to do with conventional amplifier design. More specifically, in conventional amplifiers of similar power as the invention, the rail voltages would generally be on the order of 160 volts, leading to thermal dissipation roughly an order of magnitude greater than achieved with the present invention. When the conventional amplifier is driving the load—i.e., the driver of the subwoofer—the amplifier only uses the voltage required by the driver to produce the appropriate audio volume. If that voltage is less than the voltage provided by the power supply—which it almost always will be—the remainder of that voltage must be dissipated in the output transistors. Thus, if the audio signal requires that the driver be driven with 30 volts, the remaining 130 volts multiplied by the load current must be dissipated in the form of heat by the output transistors. If a transistor is conducting ten amperes of current, the transistor is dissipating 1,300 watts of power in the form of heat. To avoid failure of the output transistors, they must be mounted on large heat sinks which aid in the heat dissipation. A further problem, however, is that most output transistors are rated at only two-hundred watts. Consequently, the output of these devices will be current limited. This will, therefore, require the use of many output transistors, each requiring a large heat sink and, therefore, the size of the subwoofer will inherently be substantially increased.

In contrast to prior art subwoofers, the outputs of the (+) and (−) Tracking Downconverter Power Supplies 170, 180 are fixed at a much lower voltage than the power supplies used in the prior art. For example, in the exemplary embodiment of the subwoofer 50 of the present invention, the output of each of the (+) and (−) Tracking Downconvertor Power Supplies 170, 180 is maintained at six volts above the voltage required by the Driver Amplifier 190. Thus, when no audio signal is being amplified, only six volts appears across the output transistors of the Driver Amplifier 190 (FIG. 32). Further, using the example from above, if the driver of the voice coil driven woofer 54 of the present invention requires 30 volts to produce the desired volume of sound, the (+) and (−) Tracking Downconvertor Power Supplies 170, 180 will output only thirty-six volts. Thus, the output transistors (FIG. 31) used in Driver Amplifier 190 of the present invention will still have to dissipate only six volts (6 v.) times the load current. Because typical output transistors can dissipate 200 watts, each of the output transistors Q1, Q2, can, theoretically, output over 20 amperes of current. In reality, typical 200 watt output transistors can output only approximately 3 amperes of current without failure under the same conditions. Thus, at a maximum, the output transistors used in the Driver Amplifier 190 (FIG. 32) will have to dissipate only approximately 80 watts of power as heat. Because of this substantially reduced power dissipation in the output transistors Q1, Q2, the subwoofer 50 of the present invention does not require large heat sinks as do prior art subwoofers. This further contributes to the reduced size of the subwoofer (FIG. 1) of the present invention.

In carrying out one of the important aspects of the present invention, provision is made for: i) isolating the left and right components of the audio signal being processed from the external environment; and ii), at the same time, summing the left and right channels of the audio input signal at different decibel ("dB") levels (rather than at the same dB levels which would effectively produce a monaural audio output where the L−R component of the audio signal is effectively cancelled and lost), thereby retaining the L−R component of the audio signal representing the stereo sound field which serves to substantially enhance the life, luster, depth and impact of the audio sound for the listener. This represents a significant advance over conventional subwoofer designs wherein the L+R and L−R components are summed to monaural with equal contributions from both the left and right channel inputs, effectively cancelling the L−R component of the signal and retaining only the L+R component which represents the monaural component of the signal as determined at points substantially equidistant from the left and right speakers.

Figure 24:
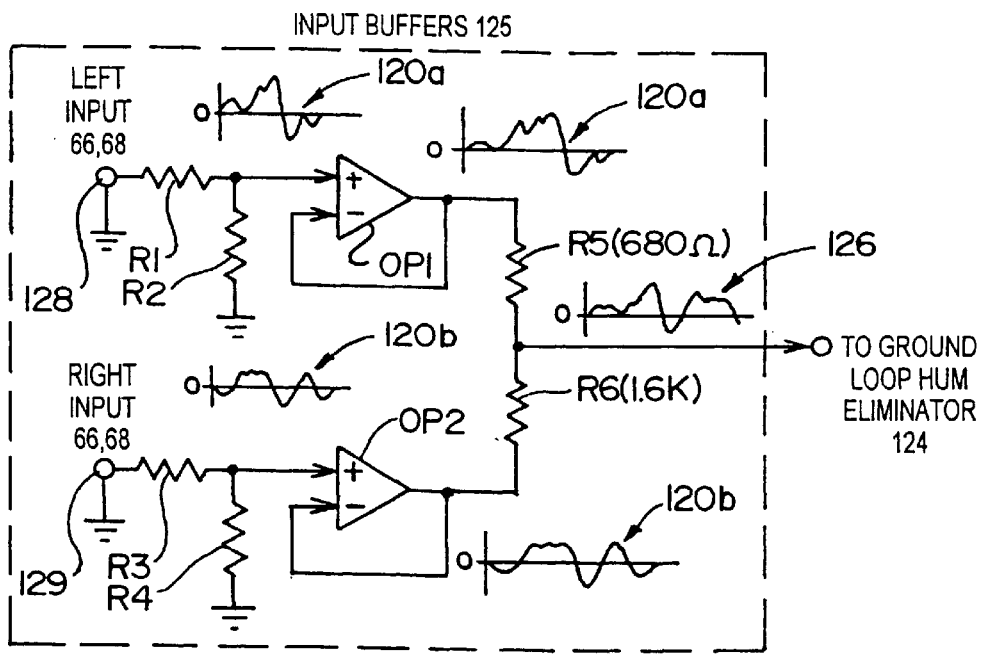
FIG. 24 is a highly simplified schematic circuit drawing depicting exemplary Input Buffers embodying features of the present invention and which are here employed for summing and processing the L+R and L−R components of the input audio signal and outputting a composite audio signal (L+R)+α(L−R)—or α(L+R)+(L−R)—which retains both the L+R and L−R components of the input audio signal.

To accomplish this, and as best illustrated by reference to FIGS. 12A and 24 conjointly (see, also, Appendix B), the left and right components 120a, 120b, respectively, of the audio signal input at the left and right input jacks 66 and/or 68 (FIGS. 1 and 12A) are applied to respective ones of the input terminals 128, 129 of the Input Buffers 125. The Input Buffers 125 include a pair of operational amplifiers OP1, OP2 wherein the left audio signal component 120a is applied to the positive input port of operational amplifier OP1, while the right audio signal component 120b is simultaneously applied to the positive port of the operational amplifier OP2. Operational amplifiers OP1, OP2 are simply unitary gain amplifiers termed "buffers". Resistors R1, R2 comprise isolation resistors which serve to protect operational amplifier OP1, while resistors R3, R4 comprise isolation resistors protecting operational amplifier OP2. The left audio signal 120a output from operational amplifier OP1 and the right audio signal 120b output from operational amplifier OP2 are then summed together by resistors R5, R6 to produce a single composite audio signal 126 which is defined as:

$$(L+R)+\alpha((L-R)) \quad [5]$$

where α is a constant representative of the difference in resistance values for resistor R5 (680 ohms) and R6 (1,600 ohms). Because of this arrangement, the composite audio signal 126 output from the Input Buffers 125 retains the stereo sound field represented by the L−R components of the audio signal—thereby substantially enhancing the solidity and realism of the audio sound produced by the subwoofer 50.

Of course, those skilled in the art will appreciate that the values of resistors R5 (680 ohms) and R6 (1.6 K) can be reversed—i.e., resistor R5 can be a 1.6 K resistor while resistor R6 can be a 680 ohm resistor—without departing from the spirit and scope of the invention as expressed in the appended claims, in which case, the single composite audio signal 126 will be defined as:

$$\alpha(L+R)+(L-R) \quad [6]$$

In either case, or, for that matter, in cases where the values of the two resistors R5, R6 are other than 680 ohms and/or 1,600 ohms, provided only that they are significantly different, the left and right channels of the audio input signal will be summed at different dB levels, thereby producing the desired results—viz., outputting a composite audio signal 126 that retains both the (L+R) and (L−R) components of the audio input signal.

The composite audio signal 126—viz., either the signal (L+R)+α(L−R) or the signal α(L+R)+(L−R)—produced in accordance with one of the important features of the present invention is then fed through a Ground Loop Hum Eliminator 124 (FIGS. 12A and 33) embodying one of the important features of the present invention and, therefore successively through a series of signal processing and/or control circuits which are entirely conventional and need not be described in detail beyond the block diagrammatic description contained in FIGS. 12A and 12B. Those interested in more specific details of such conventional circuit blocks are referred to Appendix B. Suffice it to say for purposes of the present description that the composite audio signal 126 output from the Input Buffers 125 and the Ground Loop Hum Eliminator 124 is successively conveyed through the following conventional circuits depicted in block form in FIGS. 12A and 12B:

1) A Subsonic Filter 130 which serves to strip the composite audio signal 126 of unwanted, very low frequency, inaudible signals that would, in any event, simply waste power.

2) An E.Q. Amplifier 131 which provides a slight equalization curve to ensure that the acoustic output is flat down to 20 Hz, a necessary feature because the intrinsic frequency response of the subwoofer 50 and its cabinet 51, taken together, deviates from ideal flatness.

3) A Video Contour circuit 132 having back panel adjustability via toggle switch 65 (FIGS. 1 and 12B) between video contour and flat operation.

4) A Phase Amplifier 134 again having back panel adjustability via knob 64 (FIGS. 1 and 12B) which allows the relative phase of the composite audio signal 126 to be varied from 0° to −180°, thus allowing the user to blend the subwoofer 50 with the user's main loudspeakers which typically replicate only the upper bass frequencies, mid-range frequencies, and treble frequencies while the subwoofer 50 produces a very low frequency output audio signal. By adjusting the Phase Amplifier 134, relatively seamless acoustic response can be obtained in the overlap region where the subwoofer 50 acoustic output mixes with the acoustic output of the main speakers.

5) A Crossover Frequency circuit 135 having back panel adjustability via knob 62 (FIGS. 1 and 12B) allowing the user to adjust the point at which the subwoofer 50 begins to play, enabling the subwoofer 50 to reproduce frequencies as high as 75 Hz or frequencies at 35 Hz and below with the 55 Hz mid-point being normal. The setting of the Crossover Frequency control circuit 135 depends on the frequency range of the main channel speakers that the subwoofer 50 is to be used with.

6) A volume control 136 defined by variable resistor VR1 having back panel adjustability via knob 61 (FIGS. 1 and 12B) enabling the user to adjust the volume of the audio signal output from the subwoofer 50.

7) A Line Amplifier 138 which serves to amplify the composite audio signal 126.

8) An Opto-Coupler 139 which optically couples the composite audio signal 126 to the downstream signal processing stages. Optical coupling is highly desirable because it helps to eliminate "ground loops" and attendant hum—i.e., extraneous noise—caused by "ground loops".

9) An Overshoot Control circuit 141 which serves to clamp any transient signals that occur to a factory predetermined maximum level.

10) A Clipping Eliminator circuit 146 which serves to limit the drive signal to an absolute maximum level.

The Clipping Eliminator circuit 146 and Overshoot Control circuit 141 comprise the upstream circuits included within the Master Protection Circuit 140 (FIGS. 12A and 12B) to be described in greater detail below. The Clipping Eliminator circuit 146 and Overshoot Control circuit 141 each receive the composite audio input signal 126 from the Opto-Coupler 139, with the Clipping Eliminator 146 providing an output control signal that is input to the Overshoot Control circuit 131 and serves to control that circuit.

Figure 25:
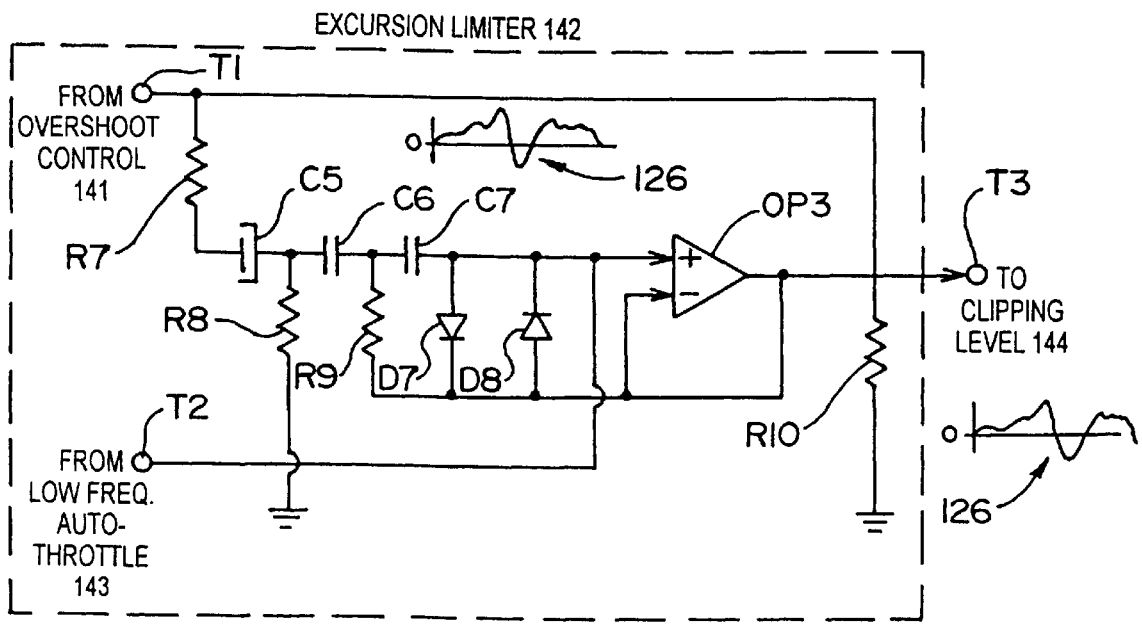
FIG. 25 is a simplified schematic circuit drawing depicting an exemplary Excursion Limiter employed with the present invention.
Figure 26:
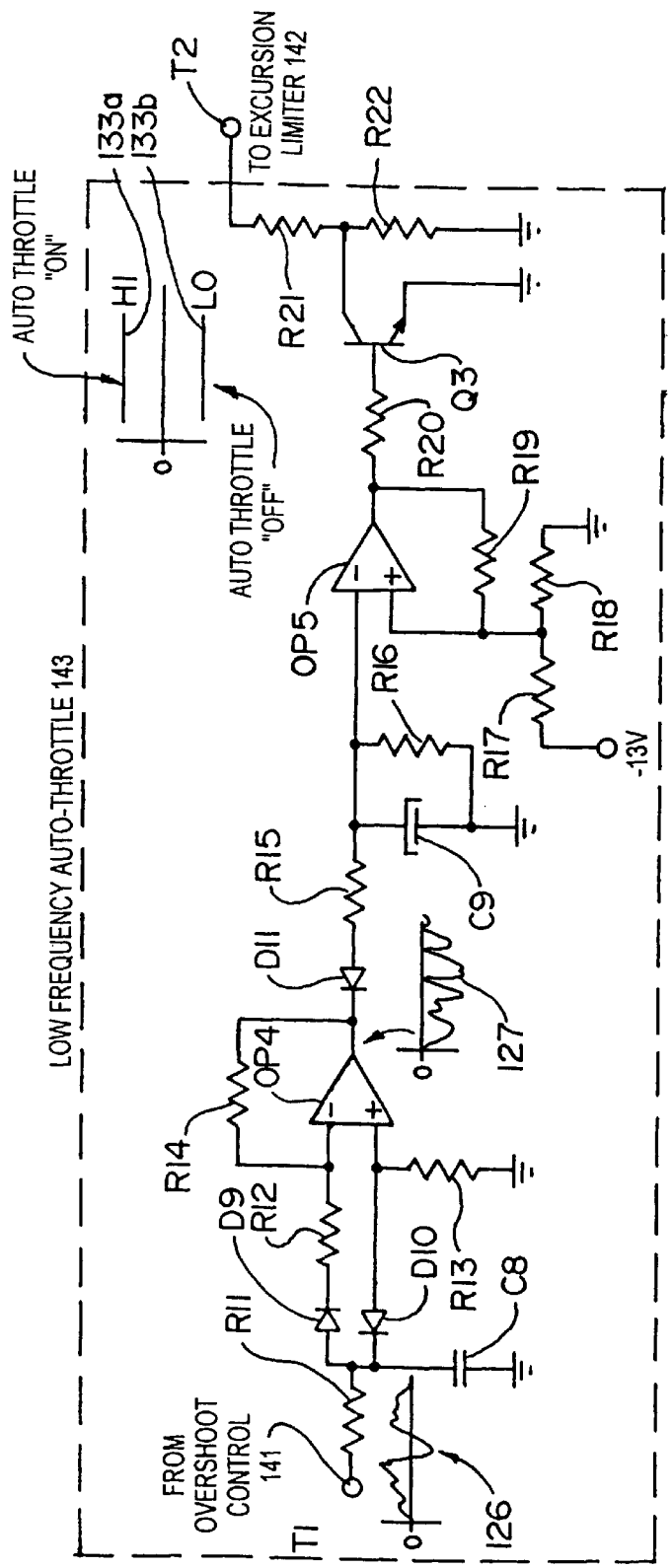
FIG. 26 is a schematic circuit drawing depicting an exemplary Low Frequency Auto-Throttle circuit employed with the present invention.

In order to prevent the subwoofer 50 from being overdriven at frequencies below 25 Hz, the composite audio signal output from the Overshoot Control circuit 141 is input, in parallel, to: i) an Excursion Limiter circuit 142 (FIG. 25); and ii), a Low Frequency Auto Throttle circuit 143 (FIG. 26). The Excursion Limiter circuit 142 serves to limit those very low frequencies that might damage or overload the subwoofer 50 in the manner described below; while the Low Frequency Auto Throttle circuit 143 comprises the sensing and control circuits which are employed to activate or control the normally inactive Excursion Limiter circuit 142, again in a manner to be described below.

In carrying out this objective of the invention, and as best observed by reference to FIG. 25, it will be noted that the Excursion Limiter circuit 142 essentially comprises a high pass filter which has, nominally, a corner frequency of 18 Hz—i.e., the low limit response of the subwoofer 50. That is, in normal operation, the Excursion Limiter circuit 142 serves to attenuate signals below 18 Hz, preventing them from passing through the signal processing circuitry while, at the same time, allowing all signals above 18 Hz to pass through undiminished. However, under certain circumstances, it is desirable to prevent full amplitude signals below 25 Hz from passing through the signal processing system—viz., when the subwoofer 50 is driven to its maximum allowable mechanical limits, yet normal output is desired.

To accomplish this, the composite audio signal 126 output from the Overshoot Control circuit 141 is applied simultaneously to both the Excursion Limiter circuit 142 (FIG. 25) and the Low Frequency Auto Throttle circuit 143 (FIG. 26). As will be noted upon reference to FIGS. 12B, 25 and 26 conjointly, the composite audio signal 126 output from the Overshoot Control circuit 141 is applied to input terminal T1 for both The Excursion Limiter circuit 142 (FIG. 25) and the Low Frequency Auto Throttle circuit 143 (FIG. 26). Within the Excursion Limiter circuit 142 (FIG. 25), the composite audio signal 126 is fed via resistor R7 and capacitors C5, C6 and C7 to the positive input port of an operational amplifier OP3. Resistors R7, R8 and R9, together with capacitors C5, C6 and C7, constitute a frequency determining network that combines with operational amplifier OP3 to form the high pass filtering function. Diodes D7, D8 are provided to prevent the operational amplifier OP3 from exceeding its common mode range, thus causing distortion. The thus filtered composite audio signal 126 output from the operational amplifier OP3 is output at terminal T3 to a Clipping Level circuit 144 described below in connection with FIG. 26; and, additionally, is fed back to the negative input port of operational amplifier OP3.

Under those conditions where the woofer 50 is being driven to its maximum allowable mechanical limits and, nonetheless, more output is required, the Low Frequency Auto Throttle control line which is coupled to input terminal T2 of the Excursion Limiter 142 (FIG. 25) is pulled downwardly towards ground by the action of the Low Frequency Auto Throttle control circuit 143 (FIG. 26), thus inserting an additional resistor in parallel with resistor R10 (FIG. 25) in the Excursion Limiter circuit 142, changing the value of resistor R10 and, therefore, changing the corner frequency from 18 Hz to 25 Hz. This serves to attenuate frequencies below 25 Hz and reduces the audio response by 4 dB compared to the level before the effective resistance of resistor R10 (FIG. 25) was reduced. To accomplish this, the composite audio signal at input terminal T1 is simultaneously applied to both the Excursion Limiter circuit 142 (FIG. 25) and to the Low Frequency Auto Throttle circuit 143 (FIG. 26). In the Low Frequency Auto Throttle circuit 143 (FIG. 26), the composite audio signal 126 is fed to diodes D9, D10 via resistor R11 and capacitor C8 which together form an RC time constant and attenuate the high frequency components of the audio signal so that: i) low frequency components of the audio signal 126 arrive at diodes D9, D10 at full amplitude; while ii), high frequency components of the audio signal 126 are reduced in amplitude. The positive portions of the audio signal 126 are passed through diode D9 to the negative port of an operational amplifier OP4, while the negative portions of the audio signal are passed through diode D10 to the positive port of the operational amplifier OP4. Resistors R12 and R14 (R14 forms a feedback network around operational amplifier OP4), control the gain of the amplifier OP4, while resistor R13 comprises a ground return resistor for diode D10. The ground return resistor for diode D9 is resistor R12 since the negative input port of the operational amplifier OP4 is, essentially, a virtual ground.

The output of operational amplifier OP4 comprises a negative-going signal 127 which is passed through diode D11 to charge up capacitor C9. Resistor R15 comprises a current limiting resistor which serves to protect operational amplifier OP5. Resistor R16 is provided to form a discharge path for the voltage on capacitor C9 resulting from the negative output signal 127 from operational amplifier OP4. The magnitude of the negative voltage on capacitor C9 is dependent on the amplitude of the audio input signal 126 as rectified by diodes D9, D10; and, consequently, as the negative voltage level on capacitor C9 becomes larger—i.e., more negative—than a predetermined threshold established by resistors R17, R18, operational amplifier OP5 flips HIGH, passing a positive voltage level through a current limiting resistor R20 and turning transistor Q3 ON. When transistor Q3 is turned ON, resistor R21 is pulled to ground, effectively placing resistor R22 (FIG. 26) in parallel with resistor R10 (FIG. 25). Resistor R19 comprises a hysteresis resistor which serves to prevent instability of operational amplifier OP5 when the latter is operating very close to its threshold level. In short, the signal at the output of transistor Q3 is either HIGH (positive) as indicated at 128 or LOW (negative) as indicated at 129; and, the position at which it transitions is determined by resistors R17, R18. When the signal 129 output from transistor Q3 is LOW (negative), the Low Frequency Auto Throttle circuit 143 is turned OFF; and, when the signal 128 output from transistor Q3 is HIGH (positive), the Low Frequency Auto Throttle circuit 143 is turned ON, momentarily throttling the low frequencies in the audio signal 126 being passed through the Excursion Limiter circuit 142 (FIG. 25) by impressing the HIGH signal level 128 on the audio signal 126 being fed to the positive input port of operational amplifier OP3 (FIG. 25) via terminal T2—the output terminal from the Low Frequency Auto Throttle circuit 143 of FIG. 26 and one of the two (2) input terminals for the Excursion Limiter circuit 142 of FIG. 25.

Thus, those skilled in the art will appreciate that when the Low Frequency Auto Throttle circuit 143 determines that dangerously low frequencies are overstressing the subwoofer 50, the Low Frequency Auto Throttle circuit 143 is turned ON, throttling the undesirable low frequency signals. When the dangerously low frequency signals disappear, the Low Frequency Auto Throttle circuit 143 trips back to its OFF state.

In carrying out the present invention, the composite audio signal 126 output from the Excursion Limiter 142 (FIG. 25) on terminal T3 is input to the positive input port of an operational amplifier OP6 in the Clipping Level circuit 144 as best shown in FIG. 27. The Clipping Level circuit 144 serves to clip off the peak portions of the composite audio signal 126 when the signal is too large. Such clipping occurs only during the short time period necessary for the Excursion Limiter 142 to clamp the signal and reduce the gain, at which point the composite audio signal 126 no longer requires clipping. This requires only a very short time period; and, consequently, when the Clipping Level circuit 144 is functioning to clip the extremely high peaks in the composite audio signal 126, clipping occurs quickly enough that it is not audible to the ear. Resistors R23, R24 serve to set the gain of operational amplifier OP6.

The composite audio signal 126 output from the operational amplifier OP6 in the Clipping Level circuit 144 is next conveyed to a Manual Throttle Set circuit 148 (FIG. 27) which functions to set the value or magnitude of the audio signal. To accomplish this, the Manual Throttle Set circuit 144 includes resistors R25, R26 which form a voltage divider that is factory preset to provide a predetermined output voltage level at the junction 151 of the voltage divider R25, R26. To ensure that the Manual Throttle Set circuit 148 is frequency dependent, a capacitor C10 is provided in parallel with resistor R26.

In order to protect the subwoofer 50 when it gets too hot, the voltage level at the junction 151 of the Manual Throttle Set circuit 148 is coupled to a Thermal Integrator circuit 149 where it is attenuated slightly by resistor R27, rectified by diode D12 to form a negative voltage that is proportional to the average voltage value at junction 151, and input to the negative input port of an operational amplifier OP7. Resistors R27, R28 and capacitor C11, together with diode D12, form an averaging circuit which produces an input signal to the negative input port of operational amplifier OP7 that is, on average, roughly proportional to the temperature of the voice coil 104 (FIGS. 3 and 4) since resistor R28 and capacitor C11 define an electrical time constant that is roughly equivalent to the thermal time constant of the mass of the woofer 54 and its voice coil 104. Resistor R29 sets the hysteresis level for operational amplifier OP7. Consequently, when the woofer 54 begins to overheat, the magnitude of the voltage level on capacitor C11 becomes too large, exceeding the threshold of operational amplifier OP7 set by resistors R30, R31. This causes an output signal from the operational amplifier OP7 in the Thermal Integrator 149 which is HIGH, indicating that the subwoofer 54 is too hot. The HIGH signal level output from operational amplifier OP7 is fed via resistor R32, a buffer resistor for transistor Q4, to the base of transistor Q4, turning the transistor ON.

When transistor Q4 is turned ON, it inserts resistor R33 in parallel with resistor R26 in the Manual Throttle Set circuit 148, reducing the output voltage at the junction 151 by 3 dB. Consequently, the drive signal to the subwoofer 54 is, in terms of power, reduced to half of its former value, allowing the subwoofer 54 to begin to cool down. When the subwoofer 54 has cooled sufficiently, the operational amplifier OP7 in the Thermal Integrator 139 flips from HIGH to LOW as the capacitor C11 is being discharged.

The composite audio signal 126 impressed on junction 151 is then fed to the input of an Impulse Damper circuit 145 whose function and operation is described in detail below. However, before discussing the Impulse Damper circuit 135 in detail, it may be helpful to an understanding of this facet of the present invention to briefly describe the operation and relationship of the mass driven driver 52 (FIGS. 2 and 5)—i.e., the "passive radiator"—and the voice coil driven driver 54. In the case of the voice coil driven driver 54, it will be understood from the foregoing description, particularly in the light of the ensuing description relating to FIGS. 28 through 32, that the movable drive components of the voice coil driven driver 54—viz., the voice coil former 102, voice coil 104, speaker cone 100, dust cover 105, decorative cover 106, surround 78' and spider 108, all of which are resiliently supported from the basket-like frame or cage of the subwoofer 54—are reciprocated axially through a peak-to-peak stroke of 2.5" by alternately delivering (+)Δv and (−)Δv signals to the voice coil 104 from the Driver Amplifier 190. The mass driven subwoofer 52, or "passive radiator", on the other hand, moves outwardly and inwardly through a PUSH/PULL peak-to-peak stroke of 2.5" in reaction to movement of the voice coil driven woofer 54 and consequent changes in air pressure within the cabinet 51 (FIGS. 1 and 2).

"Passive radiators" are well known to persons skilled in the art; and, it will be understood that the mass driven subwoofer 52 or "passive radiator" employed with the present invention does not, of and by itself, constitute an inventive feature of the invention. Nevertheless, its structure and operation do contribute to the lightness in weight of the subwoofer 50 of the present invention and to the ability of the subwoofer to function at high efficiency in a very small cabinet 51. More specifically, and as is well known to persons skilled in the art, assume that operation of the subwoofer 50 is initiated when the movable components of both the mass driven subwoofer 52 and the voice coil driven subwoofer 54 are initially at rest, and in the null or neutral position shown in solid lines in FIG. 5. Assume further that the Driver Amplifier 190 (FIG. 3) initially delivers a (+)Δv voltage signal to the voice coil 104 in the voice coil driven subwoofer 54.

Under these assumed operating conditions, it will be understood that the movable components of the voice coil driven subwoofer 54 will begin to move outwardly in a PUSH stroke of 1.25" from the null or neutral position. As the voice coil driven subwoofer's movable components begin to move outwardly, the air contained within the sealed cabinet 51 (FIG. 2) begins to rarefy, causing the mass 85 forming part of the mass driven subwoofer 52 to start moving inwardly in a PULL stroke of 1.25". Of course, it will be understood that movement of the mass driven woofer 52 lags behind movement of the positively driven voice coil driven woofer 54. When the driver amplifier 190 then delivers a (−)Δv signal 104 to the voice coil driven subwoofer 54, the latter begins to move inwardly in a PULL stroke towards and through the null or neutral position and through a peak-to-peak stroke of 2.5" from the dotted line position shown in FIG. 5 towards the dashed line position, thus beginning to compress the air within the sealed cabinet 51. As the voice coil driven subwoofer 54 begins to initiate its inward or PULL stroke, the mass driven subwoofer 52 is still completing its inward or PULL stroke where its movement is governed by the following:

$$F = Ma = (Mdv/dt) \qquad [7]$$

where "M" equals the mass of the subwoofer's movable components, "a" equals acceleration, "dv" equals incremental changes in velocity, and "dt" equals incremental changes in time.

Movement of the voice coil driven subwoofer 54 is, of course, governed by the following:

$$F = il \times \vec{B} = Bli \qquad [8]$$

where "i" equals the current in to voice coil 104, "l" equals the length of the voice coil 104, and "$\vec{B}$" equals the magnetic field.

During approximately the first half cycle of operation, the movable components of the voice coil driven subwoofer 54 and the mass driven subwoofer 52—i.e., the "passive radiator"—are out of synchronism with movement of the mass driven subwoofer 52 lagging behind that of the voice coil driven subwoofer 54. However, following the initial approximate half cycle of operation, the mass driven subwoofer 52 catches up with the voice coil driven subwoofer 54 and the movable components of the two subwoofers 52, 54 begin to move in synchronism with both moving outwardly simultaneously in a PUSH stroke of 1.25" and both moving inwardly simultaneously in a PULL stroke of 1.25"—i.e., a peak-to-peak stroke of 2.5".

During the initial approximate half cycle of operation when the mass driven subwoofer 52 is still moving inwardly while the voice coil driven subwoofer 54 is moving outwardly, air pressure within the cabinet 51 is insufficient to prevent the voice coil driven subwoofer 54 from being overdriven; and, during this brief period of time, the voice coil driven subwoofer 54 can be damaged unless steps are taken to control the motion of the movable components in the voice coil driven subwoofer 54.

To resolve this problem, the composite audio signal 126 output from junction 151 in the Manual Throttle Set circuit 148 (FIG. 27) is routed to the positive input port of an operational amplifier OP8 forming part of an Impulse Damper circuit 145. Assuming an initial start-up condition of silence—i.e., the movable components of both the mass driven subwoofer 52 and the voice coil driven subwoofer 54 are at rest and in the null or neutral solid line position shown in FIG. 5—then the transistor Q5 in the Impulse Damper circuit 145 is turned OFF. When transistor Q5 is OFF, the resistors R37, R38 form a voltage divider which reduces the level of the composite audio signal 126 output on terminal 154 to the Woofer Servo 155 (FIG. 28). Assuming, however, that a sudden and explosive transient audio signal is presented to the positive input port of the operational amplifier OP8 in the Impulse Damper circuit 145—for example, a loud drum beat—the signal output from the operational amplifier OP8 is rectified by a diode D13 and passed through resistor R34 to charge up capacitor C12 (resistor R34 and capacitor C12 form a time delay circuit). When capacitor C12 is fully charged up, transistor Q5 is turned ON, the full gain of the system is realized, and the composite audio output signal 126 at terminal T4 is maximized. Capacitor C12 is discharged by resistor R35; and, consequently, when the explosive transient signal goes away, the Impulse Damper circuit 145 automatically resets itself to a low gain state with transistor Q5 OFF until the next explosive transient occurs. Those skilled in the art will appreciate that the Impulse Damper circuit 145 is a proportional circuit—i.e., one in which the gain change is roughly proportional to voice coil velocity. In the exemplary circuit here shown in FIG. 27, resistor R36 is the drive resistor for transistor Q5.

In order to ensure that the audio sounds emanating from the subwoofer 50 of the present invention are as free of distortion as possible, provision is made for sensing whether the moving components of the voice coil driven subwoofer 54 are moving in a linear non-distorted fashion or are moving in a non-linear distorted fashion; and, wherein distorted non-linear motions are sensed and generate a signal which is proportional, but inverted, with respect to the sensed non-linear distorted motion of the subwoofer and are impressed on the undistorted composite audio signal 126 being processed. To accomplish this, the composite audio signal 126 output on terminal 154 of the Impulse Damper (FIG. 27) forms one input to a Woofer Servo circuit 155 (FIGS. 13 and 28) which is generally conventional in both circuit architecture and function. The sensed input to the Woofer Servo 155 comprises a signal generated by accelerometer 109 (FIG. 3) which is fixed to the voice coil former 102 forming part of the voice coil driven subwoofer 54. As is conventional with accelerometers 109 of the type here depicted at 109 in FIG. 3, it senses whether the movement of the movable components of the voice coil driven subwoofer 54 are or are not non-linear. The accelerometer 109 serves to output a signal on lines 156, 158 which is proportional to the acceleration of the moving components of the voice coil driven subwoofer 54. Acceleration of the subwoofer 54 is, in turn, proportional to the amplitude of the motion; and, consequently, when the amplitude of the motion of the subwoofer 54 is non-linear, the output of the accelerometer 109 is also non-linear. The Woofer Servo 155 serves to compare the output signal from the accelerometer 109 with the non-distorted composite audio input signal 126.

To accomplish this, the sensed output signal from the accelerometer 109—which is a replica of the motion of the voice coil 104 and other moving components of the voice coil driven subwoofer 54—is fed to an operational amplifier OP10 (FIG. 28) in the Woofer Servo circuit 155. The input impedance to operational amplifier OP10 is established by resistors R39, R40 and capacitor C13, while resistor R41 sets the gain of the operational amplifier OP10. A variable resistor VR2 is provided so as to enable the operational amplifier OP10 to be adjusted to each individual driver during installation and thus ensure that proper circuit loop gain is provided.

The output signal from operational amplifier OP10—which is a replica of the undistorted composite audio signal 126 being input to the positive input port of operational amplifier OP9, but which has any sensed distorted components on it amplified by operational amplifier OP10, is fed, out-of-phase with the undistorted composite audio signal 126, to the negative input port of operational amplifier OP9. Thus, operational amplifier OP9 algebraically sums the undistorted composite audio signal 126 presented at its positive input port and the distorted signal output from the accelerometer 109 and presented at its negative input port. This serves to ensure that the composite audio signal 126 output from the operational amplifier OP9 on terminal 159 is a distorted audio drive signal; but, the distortion is substantially equal and opposite to the distortion resulting from the sensed non-linear movement of the subwoofer 54. As a consequence, the distorted composite audio drive signal 126 output from the operational amplifier OP9 on terminal 159 serves to substantially cancel, to the extent possible, the distortions sensed by the accelerometer 109. Resistors R42, R43 serve to set the gain of operational amplifier OP9. Resistors R44, R45 and capacitor C14 form the compensation poles and zeros to compensate the feedback system as is conventional with Woofer Servo circuitry such as depicted at 155 in FIG. 28.

The distorted composite audio drive signal 126 output from the Woofer Servo 155 on terminal 159 is then passed through the Buffer 160 (FIG. 13) to the Diode Steering Network 165 (FIGS. 13 and 29) which serves to: i) pass the distorted composite audio drive signal 126, unaltered and undisturbed, directly to the Driver Amplifier 190 (FIGS. 13, 29 and 30) for a purpose to be described in greater detail below; and ii), to split the distorted composite audio drive signal 126 into its positive portions (+)126 and its negative portions (−)126. To this end, the Diode Steering Network 165 includes resistors R46, R47, R48, R49 and a pair of diodes D14, D15. Resistors R46, R47 serve to bias diode D14 on the diode threshold—viz., 0.6 v—while resistors R48, R49 similarly bias diode D15. Stated differently, resistors R46 through R49 are selected such that a 0.6 v positive voltage level appears at the junction 167a between resistors R46, R47; and, a 0.6 v negative voltage level appears at the junction 167b between resistors R48, R49. This arrangement serves to ensure that all of the audio information in the positive portions (+)126 of the composite audio signal 126 is passed through diode D14 on line 168, while all of the audio information in the negative portions (−)126 of the composite audio signal 126 is passed through diode D15 on line 169.

In order to better understand the operation of the Diode Steering Network 165 depicted in FIG. 29, attention is now directed to FIG. 30. Thus, it will be observed that the distorted composite audio drive signal 126 output from the Woofer Servo 155 and buffer 160 is input to the midpoint 167c of the resistor pairs R46, R47 and R48, R49. Both the positive and negative portions of the distorted composite audio drive signal 126 are fed via line 166 to the Driver Amplifier 190. Resistors R46, R47 serve to ensure that only the positive portions (+)126 of the composite audio drive signal 126 are passed through diode D14 via line 168 to the (+) Tracking Downconvertor Power Supply 170, while resistors R48, R49 serve to ensure that only the negative portions (−)126 of the composite audio drive signal are passed through diode D15 via line 169 to the (−) Tracking Downconvertor Power Supply 180. In keeping with the present invention, the (+) and (−) Tracking Downconvertor Power Supplies 170, 180 respectively serve to generate and output (+)Δv and (−)Δv output signals in a manner described in further detail below in connection with FIG. 31; and, such (+)Δv and (−)Δv output signals are input to the Driver Amplifier 190.

In order to simplify an understanding of the ensuing description of the circuit architecture and operation of the (+) and (−) Tracking Downconvertor Power Supplies 170, 180, attention is directed to FIGS. 31A–31C—but, especially, FIG. 31B—where the circuitry for the (+) Tracking Downconvertor Power Supply 170 has been shown in detail and will be described hereinbelow. The (−) Tracking Downconvertor Power Supply 180 has been illustrated in FIG. 31C simply in block-and-line form; and its operation will not be described in detail. However, those skilled in the art will appreciate that the operation of the (−) Tracking Downconvertor Power Supply 180 is identical to that of the (+) Tracking Downconvertor Power Supply 170 except for the fact that the (−) Tracking Downconvertor Power Supply 180 serves to operate on the negative portions (−)126 of the composite audio signal 126 as output from the Steering Diode Network 165 and as shown in FIG. 30 to produce (−)Δv output signals, while the (+) Tracking Downconvertor Power Supply 170 operates on the positive portions (+)126 of the composite audio signal 126 to produce (+)Δv output signals.

Figure 31A:
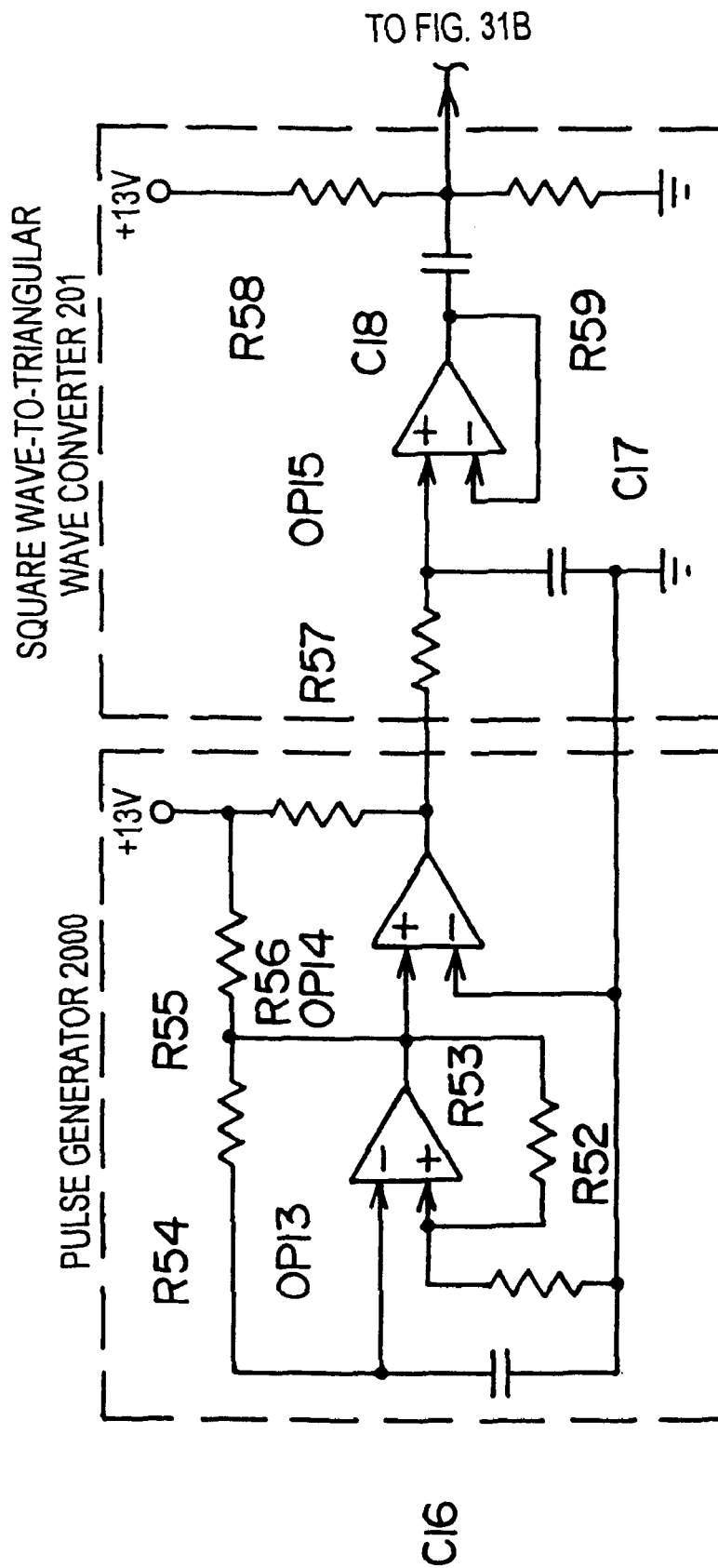
FIGS. 31A, 31B and 31C, when
Figure 31B:
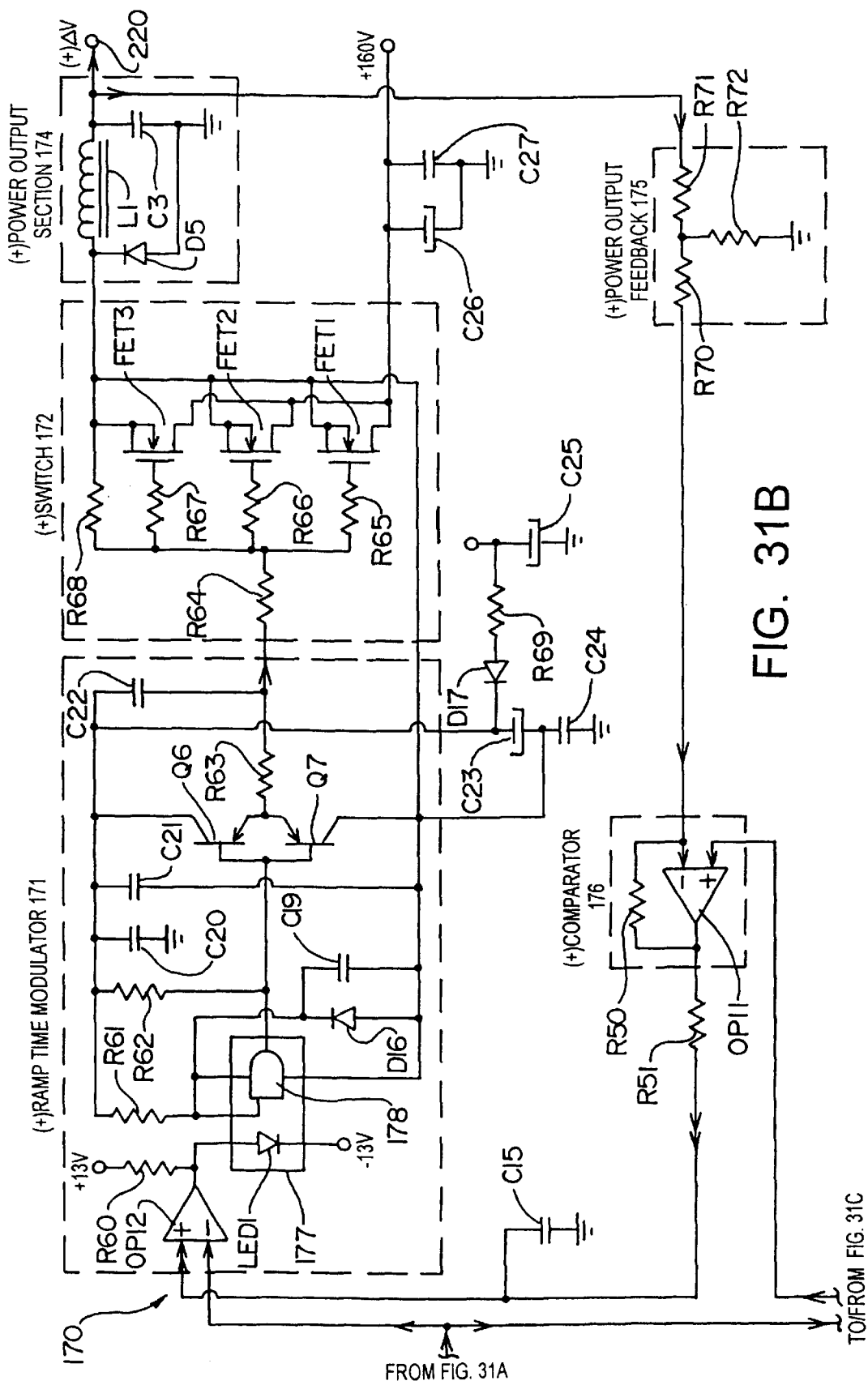
Figure 31C:
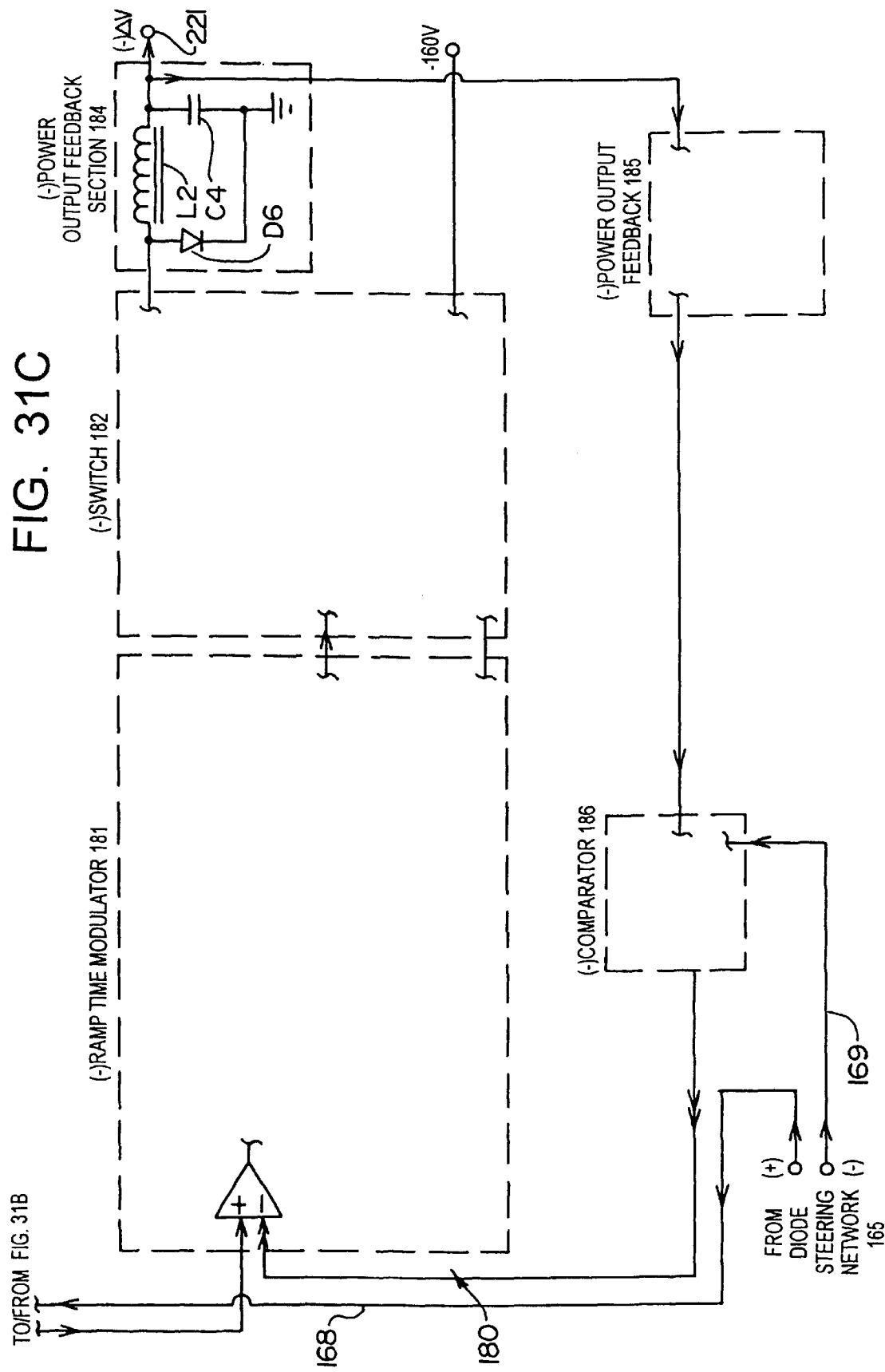

Referring now to FIGS. 31B and 31C, it will be observed that the positive portions (+)126 of the distorted composite audio drive signal 126 output on line 168 from the Steering Diode Network 165 (FIG. 30) are input to the positive input port of an operational amplifier OP11 forming a (+) Comparator 176 in the (+) Tracking Downconvertor Power Supply 170. At the same time, the negative portions (−)126 of the distorted composite audio drive signal 126 output on line 169 of the Steering Diode Network 165 are input to the (−) Comparator 186 (FIG. 31C). The audio output from operational amplifier OP11 is routed to the positive input port of an operational amplifier OP12 in a (+) Ramp Time Modulator 171 via resistor R51 which functions in conjunction with capacitor C15 to form a high frequency filter network to prevent radio frequency interference (RFI) from affecting the operation of the circuit. The output of operational amplifier OP12 comprises a series of pulses whose duty cycle is proportional to the amplitude of the positive portions (+)126 of the distorted composite audio drive input signal 126. Thus, when the amplitude of the positive portions (+)126 of the audio signal 126 are large, the duty cycle is high; and, when the amplitude of the positive portions (+)126 of the audio signal 126 is low, the duty cycle is small. The output from the operational amplifier 0P12 is routed to a light emitting diode LED1 which couples across a space to an opto-coupler 177, thus causing a similar series of pulses to appear at the output of the opto-coupler 177.

As best shown in FIG. 31A, and in keeping with the present invention, the (+) and (−) Tracking Downconvertor Power Supplies 170, 180 (FIG. 31C) each include a common Pulse Generator 200 and a common Square Wave-To-Triangular Wave Convertor 201. Pulse generator 200 includes resistors R52, R53, R54, R55 and R56, a pair of operational amplifiers OP13, OP14, and a timing capacitor C16 as the circuitry employed to generate pulses. The value of capacitor C16 determines the speed at which pulses are generated —in this exemplary case, 130 Khz. The output of the Pulse Generator comprises a series of steady state rectangular pulses 215 (FIG. 20) which are delivered to the (+) input port of operational amplifier OP15 forming part of the Square Wave-To-Triangular Wave Convertor 201. Resistor R57 and capacitor C17, together with operational amplifier OP15, serve to convert the steady state rectangular pulses 215 (FIG. 20) to triangular pulses 216 (FIG. 21). Capacitor C18 couples the triangular pulses 215 (FIG. 20) to the negative input port of operational amplifier OP12 in the Ramp Time Modulator 171, while resistors R58, R59 provide a positive-going voltage which forces the Ramp Time Modulator 171 to continue supplying pulses even in the absence of an audio signal 126 so that the (+)$\Delta$v and (−)$\Delta$v signals output from the (+) and (−) Tracking Downconvertor Power Supplies 170, 180 (FIGS. 31B, 31C) never go to zero, but, rather, only to ±6 volts with the (+)$\Delta$v and (−)$\Delta$v signals ranging from ±6 volts to ±140 volts.

In the Ramp Time Modulator 171, resistor R60 comprises a pull-up resistor enabling power to flow into the light emitting diode LED1, while resistor R61 is a pull-up resistor enabling power to flow into the opto-coupler 177. Capacitors C19, C20 and C22, together with diode D16, are power suppression filter components for the opto-coupler 177. A pull-up resistor R62 is provided to enable power to flow into the bases of the transistors Q6, Q7 to turn the transistors ON. Resistor R63 and capacitor C22 comprise transistor components at the output of the driver circuitry consisting of transistors Q6, Q7 which serve to slightly slow down the drive pulses so as to avoid generating radio frequency interference (RFI). Capacitors C23, C24 are RFI suppression components.

The signal output from the Ramp Time Modulator 171 is input to the (+) Switch 172 via resistors R64, R65, R66, R67 which all comprise suppression components. Resistor R68 comprises a safety resistor to ensure that there is always a ground return path for the high impedance field effect transistors FET1, FET2, FET3. A boot strap power supply is provided by capacitor C25, resistor R69 and diode D17 when the field effect transistors FET1, FET2, FET3 are OFF. At this time, the voltage at the output of the field effect transistors FET1, FET2, FET3 is LOW; and, when this occurs, the negative end of capacitor C23 is locked to ground through diode D5 which is forward conducting during that period of time, permitting current to flow from the 13 volt supply through capacitor C25, resistor R69 and diode D17 so as to charge up capacitor C23—i.e., the charge on capacitor C25 is transferred to capacitor C23 through resistor R69 and diode D17. When capacitor C23 is fully charged and fixed HIGH, the power supply for the circuit is from capacitor C23 rather than capacitor C25, enabling current flow from capacitor C23 to run the circuitry for the Ramp Time Modulator 171. The outputs from the field effect transistors FET1, FET2, FET3 are filtered by inductor L1 and capacitor C3. The purpose of diode D5 is to supply continuous conduction when the field effect transistors FET1, FET2, FET3 are OFF. Capacitor C26, C27 comprise RF suppression components with capacitor C26 and C27 being in parallel with the +160 volt main power supply, again serving to prevent RFI.

In operation, the (+)$\Delta$v output signal from the Power Output Section 174 of the (+) Tracking Downconvertor Power Supply 170—i.e., inductor L1, capacitor C3 and diode D5—are routed to: i) the Driver Amplifier 190 via output terminal 220; and ii), the (+) Power Output Feedback Section 175 which provides an input to the negative port of the (+) Comparator 176 therein. Since the audio signal input to the positive input port of the (+) Comparator has a peak voltage of only 13 volts, while the (+)$\Delta$v voltage levels peak at 153 volts, the (+) Power Output Feedback Section 184 includes resistors R70, R71, R72 which comprise a voltage divider to drop the peak 153 volt (+)$\Delta$v signal to in the range of about a 13 volt peak signal so that when the input signals are added together in the (+) Comparator 176, they are compatible in amplitude, value and size.

Turning now to FIG. 32 depicting the schematic circuitry for an exemplary Driver Amplifier 190 embodying features of the present invention, it will be noted that the distorted composite audio drive signal 126 output from the Diode Steering Network 165 (FIGS. 29, 30) on line 166, is routed as an enabling signal to input terminal 191 of the Driver Amplifier 190 and impressed upon the base of transistor Q8 through resistor R73, an RFI suppression resistor. Transistors Q8 and Q9 form a differential pair having a plus input port (the base of transistor Q8) and a minus input port (the base of transistor Q9) wherein the plus input port Q8 receives the audio input signal 126 and the minus input port Q9 receives a feedback signal. The output of transistor Q8 drives transistor Q10. The output of transistor Q10 then drives transistors Q11, Q12 which, in turn, drive the output transistors Q1, Q2 (FIGS. 14A, 14B and 32). Resistor R75 serves to supply current to transistors Q8, Q9, while resistor R74 is a load collection resistor for transistor Q8. Resistor R77 is an emitter resistor for transistor Q10. Resistor R78 and diodes D18, D19, D20 serve to supply current to transistors Q10, Q11, Q12. The diodes D18, D19, D20 form a barrier voltage (0.6 volts×3) of about 1.8 volts to bias up transistors Q11 and Q12, thereby eliminating crossover distortion. Output transistors Q1, Q2 are power transistors which receive their power in the form of (+)$\Delta$v and (−)$\Delta$v signals from respective ones of the (+) and (−) Tracking Downconvertor Power Supplies 170, 180; and, the output of transistors Q1, Q2 provide input signals to: i) drive the voice coil driven subwoofer 54 by alternately supplying (+)$\Delta$v and (−)$\Delta$v signals to the voice coil 104; and ii), the feedback network for transistor Q9 comprising resistors R79, R76. Capacitor C28, which is zero, compensates for the feedback loop.

In accordance with another of the important aspects of the present invention, and as best seen by reference to FIG. 33, provision is made for completely eliminating the undesired "ground loops" and the voltage generated across the broken grounds, thereby completely eliminating the problem of "ground loop" induced 60 Hz hum in a subwoofer. To accomplish this, the composite audio signal 126 output from the Input Buffers 125 (FIGS. 12A and 24) is routed to the negative input port of an operational amplifier OP16 in the Ground Loop Hum Eliminator 124 via input terminal 230 and resistor R80; and, at the same time, the composite audio signal is also routed from input terminal 230 directly to the positive input port of a second operational amplifier OP17. Operational amplifier OP16 comprises an inverting amplifier which drives opto-coupler 231; while operational amplifier OP17 is a unitary gain buffer that drives a second opto-coupler 232. A first pair of resistors R80, R81 serve to set the gain of operational amplifier OP16; a second pair of resistors R82, R83 set the gain of opto-coupler 231; and, a third pair of resistors R84, R85 set the gain of opto-coupler 232.

As a consequence, the composite audio signal 126 input to operational amplifier OP16 is inverted at the output 234 of operational amplifier OP16, appearing as an inverted audio signal (126), and is then fed to a light emitting diode LED2 in the opto-coupler 231, generating light which is detected by a light sensitive transistor 213 in the opto-coupler 231. The output signal generated by transistor Q13 is then fed to the negative input port of a second inverting operational amplifier OP18. A capacitor C29 serves to couple the A.C. components of the inverted audio signal (126) at the junction 235 between the transistor Q13 and the resistor R83 to operational amplifier OP18 which serves to again invert the previously inverted composite audio signal (126), producing a non-inverted composite audio signal 126 at its output 236. Resistor R86 sets the gain of operational amplifier OP18.

At the same time, the original non-inverted composite audio signal 126 input to the Ground Loop Hum Eliminator 124 at terminal 230 is routed to the positive input port of operational amplifier OP17 which comprises a unitary gain buffer, reproducing the composite audio signal 126 in non-inverted form at its output 238. That audio signal 126 is then routed to light emitting diode LED3 in opto-coupler 232, generating a light signal conveyed to a light sensitive transistor Q14. The output of Q14 is conveyed to the positive input port of operational amplifier OP19, a unity gain buffer, through capacitor C30 which serves to couple the A.C. components of the signal 126 at the junction 239 between the transistor Q14 and resistor R85 to the operational amplifier OP19. The non-inverted composite audio signal 126 at the output 240 of operational amplifier OP19 is then combined with the non-inverted composite audio signal 126 at the output 236 of operational amplifier OP18 by resistors R87, R88, with the audio signal appearing at the junction 241 of resistors R87, R88 being routed to the output terminal 242 of the Ground Loop Hum Eliminator 124 as a non-inverted composite audio signal 126 to be then fed to the Subsonic Filter 130 as shown at FIG. 12A.

In the event that an undesired, unwanted "ground loop" induced 60 Hz hum voltage or signal 243 should appear across the input grounds 244 and output grounds 245, the opto-couplers 231, 232 will route the hum signal 243 to respective ones of the operational amplifier OP18, an inverting amplifier, and OP19, a unitary gain amplifier. Since the non-inverted hum signals 243 at the inputs to the two operational amplifiers OP18, OP19 are in phase, the inverted hum signal (243) at the output 236 of inverting operational amplifier OP18 will be out of phase—i.e., inverted—with respect to the hum signal 243 at the output 240 of operational amplifier OP19. Consequently, when the inverted hum signal (243) at the output 236 of operational amplifier OP18 is combined with the non-inverted hum signal 243 at the output 240 of operational amplifier OP19 by resistors R87, R88, the two hum signals (243), 243 cancel to zero.

Thus it will be seen that the input grounds 244 and output grounds 245 are separated or isolated by the opto-couplers 231, 232, thereby "breaking" the grounds and preventing closed "ground loops". Any hum voltage 243 generated across the broken grounds 244, 245, will be cancelled due to the phase inversion action of operational amplifier OP18 and summing resistors R87, R88. Finally, the composite audio signal 126 is not cancelled because the audio signal 126 is inverted (out of phase) by operational amplifier OP16, and then inverted a second time—i.e., reinverted—by operational amplifier OP18, so that the composite audio signal 126 at the output 236 of operational amplifier OP18 is in phase with the composite audio signal 126 at the output 240 of operational amplifier OP19; and, when these two in phase composite audio signals 126 are combined by resistors R87, R88, a composite audio signal 126 devoid of 60 Hz hum induced by "ground loops" is produced at the junction 241 of resistors R87, R88 and is output to the Subsonic Filter 130 (FIG. 12A) via output terminal 242.

Figure 34B:
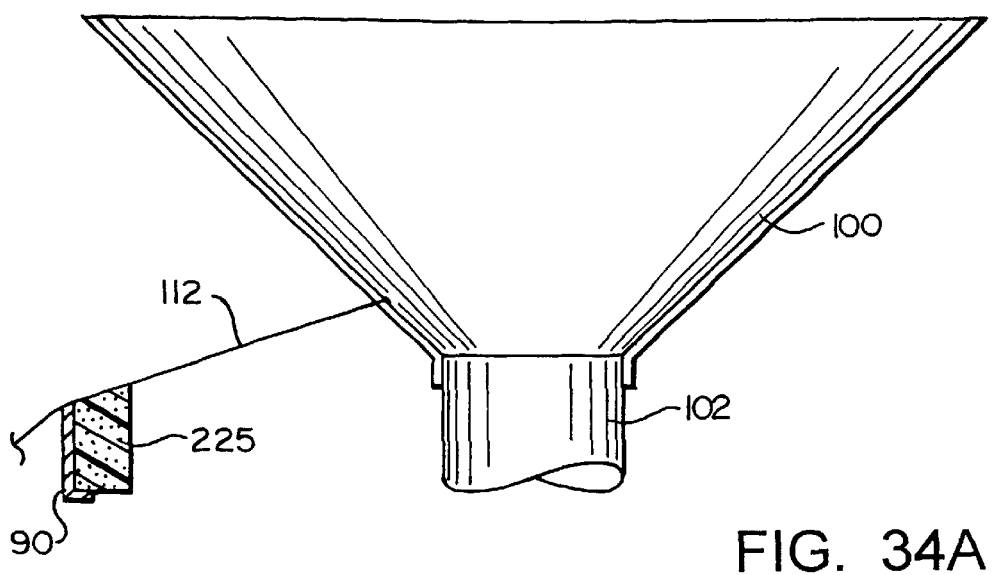
Figure 34A:
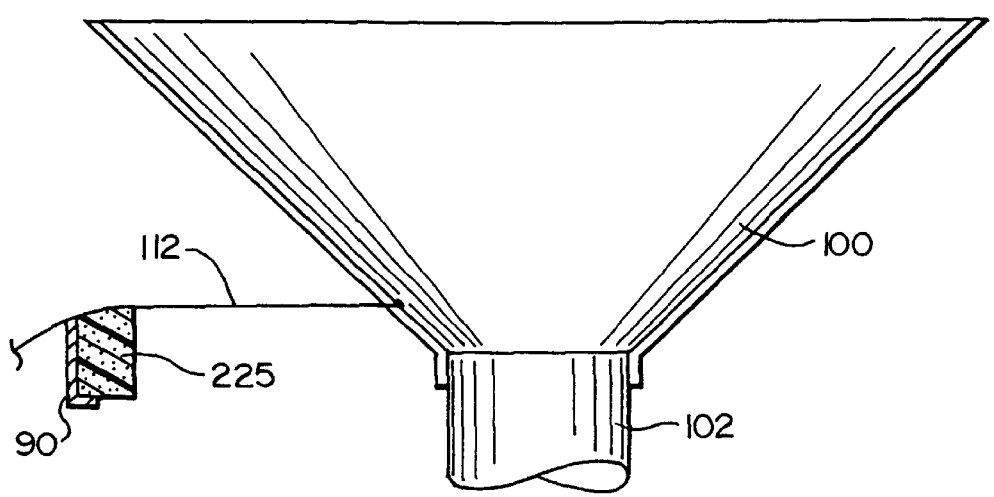
Figure 34C:
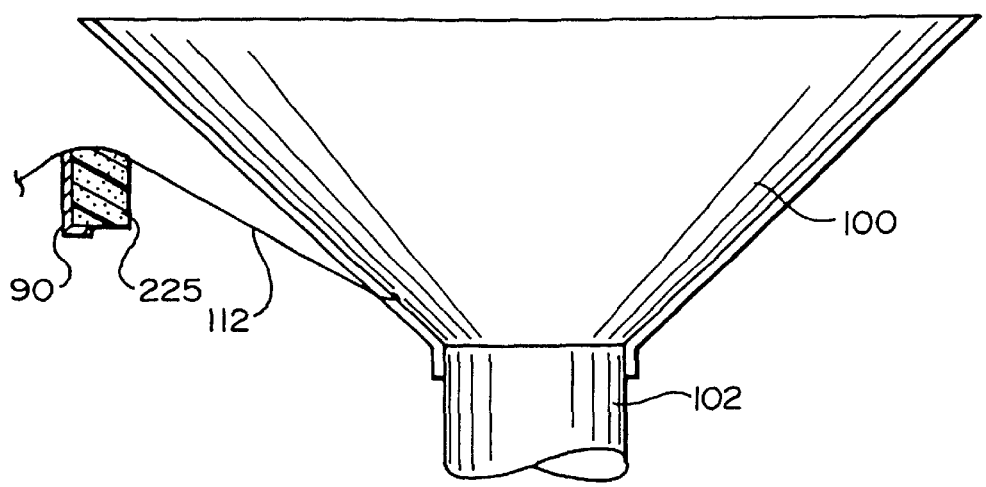

In accordance with another of the important features of the present invention, provision is made for maintaining the tinsel leads 112 (FIGS. 3, 34A, 34B and 34C) under tension during all portions of the peak-to-peak 2.5" excursion of the movable components of the voice coil driven woofer 54 during PUSH/PULL operation thereof. Thus, as best shown in FIG. 34A where the speaker cone 100 and voice coil former 102 are shown in their neutral or null positions, the tinsel lead 112 extends outwardly over a resilient piece of compressible/expandable polyethylene foam 225 which is attached to the basket-like frame or cage 90 of the voice coil driven woofer with the outboard end of the tinsel lead being attached to the frame 90 as shown in FIG. 3. When the movable components of the voice coil driven woofer move outwardly during a PUSH stroke from the position shown in FIG. 34A to that shown in FIG. 34B, the resilient polyethylene foam element 225 expands and serves to maintain the tinsel leads 112 under tension, thereby preventing them from flapping against the speaker cone as the latter moves. Similarly, when the movable components of the voice coil driven woofer 54 move inwardly during a PULL stroke from the null position shown in FIG. 34A to the position shown in FIG. 34C, the tinsel lead 112 serves to compress the polyethylene foam element 225 which again maintains the tinsel leads under tension and prevents them from flapping against the speaker cone 100 and causing undesired noise.

Those skilled in the art will appreciate from the foregoing description that the subwoofer 50 of the present invention, although totally contained in a sealed cabinet 51 only 11"×11"×11" defining an internal volume of space of only about 0.4 ft$^3$ to about 0.5 ft$^3$—as contrasted with conventional prior art subwoofers typically requiring cabinets enclosing a volume of space ranging from about 8 ft$^3$ to about 27 ft$^3$—is, nevertheless, characterized by its ability to output as much bass output as the extremely large conventional prior art subwoofers. This is possible for the following principle reasons:

1. The subwoofer 50 of the present invention is characterized by having drivers 52, 54 capable of moving in and out of the very small woofer cabinet 51 through peak-to-peak strokes of 2.5"—i.e., a peak-to-peak stroke that is from five to six times greater than that achievable with conventional prior art subwoofer configurations.

2. The subwoofer 50 of the present invention includes a mass driven woofer 52 and a voice coil driven woofer 54 in which the movable driver components are supported solely by a flexible surround 78, 78' and a flexible spider 89, 108. The surrounds 78, 78' are uniquely characterized by their construction and rigidity, each having a thickness ranging from 0.1" to 0.14", or more, and an edgeroll having a diameter of at least 1.5" as contrasted with conventional prior art surrounds having thicknesses on the order of 0.02" and edgerolls having diameters less than 1". The surrounds 78, 78' of the present invention are capable of withstanding internal box pressures which are an order of magnitude greater than the internal box pressures generated in conventional prior art subwoofers while retaining the movable driver components stable and substantially free of wobble as they move through their peak-to-peak stroke of 2.5".

3. Since the subwoofer 50 of the present invention is contained totally within a very small sealed cabinet defining an internal volume of space ranging from about 0.4 ft$^3$ to about 0.5 ft$^3$—i.e., a cabinet ranging from about 1/15th to about 1/67th the size of a cabinet employed in conventional prior art subwoofers—as the movable components of the mass driven subwoofer 52 and the voice coil driven subwoofer 54 move in and out of the cabinet 51, a very high air pressure is generated within the cabinet 51—viz., from about 1.5 lbs./in$^2$ to about 3 lbs./in$^2$; or, a pressure sufficient to impose a force of 150 lbs. on a typical 8" diameter speaker cone 100 (FIG. 3). Therefore, in order to overcome the high air pressure generated within the cabinet 51, a tracking downconvertor drive amplifier—viz., the (+) and (−) Tracking Downconvertor Power Supplies 170, 180 and Driver Amplifier 190—is required which is capable of: i) delivering on the order of 2,700 watts rms into a nominal 4 ohm resistive load; ii) swinging 104 volts rms; and iii), delivering only about 150 to 200 watts (300 to 400 watts on a time limited basis) maximum power to the voice coil 104, preventing overheating and enabling generation of large quantities of power with high efficiency.

4. The weight of the magnet 94 employed with the present invention is approximately 225 oz. (i.e., approximately 14 lbs, 1 oz.)—that is, the magnet 94 employed with the present invention is approximately 5½ to 11 times larger than the magnets commonly employed in prior art subwoofers where the magnet typically weighs not more than 20 ounces, and, at most, 40 ounces—and, consequently, the back emf generated within the subwoofer of the present invention is extremely high, allowing the driver 54 to be operated far away from the stall mode and, consequently, at an efficiency more than ten times greater than a conventional subwoofer of comparable size could possibly achieve.

It will, it is believed, facilitate an understanding of the present invention if a brief description is set forth at this point as to a typical subwoofer's operation relative to the stall mode and the efficiencies achieved resulting from generating a large back emf—something achievable only with subwoofers 50 embodying features of the present invention.

Virtually all, if not all, conventional prior art subwoofers are operated very close to stall—an operating mode characterized by very little output power and large amounts of current flowing through the coils of the motor—viz., the voice coil and the magnet—thus making the motor run very hot. In the present invention, however, the electric motor of the subwoofer—i.e., the voice coil 104 and magnet 94—is operated far away from the stall mode. This serves to generate a large back emf. That is, most voltage delivered to the voice coil 104 is, in effect, cancelled by the back emf generated within the motor (voice coil 104/magnet 94) by virtue of the driver's 2.5" peak-to-peak excursion.

More particularly, because the voice coil 104 is moving inwardly and outwardly with a relatively long peak-to-peak excursion of 2.5", the voice coil 104 cuts many lines of magnetic flux in the magnetic structure. As those skilled in the art will appreciate, it is the rate of flux change that generates back emf; and, consequently, the large peak-to-peak stroke or excursion of the voice coil 104 within the magnet structure not only moves large amounts of air but, more importantly, it serves to generate a large back emf. In conventional prior art subwoofers, the voice coil typically moves through a peak-to-peak stroke of only about 0.4" to only about 0.6"—viz., the peak-to-peak stroke of the driver of the present invention is from about five to about six times greater than the maximum peak-to-peak strokes achieved with a conventional prior art subwoofer configuration— within a magnetic field generated by a very small magnet (a magnet typically weighing only about 20 oz.); and, consequently, conventional prior art subwoofers are incapable of generating a large back emf. This results in too much current flow in the voice coil winding, causing the subwoofer to overheat; and, therefore, requires large, heavy and expensive heat dissipation systems.

A further requirement for generating a large back emf is the provision of a very high magnetic flux field—again a requirement that cannot be met with conventional prior art subwoofers which typically employ magnets weighing not more than 20 ounces; occasionally employing magnets weighing up to 28 ounces; and, in rare cases employing magnets weighing as much as 40 ounces. The magnet 94 employed with the present invention, however, weighs approximately 225 ounces or, it is an order of magnitude larger than typical magnets employed with conventional prior art subwoofers. Consequently, as the voice coil 104 moves within the very high magnetic flux field produced by the extremely large magnet 94 through a peak-to-peak stroke of 2.5", a large back emf is generated due to the large stroke of the voice coil 104 cutting many lines of force. This is, of course, not possible with conventional subwoofers where: i) the voice coil typically moves with a peak-to-peak stroke on only about 0.4" to about 0.6"; ii) the magnet weighs only about 20 oz.; and iii), therefore, the magnetic flux field is small and relatively few lines of force are cut.

However, the large back emf generated with the use of a long peak-to-peak stroke of the voice coil 104 within a very high magnetic flux field provided by a large magnet weighing approximately 225 ounces, produces a further problem conventional prior art subwoofers are unable to cope with. That problem is related to the fact that when the back emf is very high, as it is with the present invention, the applied emf to the woofer must be even greater than the back emf in order to overcome it.

In the present invention, this problem is solved by employing an extremely powerful amplifier—viz., a tracking downconvertor drive amplifier (170, 180, 190) capable of delivering 2,700 watts rms into a nominal 4 ohm resistive load, and which can swing 104 volts rms. However, despite employment of such an extremely powerful amplifier, the woofer 50 of the present invention does not overheat and/or burn up while the moving driver components are moving in and out through the 2.5" peak-to-peak stroke because the presence of a large back emf prevents the flow of damaging stall mode currents in the voice coil 104 that would normally flow in the subwoofer 50 if it were a simple resistive load. Rather, only a small fraction of that current flows in the voice coil 104; but, since the magnet 94 is so large and because the drive force is equal to the magnetic field times the current—See, equation [8], supra—the force on the voice coil 104 to drive the subwoofer 54 and move the air is immense even though very little current is flowing in the voice coil 104. However, where, as here, the magnet 94 is extremely large (i.e., approximately 225 ounces), the back emf generated reduces the volts available, and this leads to the need for a special tracking downconvertor drive amplifier 170, 180, 190.

In the present invention, where the subwoofer 50 operates far from the stall mode, the tracking downconvertor drive amplifier defined by the (+) and (−) Tracking Downconvertor Power Supplies 170, 180 and the Driver Amplifier 190 operates at approximately 88% efficiency. This means that at an input of 200 watts, 176 watts are delivered to the voice coil 104. Indeed, at full output power, the subwoofer 50 of the present invention requires delivery of only 360 watts (for an acoustic output of 115 dB) to the voice coil 104.

In summary, the subwoofer 50 of the present invention is characterized by: i) being flat to 18 Hz; ii) each driver 52, 54 can move 125 in$^3$ of air; iii) extremely low distortion; iv) a built-in tracking downconvertor drive amplifier (170, 180, 190) capable of delivering 2,700 watts rms into a nominal 4 ohm resistive load and swinging 104 volts rms; and v), generation of a large back emf attributable to the use of an extremely large magnet (225 ounces) and a voice coil 104 moving through a 2.5" peak-to-peak stroke in a very small cabinet 51 (11"×11"×11') defining an enclosed volume of space ranging from only about 0.4 ft$^3$ to only about 0.5 ft$^3$, all of which cooperate to allow the subwoofer 50 to be operated far from the stall mode, whereas typical and conventional prior art subwoofers are deliberately designed to operate close to the stall mode wherein large amounts of current flow through the voice coil, generating a large amount of heat that must be dissipated.

Another important feature characteristic of the present invention is the use of a flexible suspension system for the movable driver components including solely a spider 89, 108 and a surround 78, 78' wherein the surround 78, 78' ranges from 0.1" to 0.14", or more, in thickness, employs an edgeroll 180 on the order of at least 1.5" in diameter, and is capable of standing off the large internal box pressures— viz., about 1.5 lbs./in$^2$ to about 3 lbs./in$^2$—generated within the cabinet while permitting the movable driver components to move axially inward and outward through a peak-to-peak stroke of 2.5" in a stable manner and without significant wobble.

A further important feature characteristic of the present invention is the provision of Input Buffers 125 (FIGS. 12A and 24) which serve to sum the left and right channel audio input signals 120a, 120b at different dB levels, thereby retaining both the L+R and L−R components of the audio signal in a composite audio signal 126. Since the L−R component of the audio signal representing the stereo sound field is retained, the life, luster, depth and impact of the audio sound is substantially enhanced for the listener.

Still another important feature characteristic of the present invention is the provision of a Ground Loop Hum Eliminator 124 (FIGS. 12A and 33) which serves to completely eliminate both undesired "ground loops" and the voltage generated across broken grounds, thereby completely eliminating the problem of "ground loop" induced 60 Hz hum which, until the present invention, has continued to plague designers of conventional prior art subwoofers.

Appendicies

The Inventor is appending hereto Appendicies "A" and "B" more fully identified below. Such Appendicies comprise schematic circuit drawings depicting in greater detail the circuitry employed with the present invention, including component identification and values. It is intended that such appendicies be made a part of the file history relating to this application and, therefore, documents which are available for public inspection by interested parties. It is not intended that these Appendicies be printed as part of any patent issuing from this application.

It will be understood by persons skilled in the art that appendicies "A" and "B" contain materials which are deemed sensitive and highly proprietary by Applicant and his corporation—viz., Sunfire Corporation—and are not to be duplicated, in whole or in part, without the express written consent of Sunfire Corporation.

Appendix "A" comprises a size "D", computer-generated schematic circuit drawing—viz., Drawing No. 653-010-00 dated Jan. 22, 1996, with revisions as of Mar. 26, 1997, entitled "True Subwoofer Amplifier"—here depicting circuit details, including component identifications and values where applicable, of the (+) and (−) Tracking Downconvertor Power Supplies 170, 180, Driver Amplifier 190 and Auto ON/OFF circuit employed with the present invention.

Appendix "B" comprises a size "D", computer-generated schematic circuit drawing—viz., Drawing No. 653-011-00, dated Jan. 22, 1996, with revisions as of Mar. 19, 1997, entitled "Sunfire Subwoofer Preamp & Signal Processor"— here depicting circuit details, including component identifications and values where applicable for: i) an exemplary Signal Processing Circuit including: Input Summing Buffers 125; a Subsonic Filter 130; an E.Q. Amplifier 131; a Zero to −180° Phase Amp 134; a THX® Amp; a Crossover Frequency circuit 135; a Bass Level Control 136; Voltage Regulators; a Line Amplifier 138; an Input Opto-Coupler 139; and, a Low-Pass Filter; ii) an exemplary Master Protection Circuit 140 including: an Overshoot Control 141; a Clipping Eliminator 146; an Excursion Limiter 142; a Clipping Level Circuit 144; a Low Frequency Auto Throttle 143; a Thermal Integrator 149; and, a Thermal Protection (Trip circuit) 150; and iii), an Input Woofer Servo 155.

What is claimed is:

1. A tracking downconvertor drive amplifier for generating (+)Δv and (−)Δv output signals and alternately delivering such output signals to a load, said tracking downconvertor drive amplifier including:
   a) a (+) Tracking Downconvertor Power Supply for generating (+)Δv output signals, said (+) Tracking Downconvertor Power Supply having: i) a first input terminal for receiving a signal to be processed; ii) a first inductor; and iii), a first output terminal;
   b) a (−) Tracking Downconvertor Power Supply for generating (−)Δv output signals, said (−) Tracking Downconvertor Power supply having: i) a second input terminal for receiving a signal to be processed; ii) a second inductor; and iii), a second output terminal;
   c) a Driver Amplifier coupled to said first and second output terminals for receipt of respective ones of said (+)Δv and (−)Δv output signals and delivering said (+)Δv and (−)Δv output signals alternately to said load;
   d) an A.C. input power source; and,
   e) means for hard wire coupling of said A.C. input power source to said first and second inductors;
   wherein said (+) and (−) Tracking Downconvertor Power supplies and said Driver Amplifier are all devoid of transformers and said tracking downconvertor drive amplifier is characterized by its ability to deliver up to about 2,700 watts rms and swing up to about 104 volts rms.

2. A tracking downconvertor drive amplifier as set forth in claim 1 wherein said (+) Tracking Downconvertor Power Supply includes a first switch coupled to said first inductor; said Tracking Downconvertor Power Supply includes a second switch coupled to said second inductor; and, said means for hard wire coupling of said A.C. input power source to said first and second inductor includes a full wave voltage doubler having: i) a first pair of diodes coupled in parallel; ii) a second pair of diodes coupled in parallel; iii) a first capacitor having its negative end coupled to said first pair of diodes and thence to said A.C. input power source;

and iv), a second capacitor having its positive end coupled to said second pair of diodes and thence to said A.C. input power source; and wherein when the A.C. signal input by said A.C. input power source is positive, the A.C. signal flows through said second pair of diodes and charges said second capacitor to a predetermined positive voltage level, and when the A.C. signal input by said A.C. input power source is negative, the A.C. signal flows through said first pair of diodes and charges said first capacitor to a predetermined negative voltage level;

whereby, discharge of said second capacitor delivers said predetermined positive voltage level stored therein to said first switch coupled to said first inductor in said (+) Tracking Downconvertor Power Supply to turn said first switch ON and thus permit current signals input to said (+) Tracking Downconvertor Power supply to be delivered to said first inductor; while discharge of said first capacitor delivers said predetermined negative voltage level stored therein to said second switch coupled to said second inductor in said (−) Tracking Downconvertor Power supply to turn said second switch ON and thus permit current signals input to said (−) Tracking Downconvertor; Power Supply to be delivered to said second inductor.

* * * * *